United States Patent
Kaeriyama

(10) Patent No.: US 9,224,670 B2
(45) Date of Patent: Dec. 29, 2015

(54) SEMICONDUCTOR DEVICE

(71) Applicant: Renesas Electronics Corporation, Kawasaki-shi, Kanagawa (JP)

(72) Inventor: Shunichi Kaeriyama, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 125 days.

(21) Appl. No.: 13/958,595

(22) Filed: Aug. 4, 2013

(65) Prior Publication Data

US 2014/0061643 A1 Mar. 6, 2014

(30) Foreign Application Priority Data

Sep. 5, 2012 (JP) .................. 2012-195087

(51) Int. Cl.
*H01L 23/34* (2006.01)
*H01L 23/00* (2006.01)
*H01L 23/64* (2006.01)
*H01L 25/065* (2006.01)
*H01L 23/62* (2006.01)
*H01L 25/16* (2006.01)

(52) U.S. Cl.
CPC .............. *H01L 23/34* (2013.01); *H01L 23/645* (2013.01); *H01L 24/49* (2013.01); *H01L 25/0657* (2013.01); *H01L 23/62* (2013.01); *H01L 25/16* (2013.01); *H01L 2224/05554* (2013.01); *H01L 2224/48137* (2013.01); *H01L 2224/49113* (2013.01); *H01L 2224/49171* (2013.01); *H01L 2224/49175* (2013.01); *H01L 2924/00014* (2013.01); *H01L 2924/1305* (2013.01); *H01L 2924/13055* (2013.01); *H01L 2924/13091* (2013.01)

(58) Field of Classification Search
CPC ................... H01L 2924/00; H01L 2924/0132; H01L 2924/0105; H01L 2224/48472; H01L 2924/0002; H01L 2924/01013; H01L 2924/01014; H01L 2924/13055; H01L 2224/32245; H01L 2224/48091; H01L 2224/48227
See application file for complete search history.

(56) References Cited

U.S. PATENT DOCUMENTS

| | | |
|---|---|---|
| 7,639,021 B2 | 12/2009 | Li et al. |
| 8,129,999 B2 | 3/2012 | Szuba et al. |
| 2002/0126565 A1* | 9/2002 | Kawai et al. .................. 365/233 |
| 2006/0056205 A1* | 3/2006 | Kyono ............................ 363/15 |
| 2012/0020419 A1* | 1/2012 | Kaeriyama ................... 375/259 |

FOREIGN PATENT DOCUMENTS

JP 05-013543 A 1/1993

OTHER PUBLICATIONS

Kaeriyama, S. et al., "A 2.5kV isolation 35kV/us CMR 250Mbps 0.13mA/Mbps Digital Isolator in 0.5um CMOS with an on-chip small transformer", 2010 IEEE Symposium on VSLI Circuits, 2010, pp. 197-198.

* cited by examiner

*Primary Examiner* — Robert Bachner
(74) *Attorney, Agent, or Firm* — Miles & Stockbridge P.C.

(57) ABSTRACT

A semiconductor device includes an AC coupling element, and a temperature monitoring unit that outputs a temperature monitor signal, the temperature monitoring unit has a first temperature monitoring element that outputs the temperature monitor signal, and the first temperature monitoring element is arranged in a region immediately below or a region adjacent to the AC coupling element.

15 Claims, 30 Drawing Sheets

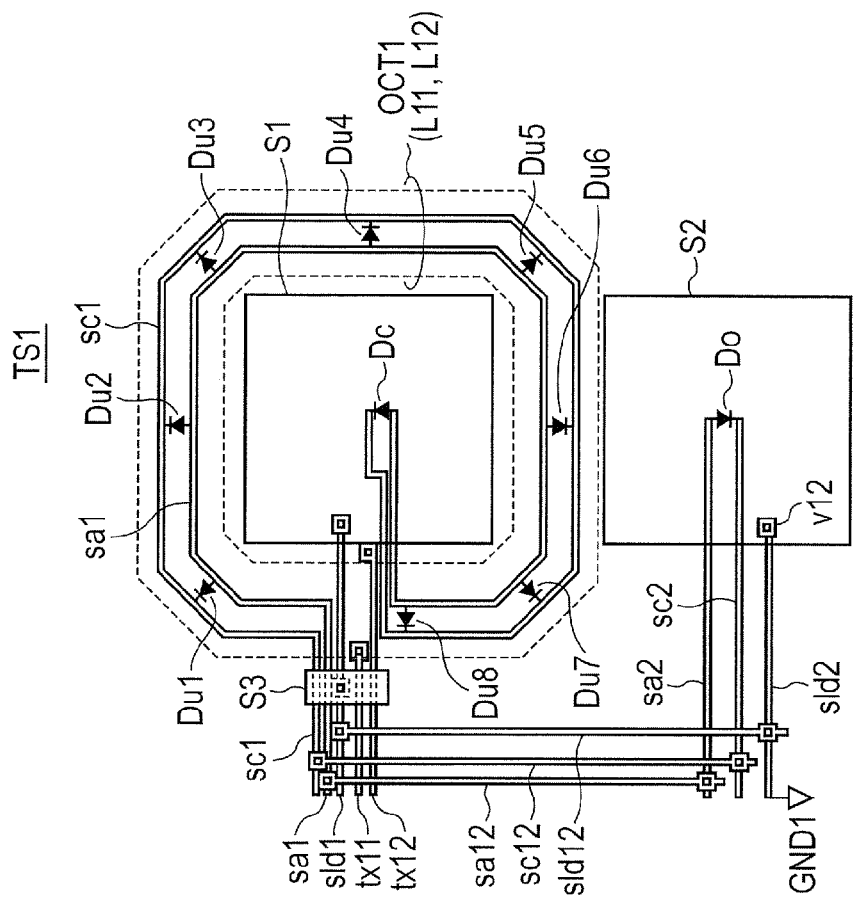
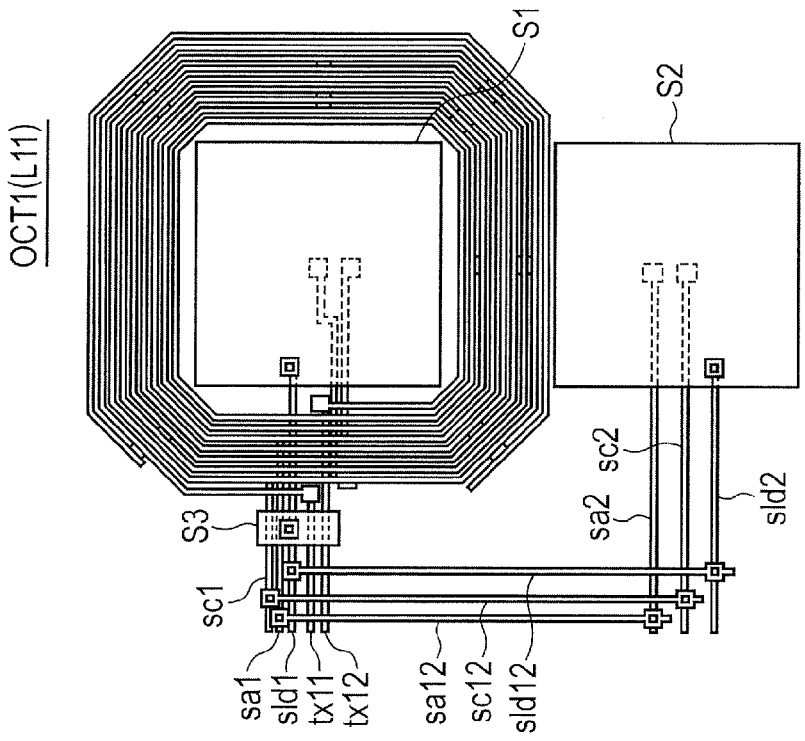

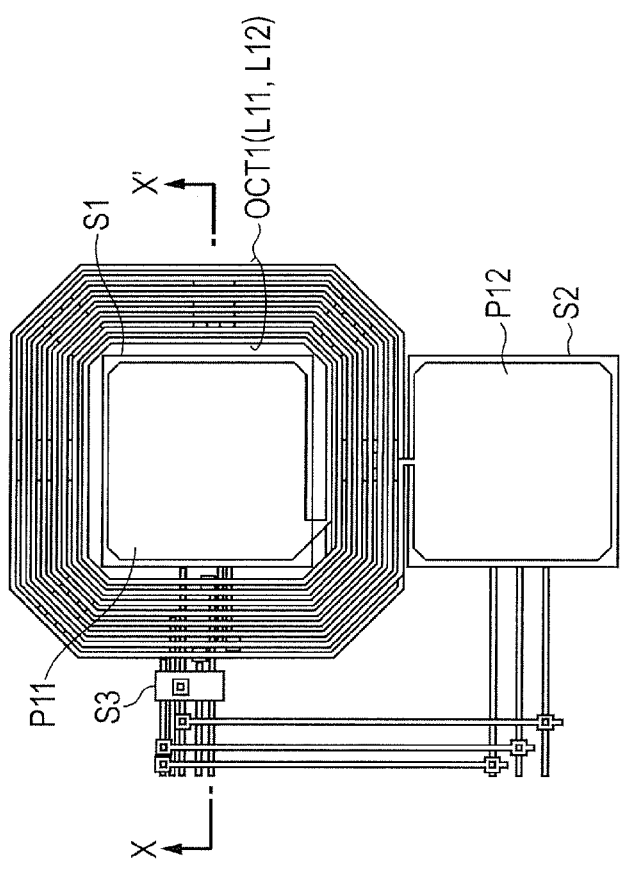
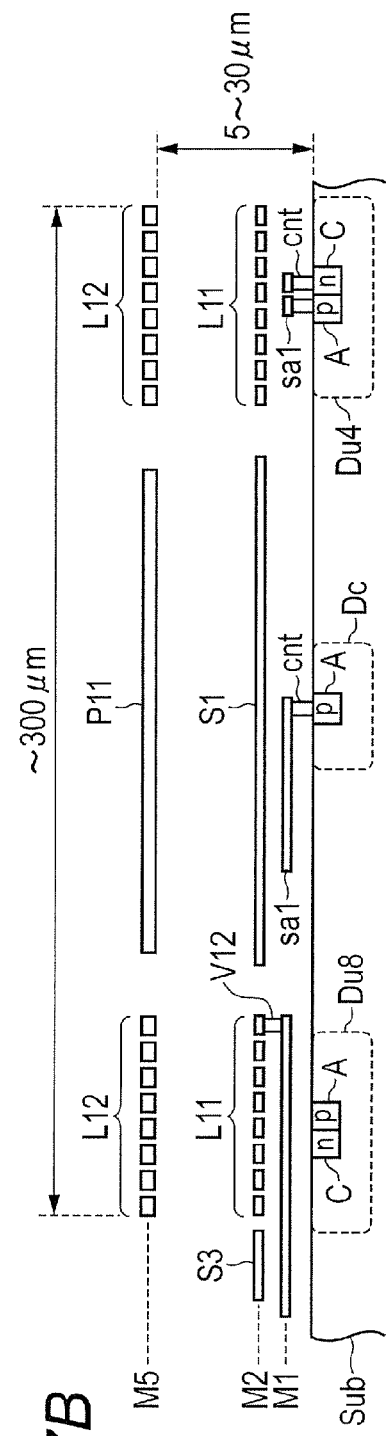
FIG. 7A
FIG. 7B

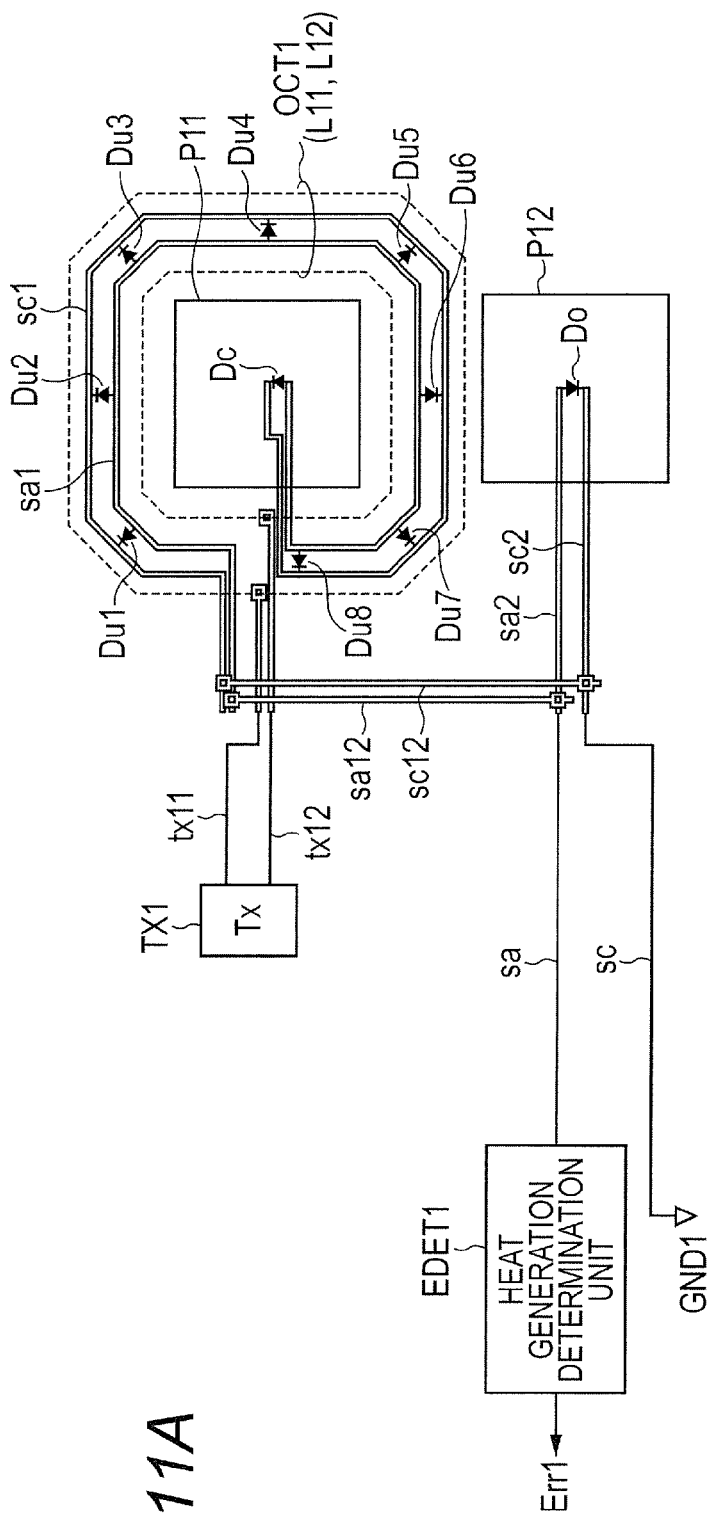
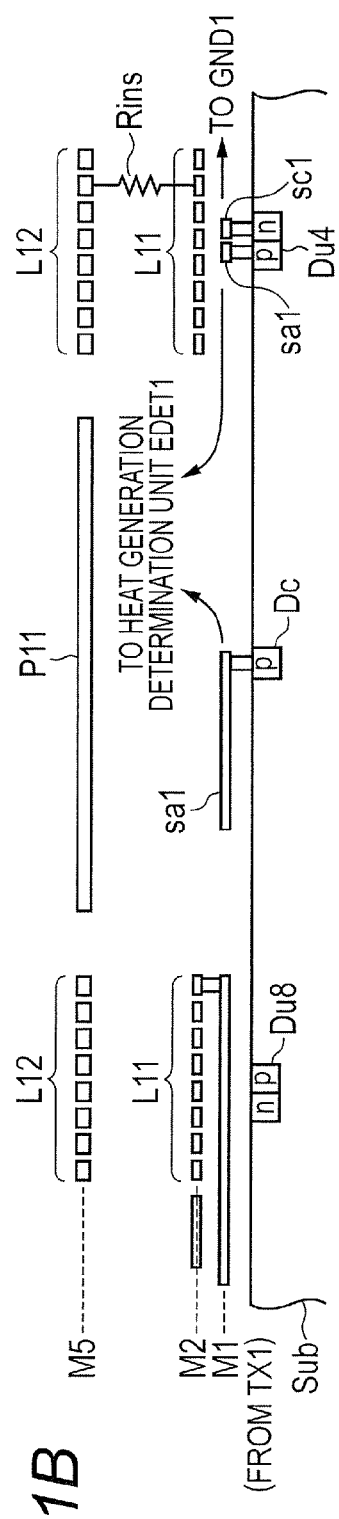
FIG. 11A
FIG. 11B

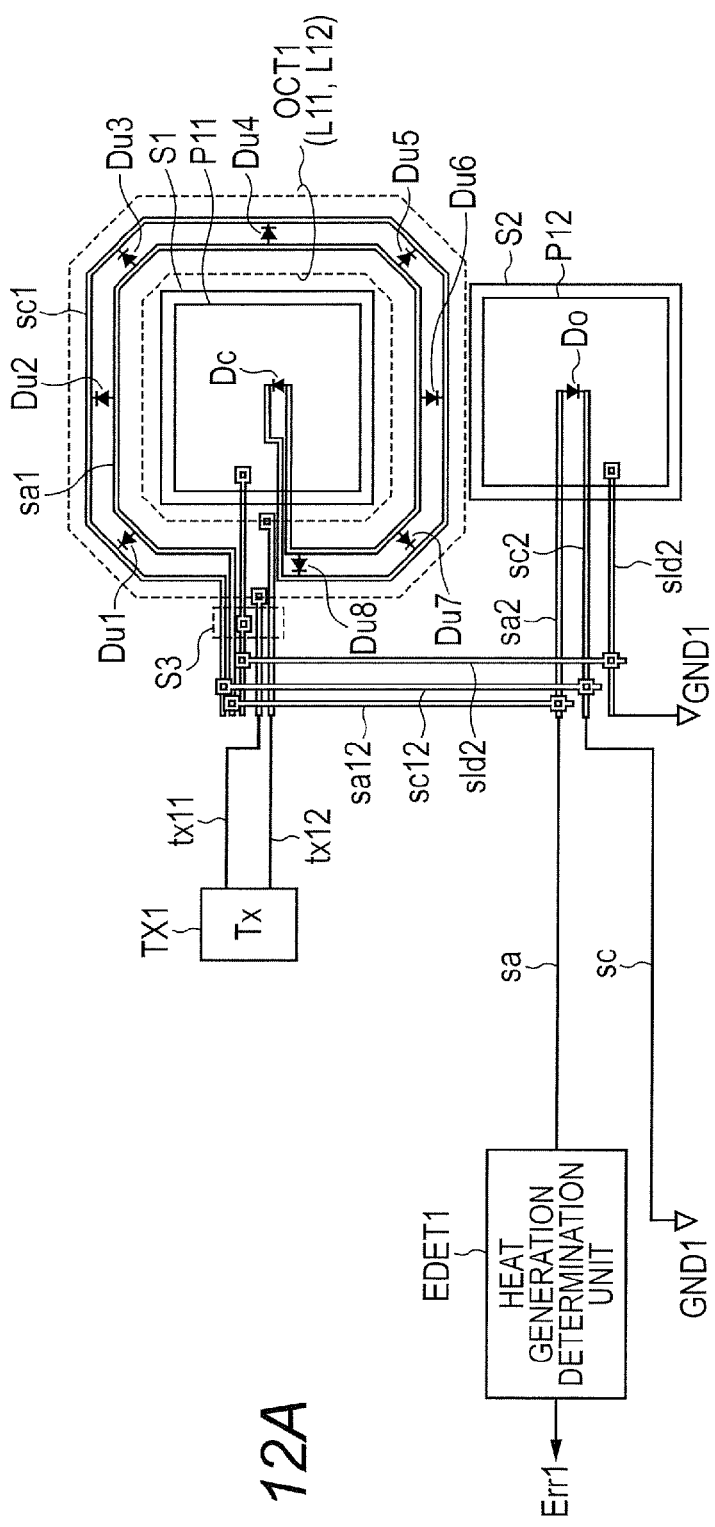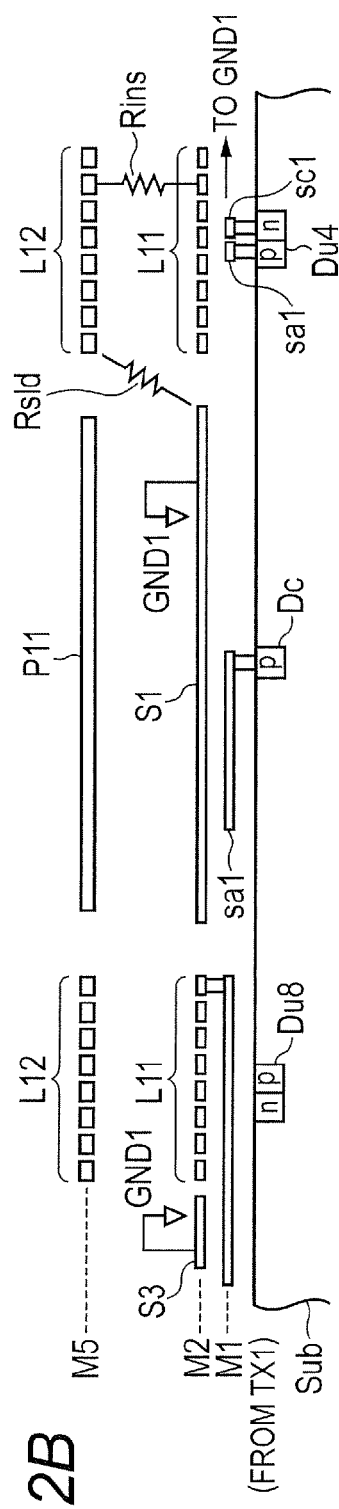
FIG. 12A
FIG. 12B

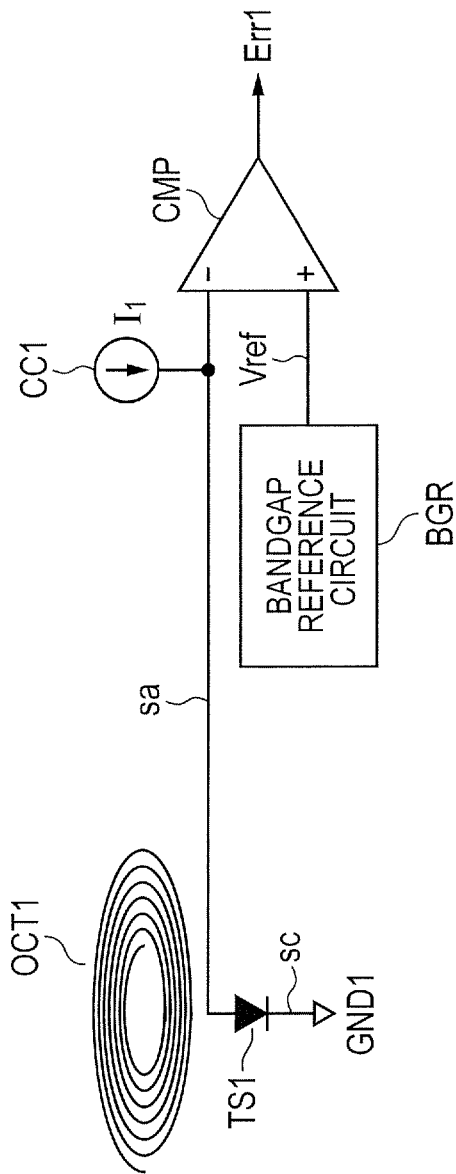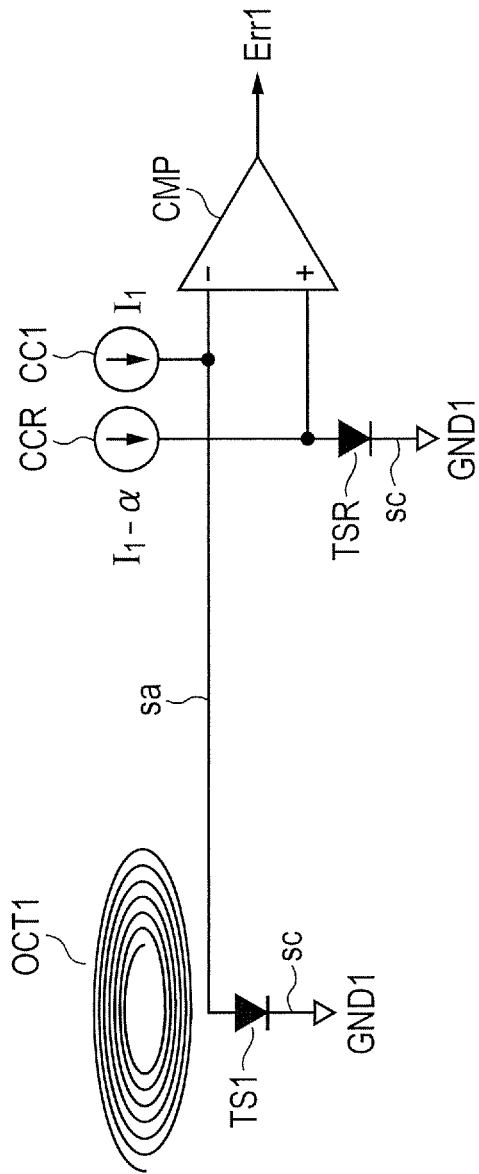
FIG. 16A
FIG. 16B

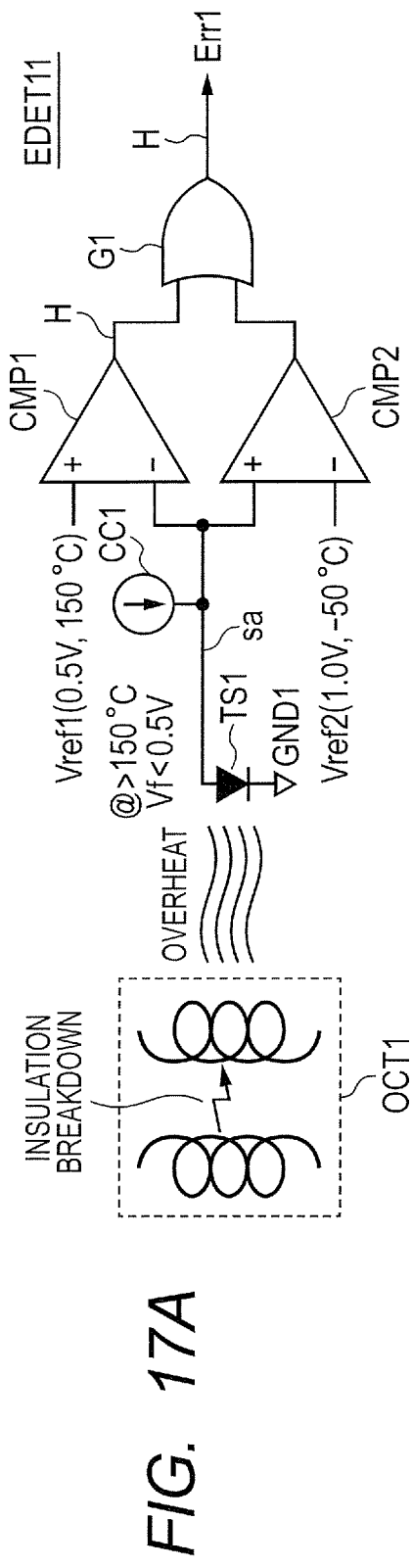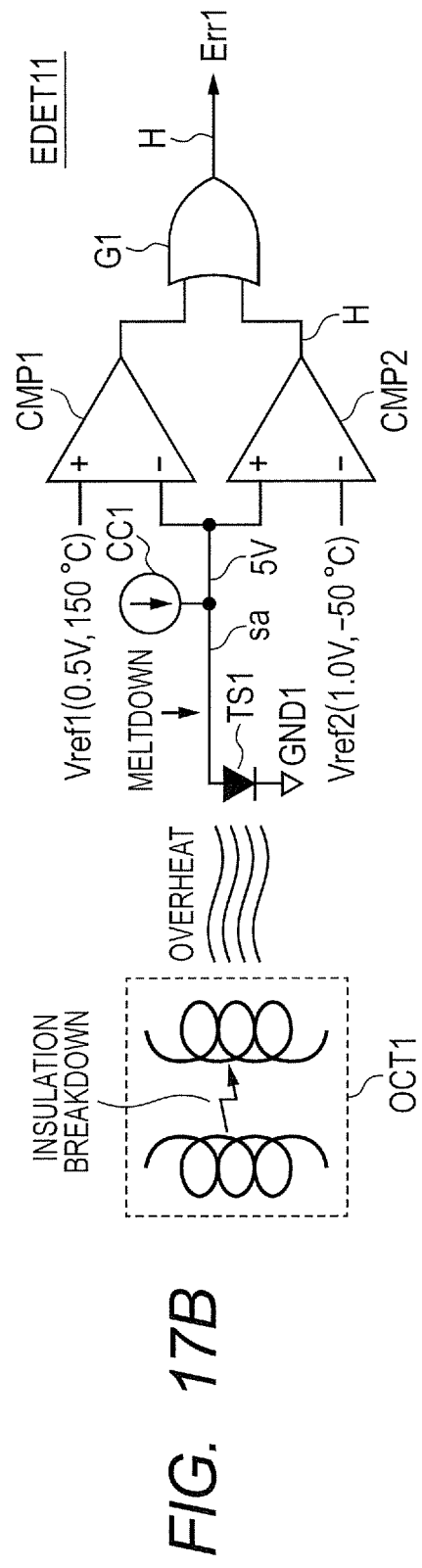
FIG. 17A
FIG. 17B

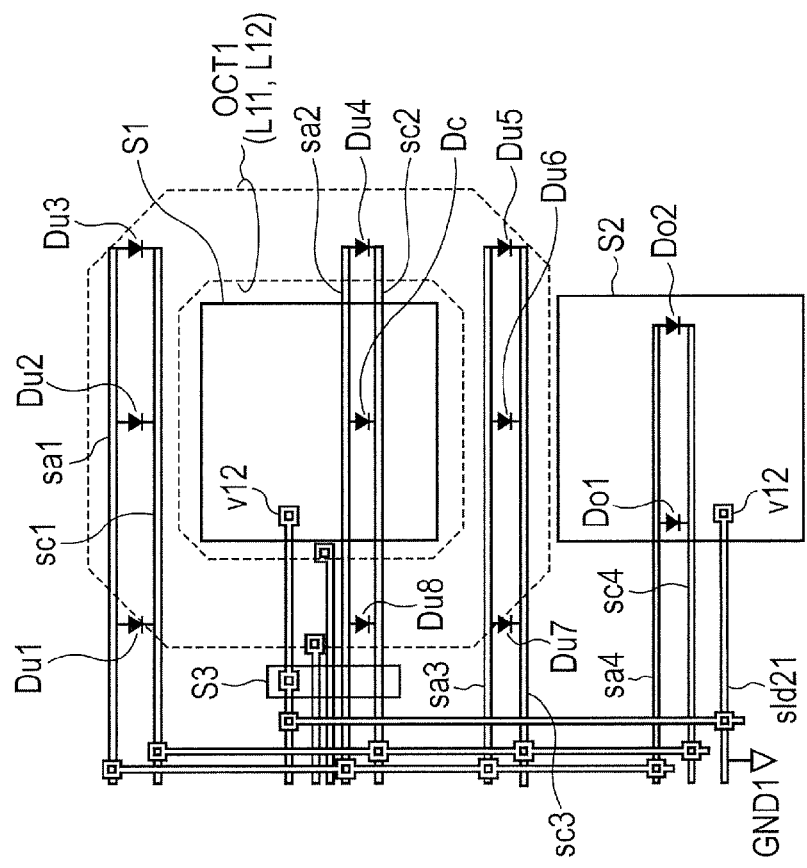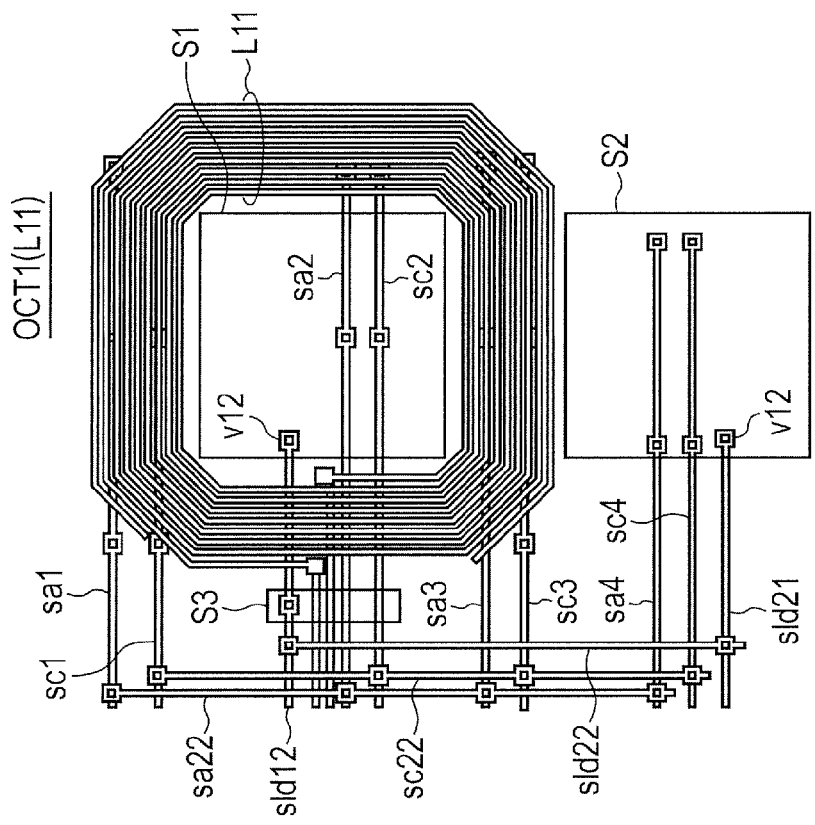

SEMICONDUCTOR DEVICE

CROSS-REFERENCE TO RELATED APPLICATIONS

The disclosure of Japanese Patent Application No. 2012-195087 filed on Sep. 5, 2012 including the specification, drawings and abstract is incorporated herein by reference in its entirety.

BACKGROUND

The present invention relates to a semiconductor device, and more particularly to a semiconductor device having, for example, an AC coupling element.

In order to transmit a signal between semiconductor devices (hereinafter also called "chips") to which supply voltages different from each other are applied, an AC coupling element formed in the semiconductor device may be used. As the AC coupling element, there have been known an on-chip transformer including a pair of inductors which is magnetically coupled with each other, and a coupling capacitance including a pair of capacitive electrodes which is capacitively coupled with each other. In the present specification, one of the pair of inductors configuring the AC coupling element may be called "first element", and the other inductor may be called "second element". Similarly, the pair of capacitive elements may be called "first element" and "second element".

The first element and the second element configuring the AC coupling element are structured to face each other through an insulating film. When a high voltage is applied between a primary side and a secondary side of the AC coupling element, the high voltage is applied between the first element and the second element. As a result, there is a concern about the deterioration of the insulating film caused by the high voltage, and also insulation breakdown.

Japanese Unexamined Patent Application Publication No. Hei5 (1993)-13543 discloses a configuration in which when a large current flows in a power supply line due to a pin hole or latch-up of the insulating film, a temperature detection unit detects a rise in the chip temperature, and a supply voltage supply unit breaks a current on the basis of a detection signal thereof. U.S. Pat. No. 7,639,021 discloses a configuration in which a voltage of a high voltage battery is measured at given intervals to detect the breakdown of an insulating film. U.S. Pat. No. 8,129,999 discloses a configuration in which the insulation breakdown of a stacked cell is detected on the basis of a current that flows in a shunt resistor connected between a high voltage terminal and a ground terminal of the stacked cell. Shunichi Kaeriyama, Shinichi Uchida, Masayuki Furumiya, Mitsuji Okada, Masayuki Mizuno, "A 2.5 kV isolation 35 kV/μs CMR 250 Mbps 0.13 mA/Mbps Digital Isolator in 0.5 μm CMOS with an on-chip small transformer", 2010 IEEE Symposium on VLSI Circuits, pp. 197-198, 2010 discloses a configuration of a transmitter circuit and a receiver circuit of an on-chip transformer.

SUMMARY

When a surge voltage such as an unintentional static electricity is applied between the primary side and the secondary side of the AC coupling element, the insulating film that isolates those primary and secondary sides from each other may be deteriorated. The application of a high voltage (signal transmission by the AC coupling element) to the insulating film for a long time breaks the insulating film, thereby leading to a concern about short-circuiting between the primary side and the secondary side of the AC coupling element, and a function loss of the semiconductor device having the AC coupling element. This makes it necessary to detect the insulation breakdown of the AC coupling element provided in the semiconductor device in an initial stage, and to further safely shut down a system having the semiconductor device. The other objects and novel features will become apparent from the description of the present specification, and the attached drawings.

According to an aspect of the present invention, there is provided a semiconductor device including: an AC coupling element formed on a semiconductor substrate; a temperature monitoring unit that outputs a temperature monitor signal in response to a change in a temperature of the semiconductor substrate, in which the temperature monitoring unit has a first temperature monitoring element that outputs a temperature monitor signal, and the first temperature monitoring element is arranged in a region immediately below or a region adjacent to the AC coupling element.

According to the aspect of the present invention, there can be provided the semiconductor device that detects the insulation breakdown of the AC coupling element in the initial stage, and further shuts down the system in safely.

BRIEF DESCRIPTION OF THE DRAWINGS

FIGS. 6A and 6B are plan views illustrating a layout relationship between the temperature monitoring unit and the on-chip transformer installed in the first semiconductor device according to the first embodiment;

FIGS. 7A and 7B are cross-sectional views of the temperature monitoring unit and the on-chip transformer installed in the first semiconductor device along an X-X' direction thereof according to the first embodiment;

FIGS. 11A and 11B are a plan view and a cross-sectional view illustrating a mechanism of abnormality detection by the temperature monitoring unit (without a shield layer) and a heat generation determination unit installed in the first semiconductor device according to the first embodiment;

FIGS. 12A and 12B are a plan view and a cross-sectional view illustrating the mechanism of the abnormality detection by the temperature monitoring unit (with the shield layer) and the heat generation determination unit installed in the first semiconductor device according to the first embodiment;

FIG. 16A and FIG. 16B are circuit diagrams of one example of a reference voltage generator circuit provided in the heat generation determination unit which is installed in the first semiconductor device according to the first embodiment;

FIGS. 17A and 17B are circuit diagrams of another example of the reference voltage generator circuit provided in the heat generation determination unit which is installed in the first semiconductor device according to the first embodiment;

FIGS. 21A and 21B are layout plan views illustrating a layout relationship between the modification of the temperature monitoring unit installed in the first semiconductor device and the on-chip transformer according to the first embodiment;

DETAILED DESCRIPTION

Figure 1:
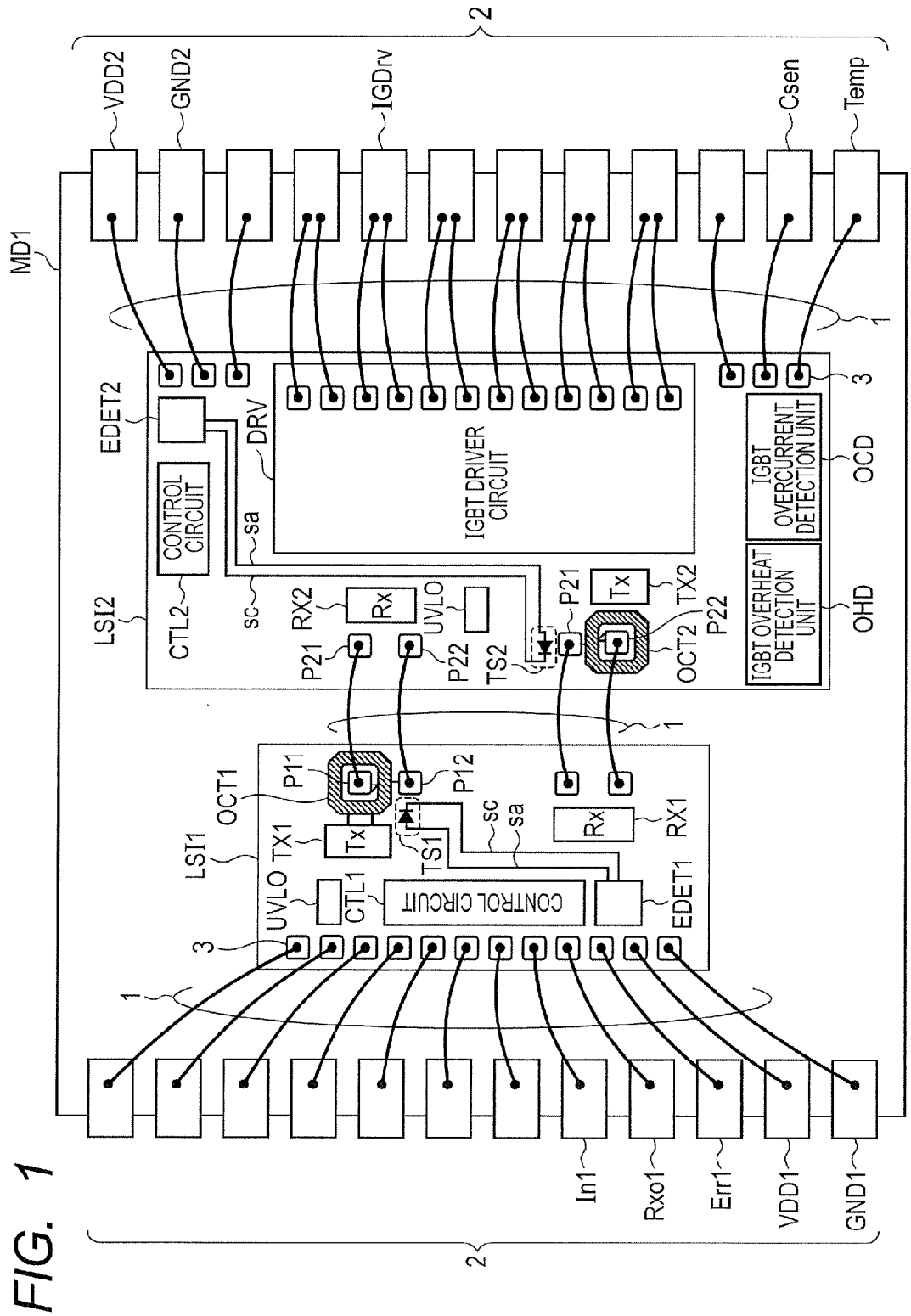
FIG. 1 is a configuration diagram of a signal transmission module having first and second semiconductor devices according to a first embodiment.

Hereinafter, embodiments will be described with reference to the accompanying drawings. In the case where reference is made to the number and quantity in the description of the embodiments, the invention is not always limited to specified number and quantity unless explicitly stated otherwise. In the drawings of the embodiments, identical reference symbols or reference numerals represent the same or corresponding parts. Also, in the description of the embodiments, the redundant description of parts indicated by the identical reference symbols is not repeated.

First Embodiment

A configuration of a signal transmission module MD1 having a semiconductor device LSI1 and a semiconductor device LSI2 according to a first embodiment will be described with reference to FIG. 1.

The signal transmission module MD1 is configured by an SiP (system in package) in which the respective chips of the semiconductor device LSI1 and the semiconductor device LSI2 are packed in one package. The signal transmission module MD1 has multiple leads 2. The leads 2 are electrically connected to respective pads 3 formed on the semiconductor device LSI1 and the semiconductor device LSI2 through respective bonding wires 1.

The electric connection means between the pads 3 of the semiconductor device LSI1 and the semiconductor device LSI2, and the leads 2 is not limited to the bonding wires 1, but can be appropriately changed. Referring to FIG. 1, the same rectangular patterns not denoted by reference numeral 3 also represent the pads 3, particularly, except for those denoted by other symbols (P11, P12, and so on).

The semiconductor device LSI1 includes an on-chip transformer OCT1 which is an AC coupling element, a transmitter circuit TX1, a receiver circuit RX1, a control circuit CTL1, a heat generation determination unit EDET1, a low voltage protection circuit UVLO, and a temperature monitoring unit TS1. The on-chip transformer OCT1 includes a primary coil (not shown) which is any one of a first element and a second element, and a secondary coil (not shown) which is the other of the first element and the second element. Those circuits are applied with a supply voltage GND1 (for example, 0 V) applied to the leads 2, and a supply voltage VDD1 (for example, 5 V).

A signal In1 supplied to the lead 2 is input to a control circuit CTL1 through the bonding wire 1 and the pad 3. As will be described later, the control circuit CTL1 outputs a signal generated on the basis of the signal In1, and outputs of the low voltage protection circuit UVLO and the heat generation determination unit EDET1 to the transmitter circuit TX1. The transmitter circuit TX1 current-drives the primary coil of the on-chip transformer OCT1 on the basis of the signal In1. One end of the secondary coil magnetically coupled with the primary coil is connected to the pad P11, and the other end of the secondary coil is connected to the pad P12. An electromotive force is generated between both of those pads by electromagnetic induction.

The temperature monitoring unit TS1 is formed on the semiconductor substrate in the vicinity of the on-chip transformer OCT1. As will be described later, the temperature monitoring unit TS1 is formed of a diode, and an anode and a cathode of the diode are connected to a line sa and a line sc, respectively, and the line sa and the line sc are connected to the heat generation determination unit EDET1. When an insulating film between the primary coil and the secondary coil of the on-chip transformer OCT1 is broken down by a high voltage, abnormal heat generation is caused by short-circuiting between both of those coils. The temperature monitoring unit TS1 converts a change in the temperature of the semiconductor substrate caused by the abnormal heat generation into a change in a forward voltage of the diode, and outputs the voltage to the heat generation determination unit EDET1 through the line sa. Hereinafter, the voltage across the line sa is called "temperature monitor signal sa".

The semiconductor device LSI2 includes an on-chip transformer OCT2 which is an AC coupling element, a transmitter circuit TX2, a receiver circuit RX2, an IGBT (integrated gate bipolar transistor) driver circuit DRV, an IGBT overcurrent detection unit OCD, an IGBT overheat detection unit OHD, the low voltage protection circuit UVLO, a heat generation determination unit EDET2, and a control circuit CTL2. Those circuits are applied with the supply voltage GND2 (for example, 0 to 500 V) to be applied to the leads 2, and the supply voltage VDD2 (for example, GND2+5 V).

The transmitter circuit TX2 controls a current flowing in the primary coil (not shown) of the on-chip transformer OCT2. One end of the secondary coil (not shown) magnetically coupled with the primary coil of the on-chip transformer OCT2 is connected to a pad P21, and the other end of the secondary coil is connected to a pad P22. The receiver circuit RX2 is applied with voltages of the pad P11 and the pad P12 of the semiconductor device LSI1. The IGBT driver circuit DRV outputs a drive signal IGDrv to a gate of an IGBT (not shown) on the basis of an output of the receiver circuit RX2.

A temperature monitoring unit TS2 which is a diode is formed on the semiconductor substrate in the vicinity of the on-chip transformer OCT2. An anode and a cathode of the diode are connected to the line sa and the line sc, respectively. The line sa and the line sc are connected to the heat generation determination unit EDET2. Like the temperature monitoring unit TS1, the temperature monitoring unit TS2 detects an abnormal heat generation caused by the abnormal heat generation caused by the insulating film breakdown in the on-chip transformer OCT2, and outputs the temperature monitor signal sa to the heat generation determination unit EDET2.

The IGBT overcurrent detection unit OCD detects whether an overcurrent is generated in the IGBT, or not, on the basis of a signal Csen generated in a current monitoring circuit of the IGBT not shown. The IGBT overheat detection unit OHD detects whether abnormal overheat is generated in the IGBT or not on the basis of a signal Temp generated by temperature measurement means of the IGBT not shown. As will be described later, the control circuit CTL2 outputs a signal to the transmitter circuit TX2 and the IGBT driver circuit DRV on the basis of outputs of the IGBT overcurrent detection unit OCD, the IGBT overheat detection unit OHD, and the low voltage protection circuit UVLO.

A circuit configuration of the semiconductor device LSI1 according to the first embodiment will be described with reference to FIG. 2.

The transmitter circuit TX1 generates a drive current in a primary coil L11 of the on-chip transformer OCT1 on the basis of an output signal of the control circuit CTL1. One end of a secondary coil L12 magnetically coupled with the primary coil L11 is connected to the pad P11, and the other end of the secondary coil L12 is connected to the pad P12. The receiver circuit RX1 outputs a signal Rxo1 on the basis of a signal In11 and a signal In12 which are output from the secondary coil of the on-chip transformer OCT2 in the semiconductor device LSI2.

The temperature monitoring unit TS1 is arranged immediately below or in the vicinity of the on-chip transformer OCT1. One end of the temperature monitoring unit TS1 is connected to the heat generation determination unit EDET1 through the line sa, and the other end of the temperature monitoring unit TS1 is applied with the supply voltage GND1 through the line sc. The supply voltage VDD1 and the supply voltage GND1 of the semiconductor device LSI1 are applied with the supply voltage VDD1 and the supply voltage GND1, respectively.

The heat generation determination unit EDET1 outputs a heat generation detection signal Err1 indicative of the abnormal heat generation in an on-chip transformer OCT1 formation region on the basis of the temperature monitor signal sa. When the abnormal heat generation is detected, the heat generation determination unit EDET1 changes the heat generation detection signal Err1 from a low level (supply voltage GND1) to a high level (supply voltage VDD1). When the supply voltage VDD1 drops to a given value or lower, the low voltage protection circuit UVLO changes the output signal from the low level to the high level.

The control circuit CTL1 is configured by a gate circuit 101, and outputs a logical operation (AND) result of the signal In1, a signal Rxo1, an output signal of the low voltage protection circuit UVLO, and the heat generation detection signal Err1 to the transmitter circuit TX1. As will be described later, the signal Rxo1 is a signal indicative of the occurrence of abnormal operation of the IGBT driven by the semiconductor device LSI2. Therefore, when the signal transmission module MD1 operates normally, all of the signal Rxo1, the output signal of the low voltage protection circuit UVLO, and the heat generation detection signal Err1 become low level, and the control circuit CTL1 generates the signal to be output to the transmitter circuit TX1 on the basis of the signal In1.

On the other hand, when the abnormal overheat is generated in the on-chip transformer OCT1 due to the insulating film breakdown between the primary coil L11 and the secondary coil L12 of the on-chip transformer OCT1, and also short-circuiting between those coils, the heat generation determination unit EDET1 sets the heat generation detection signal Err1 to the high level. The control circuit CTL1 controls the operation of the transmitter circuit TX1 on the basis of a change in the heat generation detection signal Err1.

Figure 3:
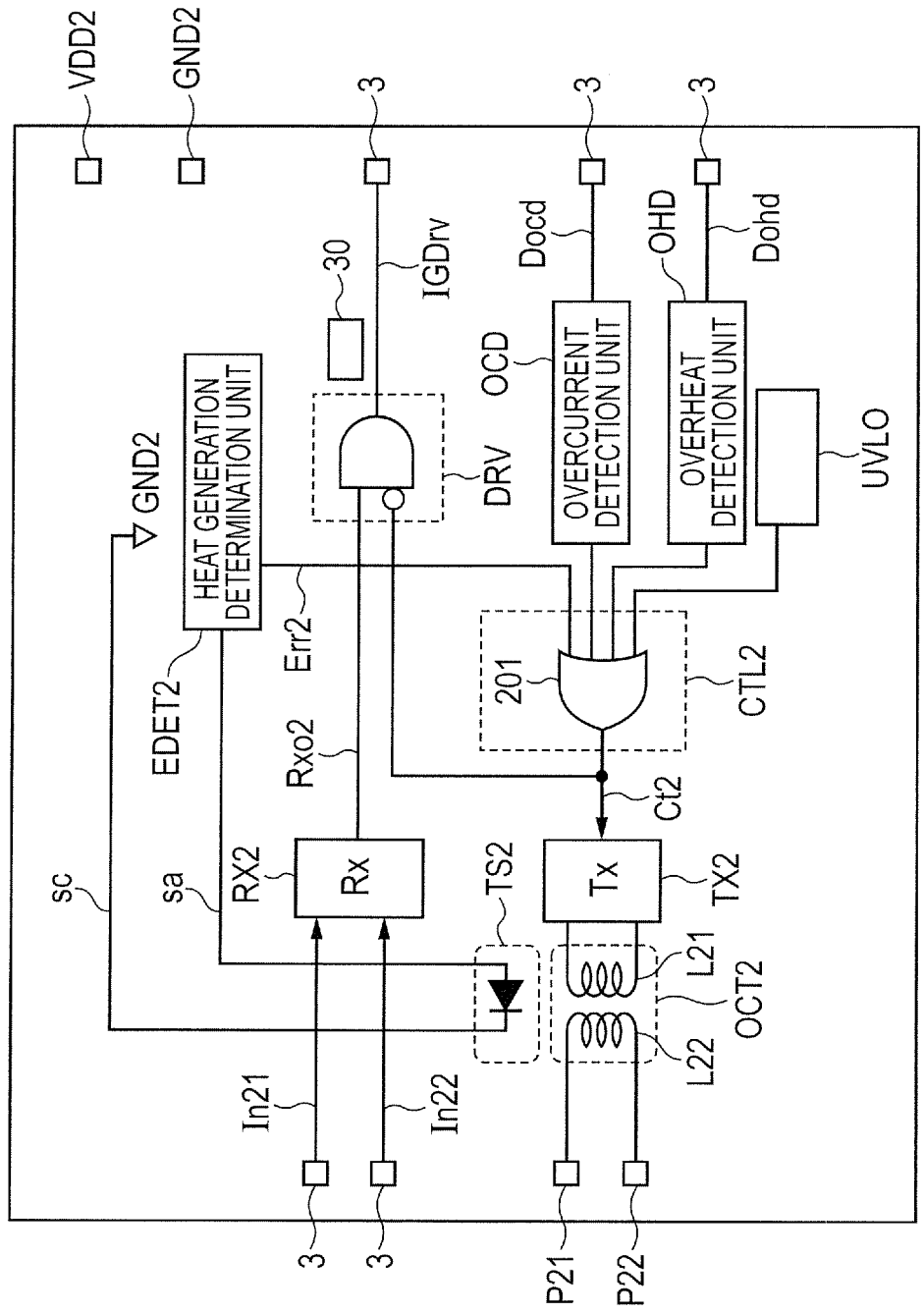
FIG. 3 is a circuit configuration diagram of the second semiconductor device according to the first embodiment.

A circuit configuration of the semiconductor device LSI2 according to the first embodiment will be described with reference to FIG. 3.

The transmitter circuit TX2 generates a drive current in a primary coil L21 of the on-chip transformer OCT2 on the basis of an output signal Ct2 of the control circuit CTL2. One end of a secondary coil L22 magnetically coupled with the primary coil L21 is connected to the pad P21, and the other end of the secondary coil L22 is connected to the pad P22. The receiver circuit RX2 outputs a signal Rxo2 on the basis of a signal In21 and a signal In22 which are output from the secondary coil of the on-chip transformer OCT1 in the semiconductor device LSI1. The IGBT driver circuit DRV outputs the drive signal IGDry to the gate of the IGBT not shown, on the basis of the signal Rxo2. The temperature monitoring unit TS2 is arranged immediately below or in the vicinity of the on-chip transformer OCT2. One end of the temperature monitoring unit TS2 is connected to the heat generation determination unit EDET2 through the line sa, and the other end of the temperature monitoring unit TS2 is applied with the supply voltage GND2 through the line sc.

A temperature detection unit 30 is arranged in the vicinity of the IGBT driver circuit DRV. The temperature detection unit 30 detects a temperature in the vicinity of an output stage of the IGBT driver circuit DRV. When the drive current of the IGBT driver circuit DRV excessively increases, and a temperature of the semiconductor substrate exceeds a given value, the control circuit CTL2 shuts down the semiconductor device LSI2. With this shut-down, the thermal destruction of the semiconductor device LSI2 is avoided in advance.

The heat generation determination unit EDET2 outputs a heat generation detection signal Err2 indicative of the abnormal heat generation in an on-chip transformer OCT2 formation region, on the basis of the temperature monitor signal sa. When the heat generation determination unit EDET2 detects the abnormal heat generation, the heat generation determination unit EDET2 changes the heat generation detection signal Err2 from the low level (supply voltage GND2) to the high level (supply voltage VDD2). The IGBT overcurrent detection unit OCD detects an overcurrent generation in the IGBT on the basis of an output signal Docd from an emitter current monitoring circuit (not shown) of the IGBT, and changes an output signal thereof from the low level to the high level. The overheat detection unit OHD detects an abnormal temperature rise in the IGBT on the basis of an output signal Dohd from a temperature monitoring circuit (not shown) of the IGBT, and changes an output signal thereof from the low level to the high level. When the supply voltage VDD2 drops to a given value or lower, the low voltage protection circuit UVLO changes the output signal from the low level to the high level.

The control circuit CTL2 is configured by a gate circuit 201, and outputs a signal Ct2 which is a logical operation (AND) result of the heat generation detection signal Err2, an output of the overcurrent detection unit OCD, an output of the overheat detection unit OHD, and an output of the low voltage protection circuit UVLO to the transmitter circuit TX2 and the IGBT driver circuit DRV. In the IGBT driven by the signal transmission module MD1 having the semiconductor device LSI2, when overcurrent or the abnormal overheat is detected for some cause, the control circuit CTL2 controls the IGBT driver circuit DRV according to the signal Ct2, and also notifies the semiconductor device LSI1 of the abnormality generation through the transmitter circuit TX2 and the on-chip transformer OCT2.

A configuration of the temperature monitoring unit TS1 installed in the semiconductor device LSI1 according to the first embodiment will be described with reference to FIGS. 4A and 4B.

Figure 4A:
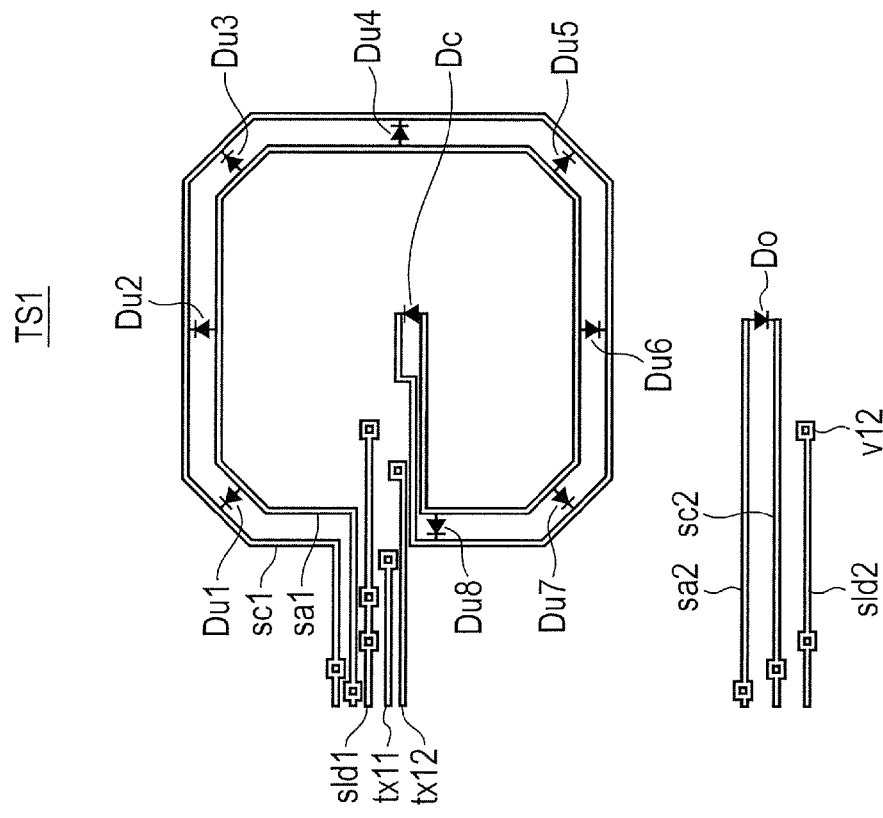
FIGS. 4A and 4B are configuration diagrams of a temperature monitoring unit installed in the first semiconductor device according to the first embodiment.

FIG. 4A is a layout plan view of the temperature monitoring unit TS1. The temperature monitoring unit TS1 is configured by multiple pn junction diodes (temperature detection elements) formed on the semiconductor substrate, and each of the pn junction diodes has an anode (p-type impurity region) A and a cathode (n-type impurity region) C. FIG. 4A illustrates a structure of a horizontal pn junction diode, which may be replaced with a vertical pn junction diode in which the n-type impurity region (cathode) formed on the semiconductor substrate is replaced with the p-type impurity region (anode).

As will be described later, pn junction diodes Du1 to Du8 are formed immediately below the on-chip transformer OCT1, a pn junction diode Dc is formed in the center thereof, and a pn junction diode Dc is formed in an outer periphery thereof. The pn junction diodes Du1 to Du8, the respective anodes A of the Dc are connected to a line sa1, and the respective cathodes C is connected to a line sc1. An anode A and a cathode C of the pn junction diode Dc are connected to line sa2 and line sc2, respectively. The line sa1, the line sc1, the line sa2, the line sc2, a line tx11, a line tx12, a line sld1, and a line sld2 are formed of, for example, a first wiring layer.

Figure 4B:
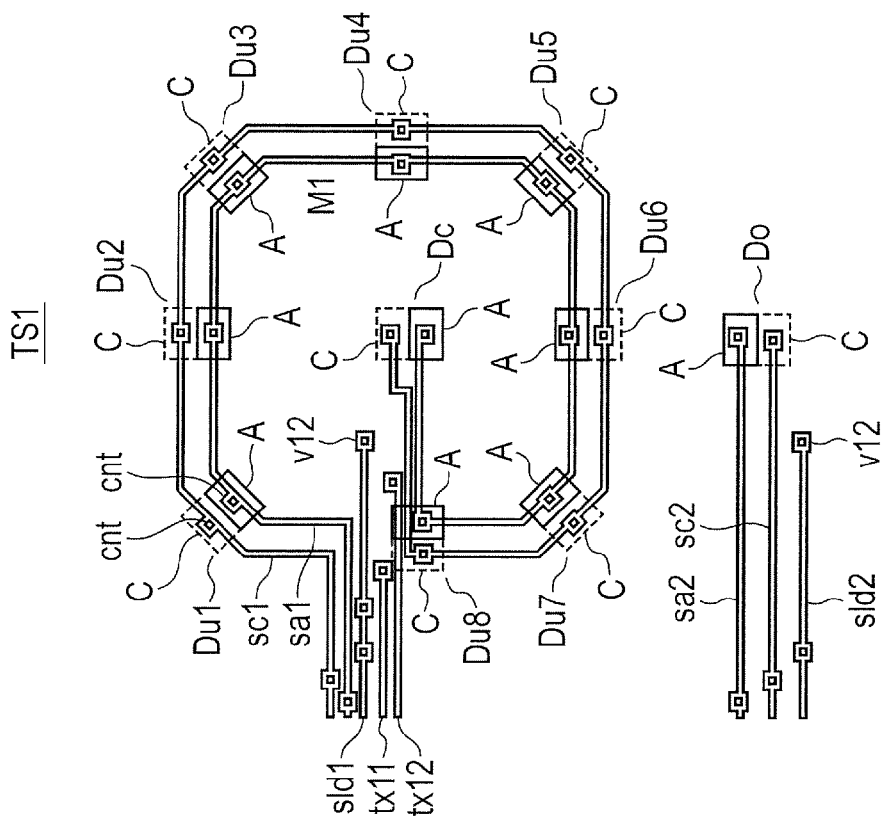

FIG. 4B is an equivalent circuit diagram of the temperature monitoring unit TS1 illustrated in FIG. 4A. The pn junction diodes Du1 to Du8, and the pn junction diode Dc are connected in parallel between the line sa1 and the line sc1 in a first system, and the pn junction diode Dc is connected to the line sa2 and the line sc2 in a second system.

A configuration of the on-chip transformer OCT1 installed in the semiconductor device LSI1 according to the first embodiment will be described with reference to FIGS. 5A and 5B.

The on-chip transformer OCT1 has a configuration in which the respective coils are formed of a lower wiring layer and an upper wiring layer on the semiconductor substrate, and the respective coils are isolated from each other by an interlayer insulating film. FIG. 5A illustrates a lower wiring layer pattern which forms the primary coil L11 of the on-chip transformer OCT1, and the lower wiring layer pattern is formed of, for example, a second wiring layer. Both ends of the primary coil L11 are connected to the transmitter circuit TX1 through the line tx11 and the line tx12 (not shown). A shield layer S1 is formed in the center of the primary coil L11. A shield layer S2 and a shield layer S3 are formed in an outer periphery of the primary coil L11.

Aside from the on-chip transformer OCT1, a line sa12, a line sc12, and a line sld12 are formed of the second wiring layer. Respective via holes v12 for connection to the first wiring layer are formed in the interlayer insulating film on both ends of the respective lines surrounded by dashed rectangles. The shield layer S2 is connected to the line sld2 (refer to FIG. 4B) through the via holes v12. The shield layer S1 and the shield layer S3 are connected to the line sld1 through respective via holes v12.

Figure 5B:
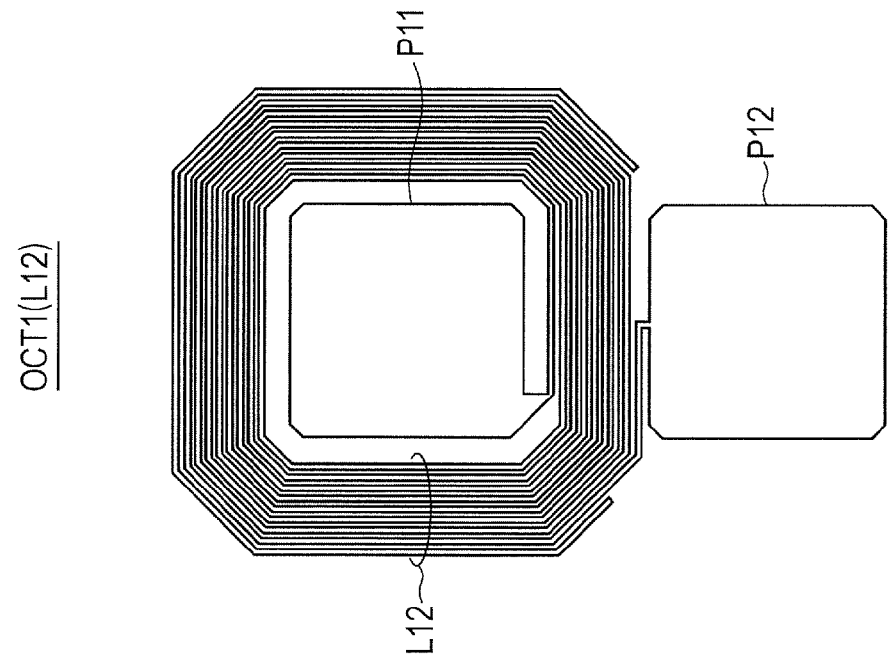
FIGS. 5A and 5B are plan views of an on-chip transformer installed in the first semiconductor device according to the first embodiment.
Figure 5A:
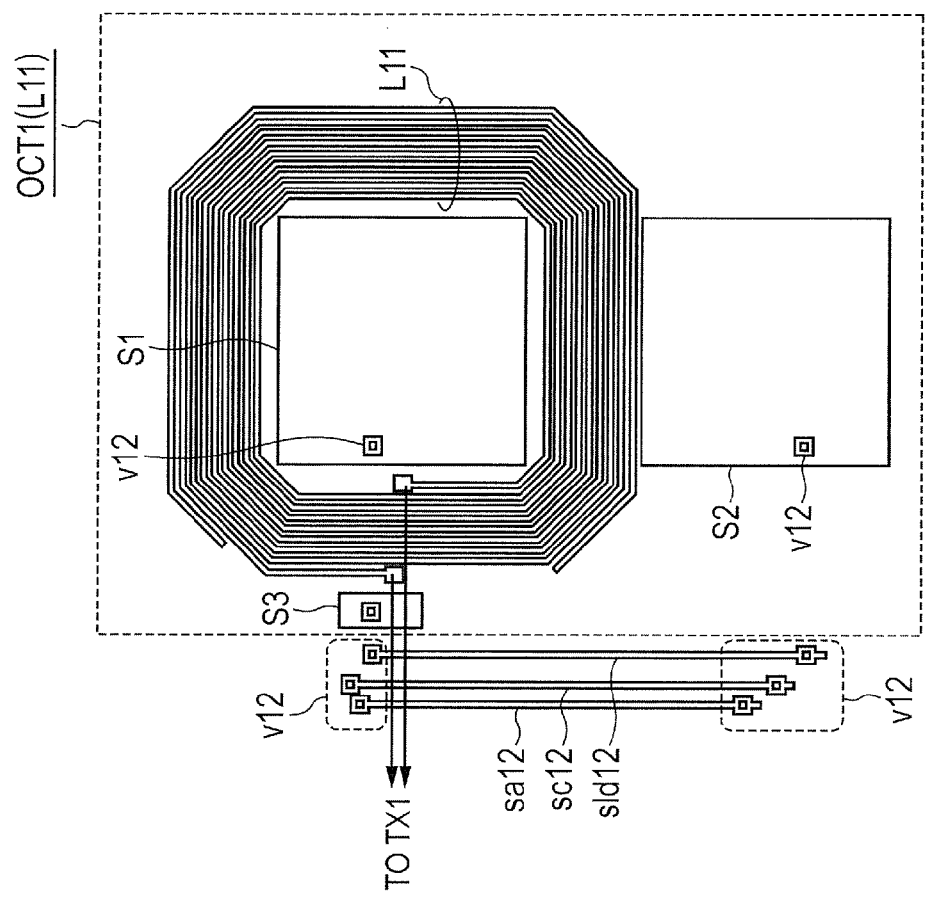

FIG. 5B illustrates the upper wiring layer pattern that forms the secondary coil L12 of the on-chip transformer OCT1, and the upper wiring layer pattern is formed of, for example, a fifth wiring layer. One end of the secondary coil L12 is connected to the pad P11 formed of the fifth wiring layer in the center thereof, and the other end of the secondary coil L12 is connected to the pad P12 formed of the fifth wiring layer in the outer periphery of the secondary coil L12. The shield layer S1 and the shield layer S2 are formed to overlap with the pad P11 and the pad P12, respectively.

A layout relationship between the temperature monitoring unit TS1 and the on-chip transformer OCT1 installed in the semiconductor device LSI1 according to the first embodiment will be described with reference to FIGS. 6A and 6B.

FIG. 6A is a plan view of a configuration in which the first wiring layer overlaps with the second wiring layer forming the primary coil L11 of the on-chip transformer OCT1. Both of the shield layer S1 and the shield layer S3 are connected to the line sld1 through the respective via holes v12. The shield layer S2 is connected to the line sld2 through the via hole v12. The line sld1 and the line sld2 are connected to the line sld12, which is applied with the supply voltage GND1, through the respective via holes v12. That is, the shield layers S1 to S3 are applied with the supply voltage GND1.

Both of the line sa1 and the line sa2 connected to the line sa12 through the respective via holes v12 are connected to the line sa. Both of the line sc1 and the line sc2 connected to the line sc12 through the via holes v12 are connected to the secondary coil. The line sa is connected to the heat generation determination unit EDET1, and the secondary coil is applied with the supply voltage GND1.

FIG. 6B illustrates a layout relationship between the respective pn junction diodes, and the shield layers S1 to S3 configuring the temperature monitoring unit TS1. The shield layer S1 is formed to cover the pn junction diode Dc formed in the center of the on-chip transformer OCT1, and the line sa1 and the line sc1 connected to the pn junction diode Dc. The shield layer S2 is formed to cover the diode Dc arranged in the outer periphery of the primary coil L11, and the line sa2 and the line sc2 connected to the diode Co. The shield layer S3 is arranged to cover the line sa1, the line sc1, the line tx11, and the line tx12 (all of those lines are formed of the first wiring layer) in the vicinity of the on-chip transformer OCT1.

A description will be given of a cross-sectional view of the temperature monitoring unit TS1 and the on-chip transformer OCT1 installed in the semiconductor device LSI1 in an X-X' direction thereof according to the first embodiment with reference to FIGS. 7A and 7B.

FIG. 7A is a plan view of the on-chip transformer OCT1 formed on the semiconductor substrate having the temperature monitoring unit TS1. FIG. 7A illustrates the secondary coil L12, the pad P11, and the pad P12, which are formed of the fifth wiring layer, and the primary coil L11 and the shield layers S1 to S3, which are formed of the second wiring layer.

FIG. 7B illustrates a cross-sectional view taken along a line X-X' in FIG. 7A. A pn junction diode Du4 and a pn junction diode Du8 are formed on a semiconductor substrate Sub in a region immediately below the on-chip transformer OCT1. The pn junction diode Dc is formed on the semiconductor substrate Sub in a center surrounded by the on-chip transformer OCT1 formation region. Each of the pn junction diodes has the anode A and the cathode C. The respective anodes A and cathodes C are connected to the line sa1 and the line sc1 formed of a first wiring layer M1 through a contact cnt, respectively. In the cross-sectional view taken along a line X-X' in FIG. 7B, the line sa1 and the contact cnt may not be shown in relation to the position and the direction of the respective pn junction diodes.

A second wiring layer M2 is formed over an upper layer of the first wiring layer M1 through an insulating layer. The primary coil L11 of the on-chip transformer OCT1, the shield layer S1, and the shield layer S3 are formed of the second wiring layer M2. The primary coil L11 is connected to the line tx12 of the transmitter circuit TX1, which is formed of the first wiring layer that allows the drive current to flow therein, through the via hole v12. The shield layer S1 is formed to cover the line sa1 connected to the anode A of the pn junction diode Dc. The shield layer S3 is formed to cover the line sa1, the line sc1, the line tx11, and the line tx12 in the vicinity of the on-chip transformer OCT1.

The secondary coil L12 of the on-chip transformer OCT1, and the pad P11, which are formed of a fifth wiring layer M5, are formed above an upper layer of the second wiring layer M2 through an insulating layer. The on-chip transformer OCT1 is about 300 μm in diameter, and formed at a height of about 5 to 30 μm from the semiconductor substrate Sub. In FIG. 7B, the insulating layer between the first wiring layer M1 and the second wiring layer M2, and the insulating layer between the second wiring layer M2 and the fifth wiring layer M5 are formed between the respective wiring layers, with the use of a material, a thickness, and a manufacturing process which are appropriately selected.

A description will be given of a cross-sectional view of the temperature monitoring unit TS1 and the on-chip transformer OCT1 installed in the semiconductor device LSI1 in a Y-Y' direction thereof according to the first embodiment with reference to FIGS. 8A and 8B.

Figure 8A:
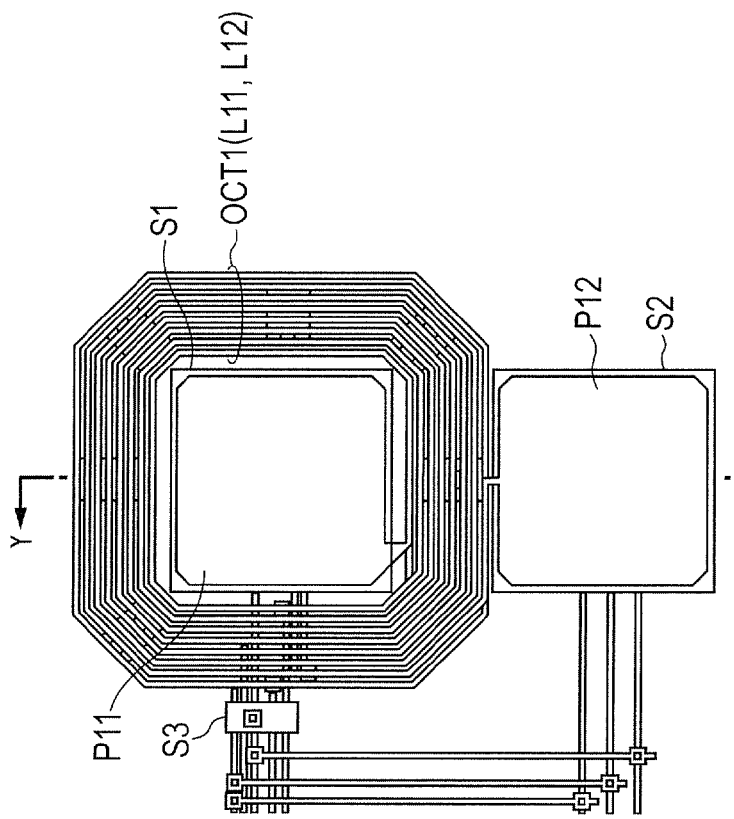
FIGS. 8A and 8B are cross-sectional views of the temperature monitoring unit and the on-chip transformer installed in the first semiconductor device along a Y-Y' direction thereof according to the first embodiment.
Figure 8B:
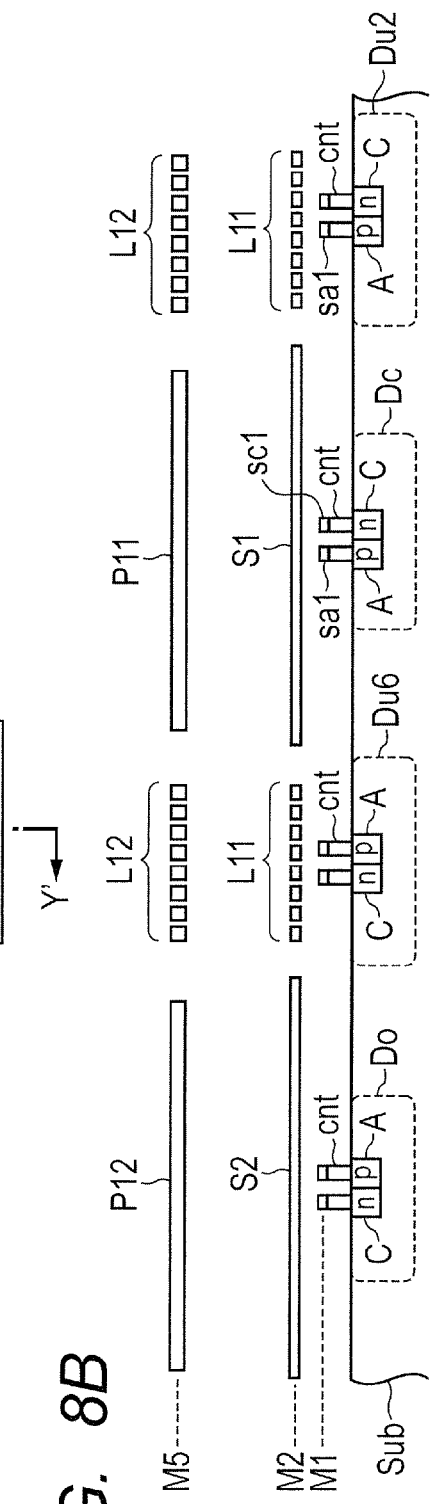

FIG. 8A illustrates the same plan view as that of FIG. 7A. FIG. 8B illustrates a cross-sectional view taken along a line Y-Y' of FIG. 8A. A pn junction diode Du2 and a pn junction diode Du6 in a region immediately below the on-chip transformer OCT1, the pn junction diode Dc in the center thereof, and the pn junction diode Dc in the outer periphery thereof are formed on the semiconductor substrate Sub. The anode A and the cathode C of the respective pn junction diodes are connected to the line sa1 and the line sc1, which are formed of the first wiring layer M1, through the contact cnt.

The second wiring layer M2 is formed over the upper layer of the first wiring layer M1 through the insulating layer. The primary coil L11 of the on-chip transformer OCT1, the shield layer S1, and the shield layer S2 are formed of the second wiring layer M2. The shield layer S1 is formed to cover the line sa1 and the line sc1 connected with the pn junction diode Dc, and the shield layer S2 is formed to cover the line sa2 and the line sc2 which are connected to the pn junction diode Do. The secondary coil L12 of the on-chip transformer OCT1, the pad P11, and the pad P12, which are formed of the fifth wiring layer M5, are formed over the upper layer of the second wiring layer M2 through the insulating layer.

The pn junction diode Du2, the pn junction diode Dc, and the pn junction diode Dc are arranged in the region immediately below, in the center of, and in the outer periphery of the on-chip transformer OCT1, respectively. The region immediately below the on-chip transformer OCT1 represents a region of the semiconductor substrate immediately below a portion where the primary coil L11 or the secondary coil L12 is formed. The center represents a region of the semiconductor substrate which is surrounded by the region immediately below the on-chip transformer OCT1. The outer periphery represents a region in the outer periphery of the region immediately below the on-chip transformer OCT1. The center and the outer periphery are collectively called "adjacent regions of the on-chip transformer OCT1".

As will be described later, when a high voltage continues to be applied between the primary coil L11 and the secondary coil L12 for a long time, the insulating film that isolates those coils from each other may be broken down. When the insulating film is broken down, a short-circuiting current between the primary coil L11 and the secondary coil L12 is generated in the breakdown portion. The generation of the short-circuiting current a rapid rise in the temperature of the breakdown portion of the insulating film, and the semiconductor substrate in the vicinity of the breakdown portion. The pn junction diode Dc and the pn junction diode Dc are arranged in the adjacent region. The pn junction diode Dc and the pn junction diode Dc, which are arranged in the adjacent region, detect the rapid rise in the temperature of the semiconductor substrate caused by the short-circuiting current substantially at the same time as that of the pn junction diode Du2 arranged in the region immediately below the on-chip transformer OCT1.

Figure 9:
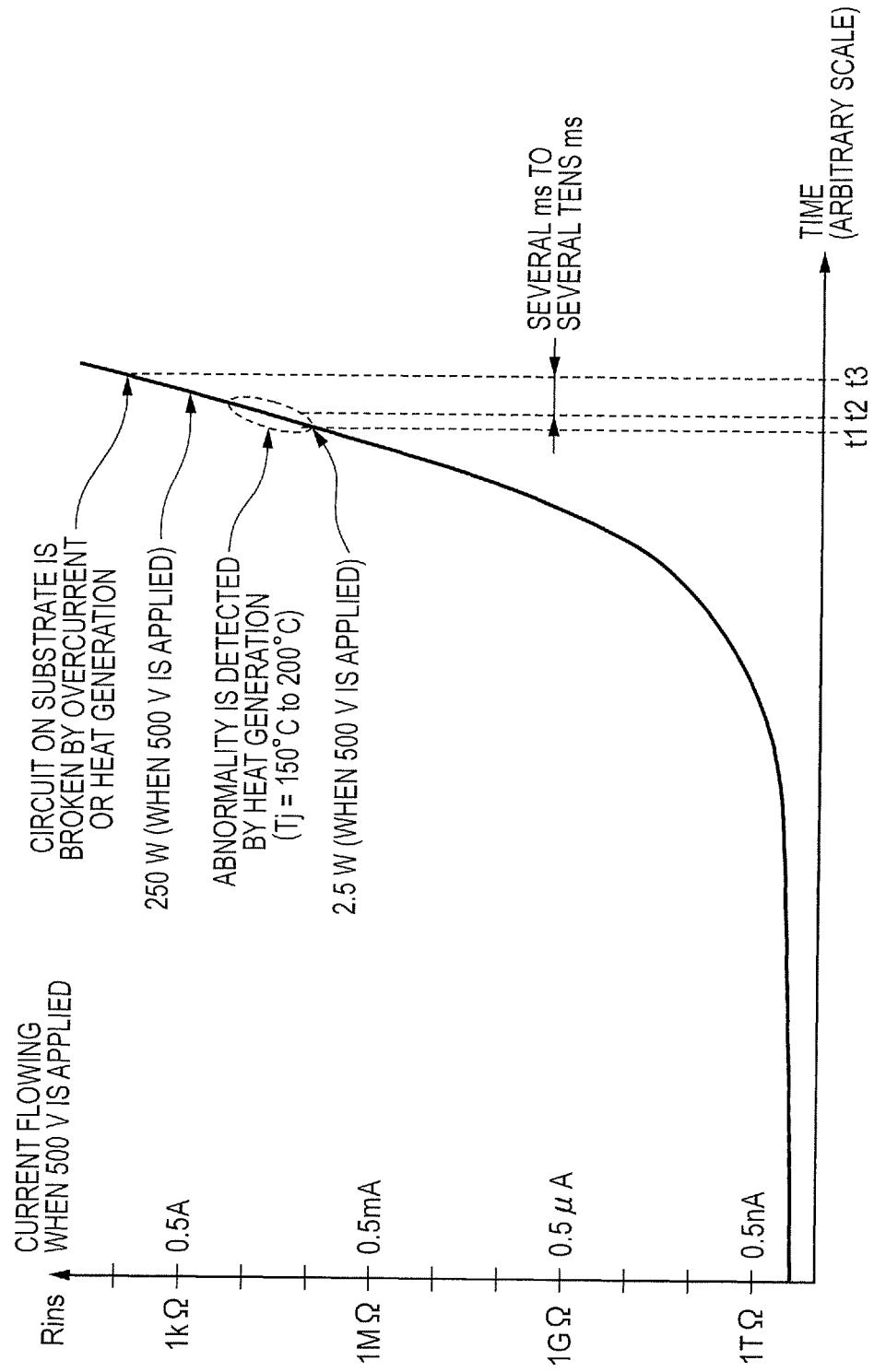
FIG. 9 is a graph illustrating a change in an insulation resistance value when the insulation breakdown between coils of the on-chip transformer is generated, which has been studied by the present inventors.

A description will be given of a temporal change in an insulation resistance value when the insulation breakdown is generated between the coils of the on-chip transformer, which has been studied by the present inventors, with reference to FIG. 9.

The axis of abscissa represents a time of an arbitrary scale, and the axis of ordinate represents a resistance value of the insulating film between the primary coil and the secondary coil. When a surge voltage is applied to the secondary coil connected to the pad, the insulating film may be deteriorated. A resistance of the normal insulating film before being deteriorated is 1 GΩ or more, and a leakage current is 1 μA or lower. When the high voltage continues to be applied between the primary coil and the secondary coil in a state where the insulating film is deteriorated, the resistance value of the insulating film is gradually reduced, and the leakage current gradually increases. For example, when a voltage of 500 V is applied to the insulating film whose resistance value is reduced to 100 kΩ, a current of 500 V/100 kΩ=5 mA flows in the insulating film, and the amount of heat generation in the insulating film becomes 500 V×5 mA=2.5 W.

When the heat of 2.5 W is generated in a local area within the chip, a latest temperature in the area arrives at 150° C. after 10 ms (time t1). Thereafter, when the resistance value of the insulating film is reduced to 1 kΩ, the current flowing in the insulating film arrives at 0.5 A, and the amount of heat generation of the insulating film arrives at 250 W. In this case, the temperature of the chip instantaneously arrives at 150° C. or higher, but a current of about 0.5 A is not enough to burn out a peripheral circuit mounted on the chip such as a power circuit. Therefore, the temperature monitoring unit TS1 measures a temperature of the semiconductor substrate Sub (time t2), thereby being capable of detecting the breakdown of the insulating film.

When a time is further elapsed, the insulation breakdown of the insulating film grows, and the resistance value of the insulating film continues to be reduced, and a current flowing in the peripheral circuit through the insulating film arrives at several tens A to several hundreds A (time t3). When this large current flows from the semiconductor device having the on-chip transformer into another electronic circuit mounted on the printed circuit board, there is a concern about a risk that an electronic circuit that induces burnout or firing appears.

On the contrary, the insulation breakdown is detected in the temperature monitoring unit TS1 at the time t2, and a control such as the cutoff of a high voltage source is conducted at a time of the detection. As a result, the system can be stopped safely before the electronic circuit mounted on the printed circuit board is burned out at the time t3. A time interval between the time t2 and the time t3 is estimated as about several ms to several tens ms. If the time interval of several ms is provided from the insulation breakdown detection (time t2), the gate voltage can be controlled so that the IGBT is turned off in the signal transmission module MD1 of FIG. 1. Further, if the time interval of several tens ms is provided, a mechanical relay that connects the IGBT and the high voltage source can be turned off.

A transmission time of the heat generated in the insulation breakdown portion, which has been studied by the present inventors, will be described with reference to FIGS. 10A and 10B.

Figure 10A:
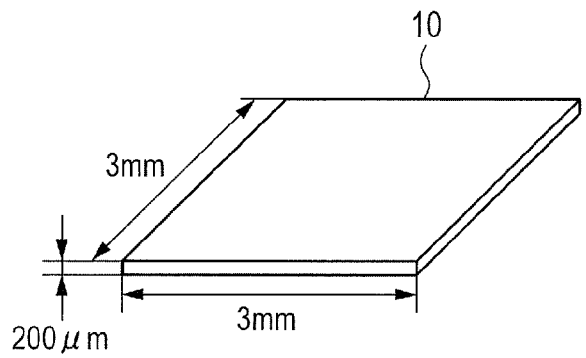
FIGS. 10A and 10B are graphs illustrating a transmission time of heat generated in an insulation breakdown portion, which has been studied by the present invention.

FIG. 10A illustrates a silicon substrate (chip) that is shaped in a square 3 mm in side and 200 μm in thickness. A weight of the chip is 3 mm×3 mm×0.2 mm×2.33 mg/mm$^3$ (density of silicon)=4.2 mg. The specific heat of silicon is 0.7 J/g° C. Therefore, the heat capacity of the chip becomes 0.7 J/g° C.×4.2 mg=2.94 mJ/° C.

Figure 10B:
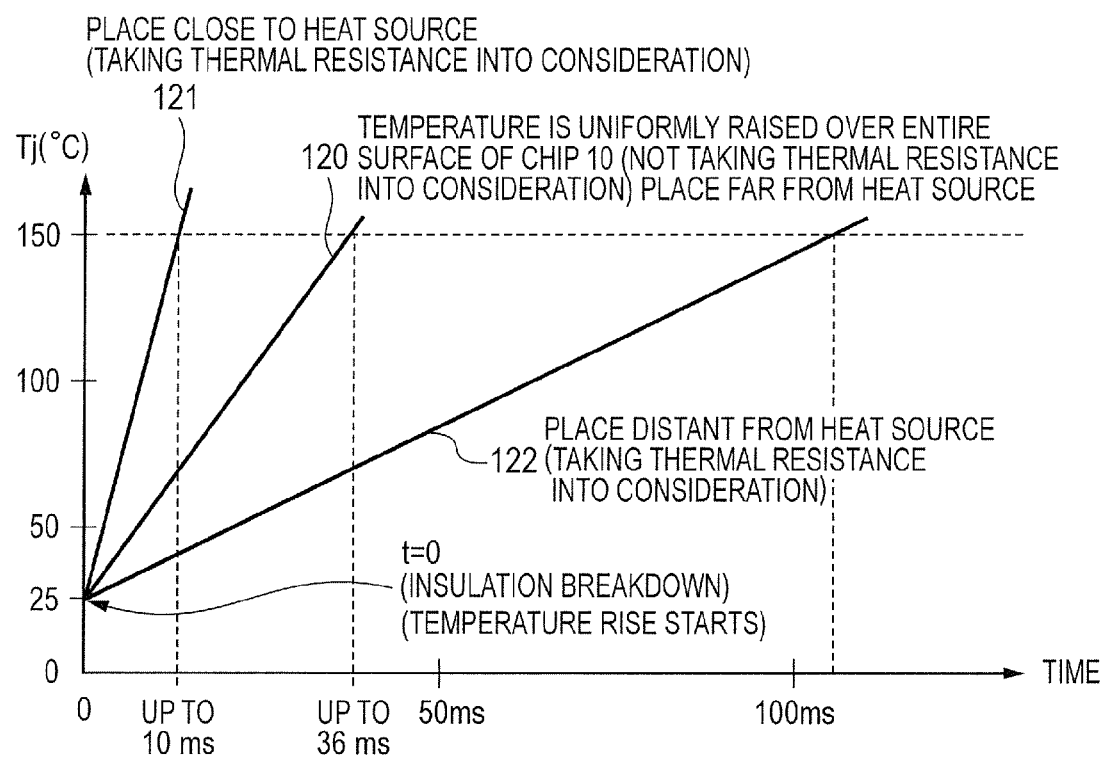

FIG. 10B illustrates a temporal change in a junction temperature Tj on two portions of the chip. A line 120 represents a temporal change in the chip temperature when a thermal resistance of the chip is not considered (heat instantaneously diffuses into the chip, and the temperature within the chip is uniformly changed regardless of a location). When a heat is produced in the chip at 10 W at a time 0 ms, and the heat of the chip is not emitted into air, an overheat time of the chip from a room temperature (25° C.) to 150° C. is studied. A temperature rise ratio at the time of 10 W (500 V, 20 mA) heat generation becomes 10 (J/s)/2.94 (mJ/° C.)=3.4° C./ms. Therefore, a time interval during which the chip is overheated from 25° C. to 150° C. becomes 125(° C.)/3.4(° C./ms)=36 ms (line 120). In fact, because the amount of radiation into the air is larger as the temperature is higher, the temperature of the chip is gently raised more as the temperature becomes higher, and maintained at a temperature at which the amount of heat generation is balanced with the amount of radiation.

On the other hand, when the thermal resistance of the chip is taken into consideration, a certain amount of time is required for diffusion of the heat into the chip. An inclination of the temperature rise therefore becomes steep in the vicinity of the insulation breakdown portion (heat source) where the heat is produced (line 121), and the inclination of the temperature rise becomes gentle in a location far from the heat source (line 122). For example, as indicated by the line 121, when heat of 10 W is produced in the heat source at a time 0 ms, the junction temperature Tj arrives at 150° C. in a location close to the heat source. Also, as indicated by a line 122, a time of about 100 ms is required for the junction temperature Tj to arrive at 150° C. in the location far from the heat source.

Therefore, in order to promptly detect the rapid temperature rise in the insulation breakdown portion, it is preferable that the temperature monitoring unit TS1 is arranged in the region immediately below or a region adjacent to the on-chip transformer OCT1 which becomes the insulation breakdown portion. On the other hand, it is preferable that a distance between the on-chip transformer OCT1 and the heat generation determination unit EDET1 is set to be larger than a distance between the on-chip transformer OCT1 and the temperature monitoring unit TS1. The temperature rise of the chip is generated later than an insulation breakdown generation time as the portion is farther than the insulation breakdown portion which is the high generation source. The temperature monitoring unit TS1 is arranged in the vicinity of the heat generation source, and the heat generation determination unit EDET1 is arranged at a position far from the heat generation source. With this arrangement, the heat generation determination unit EDET1 can normally output the heat generation detection signal Err1 under the condition where the temperature is maintained at an operation guaranty temperature within a delay time (several tens ms to several hundreds ms) until the junction temperature Tj arrives at 150° C.

A description will be given of a mechanism of the abnormal overheat detection by the temperature monitoring unit TS1 installed in the semiconductor device LSI1 (without the shield layer), and the heat generation determination unit EDET1 according to the first embodiment with reference to FIGS. 11A and 11B.

Figure 2:
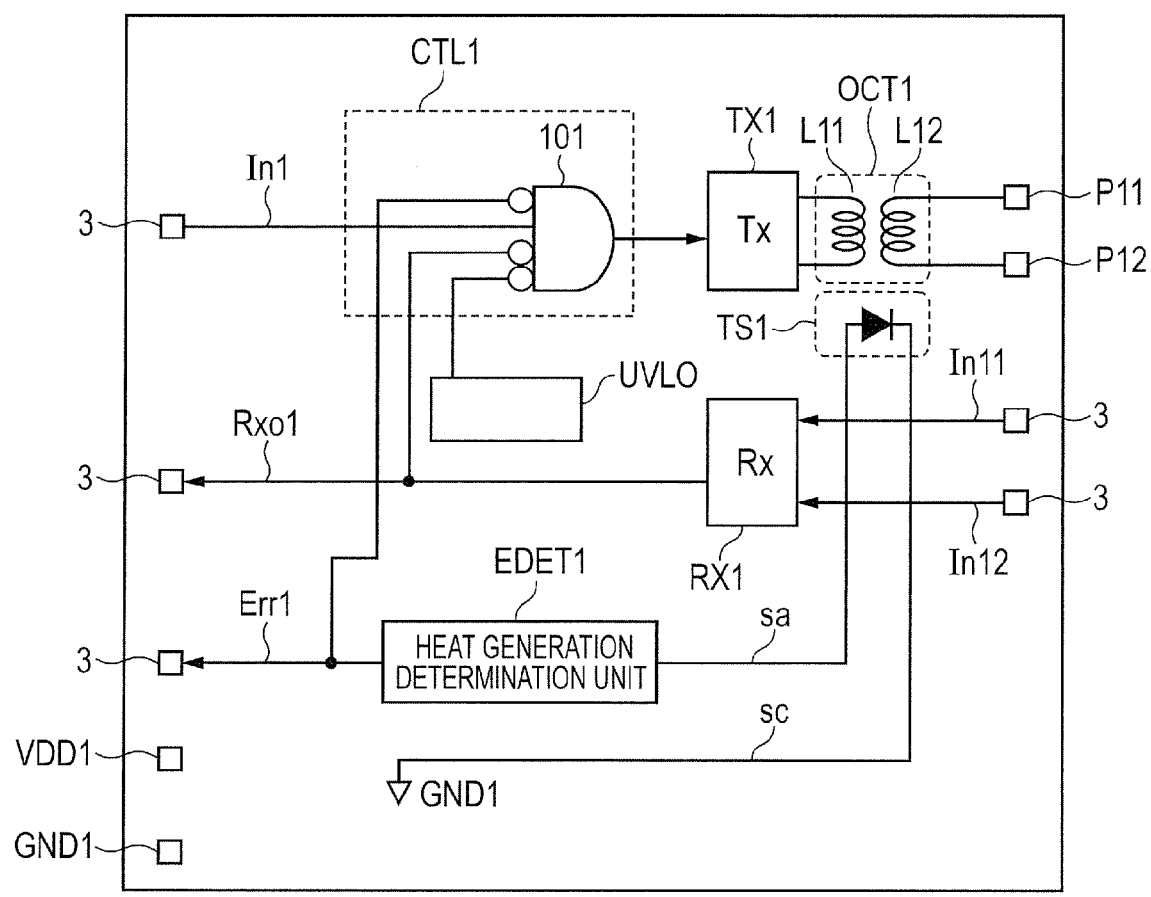
FIG. 2 is a circuit configuration diagram of the first semiconductor device according to the first embodiment.

FIG. 11A illustrates a connection relationship between an equivalent circuit of the on-chip transformer OCT1 and the temperature monitoring unit TS1 illustrated in FIG. 6B, and the transmitter circuit TX1 and the heat generation determination unit EDET1 illustrated in FIG. 2. In FIG. 11A, it is assumed that the on-chip transformer OCT1 is not equipped with the shield layers S1 to S3 illustrated in FIG. 6B. As a result, wiring patterns of the line sld1, the line sld2, and the line sld12 for applying the supply voltage GND1 to those shield layers are deleted.

A drive current of the transmitter circuit TX1 is supplied to both ends of the primary coil L11 of the on-chip transformer OCT1 through the line tx11 and the line tx12. The pad P11 and the pad P12 are connected to both ends of the secondary coil L12. A pn junction diode that is connected in parallel between the line sa1 and the line sc1 in the first system, and the pn junction diode that is connected to the line sa2 and the line sc2 in the second system are further connected in parallel to each other through the line sa12 and the line sc12. All of the anodes and the cathodes of the pn junction diodes installed in the temperature monitoring unit TS1 are connected to the line sa and the line sc, respectively. The temperature monitor signal sa is input to the heat generation determination unit EDET1, and the supply voltage GND1 is applied to the line sc.

FIG. 11B corresponds to a configuration when the shield layer S1 and the shield layer S3 illustrated in FIG. 7B are not provided. When the insulating film between the primary coil L11 and the secondary coil L12 of the on-chip transformer OCT1 is broken down, both of those coils come close to a state in which those coils are connected to each other by an insulating resistor Rins. It is conceivable that a value of the insulating resistor Rins in a burnout portion is equal to or lower than several kΩ order. The temperature of the semiconductor substrate Sub is raised mainly in a region where the pn junction diode Du4 is formed due to the abnormal heat generation occurring in the burnout portion, and the forward voltage of the pn junction diode Du4 and the pn junction diode arranged in the vicinity of the pn junction diode Du4 are lowered.

When the line sa1 and the line sc1 connected to the anode and the cathode of the pn junction diode Du4 are melted down by the abnormal heat generation of the burnout portion, the rapid temperature rise of the semiconductor substrate Sub is detected by the pn junction diodes Du3 to Du1, and the pn junction diode Dc arranged adjacent to the line sa1 and the line sc1. Even if a pair of the line sa1 and the line sc1 is partially melted down, information (a decrease in the forward voltage of the diode) indicative of the temperature rise of the semiconductor substrate Sub is output to the heat generation determination unit EDET1 due to the diode connected in parallel between the line sa1 and the line sc1 arranged between the meltdown portion and the heat generation determination unit EDET1. The heat generation determination unit EDET1 compares the forward voltage (temperature monitor signal sa) of the plurality of pn junction diodes connected in parallel with a reference voltage, and outputs a heat generation detection signal Err1 indicative of the occurrence of the abnormal heat generation.

A description will be given of a mechanism of the abnormality detection by the temperature monitoring unit TS1 (with the shield layer) installed in the semiconductor device LSI1, and the heat generation determination unit EDET1 according to the first embodiment with reference to FIGS. 12A and 12B.

FIG. 12A illustrates a connection relationship between an equivalent circuit of the on-chip transformer OCT1 (having the shield layers S1 to S3, and the line sld12) and the temperature monitoring unit TS1 illustrated in FIG. 6B, and the transmitter circuit TX1 and the heat generation determination unit EDET1 illustrated in FIG. 2. As illustrated in FIG. 12B, when the insulating film is broken down in an upper portion of a region in which the pn junction diode Du4 is arranged, a short-circuiting current flows in the insulating resistor Rins between the secondary coil L12 and the primary coil L11, and an insulating resistor Rsld between the secondary coil L12 and the shield layer S1. The short-circuiting that has flown in the shield layer S1 flows out to the supply voltage GND1; thereby, it is possible to avoid short-circuiting between the line sa1 and the line sc1 covered with the shield layer S1, and the secondary coil L12.

Likewise, a short-circuiting current is allowed to flow from the secondary coil L12 into the supply voltage GND1 through the shield layer S2 or the shield layer S3; thereby it is possible to avoid the short-circuiting between the line of the first wiring layer and the secondary coil L12 which are covered with the respective shield layers. This makes it possible to detect the abnormal heat generation attributable to the insulating film breakdown of the on-chip transformer OCT1.

As illustrated in FIG. 11A, the temperature monitoring unit TS1 includes the pn junction diodes Du1 to Du8 and Dc connected in parallel between the line sa1 and the line sc1 in the first system, and the pn junction diode Dc connected to the line sa2 and the line sc2 in the second system. All of the pn junction diodes are further connected in parallel through the line sa12 and the line sc12. The temperature monitor signal sa which is a voltage across the anode of the pn junction diodes connected in parallel is input to the heat generation determination unit EDET1. On the other hand, the supply voltage GND1 is applied to the cathode of the pn junction diodes connected in parallel by the line sc.

As described with reference to FIGS. 11A, 11B, 12A, and 12B, when the insulating film breakdown is generated in the on-chip transformer OCT1, the abnormal heat generation occurs between the first coil and the secondary coil, and in the periphery of those coils. Therefore, it is preferable that the pn junction diodes, which are the temperature detection elements, are arranged immediately below the formation region of the on-chip transformer OCT1 (pn junction diodes Du1 to Du8), in the center (Dc) thereof, and in the periphery (Do) thereof. Further, because diameter of the on-chip transformer OCT1 is several hundred micrometers, it is difficult to estimate a portion where the insulation breakdown is generated. Also, because heat that propagates through the insulating film (silicon oxide film) of several hundred micrometers from the heat generation source, it takes time to detect the abnormal heat generation. It is therefore preferable that multiple temperature detection elements are arranged.

When multiple pn junction diodes that is the temperature detection elements is arranged, it is preferable to connect the respective pn junction diodes in parallel to each other. For example, the pn junction diodes Du1 to Du8 and Dc arranged immediately below and in the center of the on-chip transformer OCT1 are connected in parallel to each other by the line sa1 and the line sc1. When the pn junction diodes are connected in parallel to each other, even if the line sa1 or the line sc1 is melted down by the short-circuiting current, the temperature monitor signal sa can be generated by the pn junction diode connected between the meltdown portion and the heat generation determination unit EDET1.

It is preferable that the temperature monitoring unit TS1 is configured by the temperature detection elements connected to the lines in multiple systems. The temperature monitoring unit TS1 illustrated in FIGS. 11A, 11B, 12A, and 12B have the pn junction diodes connected to the line sa1 and the line sc1 in the first system, and the line sa2 and the line sc2 in the second system. That the systems of the lines are different from each other means that the first wiring layer connected to the anode and the cathode of the pn junction diodes in a first group, and the first wiring layer connected to the anode and the cathode of the pn junction diodes in a second group are separated from each other in the first wiring layer. The first wiring layer connected to the anode and the cathode of the pn junction diodes arranged in the vicinity of the portion in which the insulation breakdown is generated is large in a risk of the meltdown caused by the abnormal heat generation. Therefore, in order to prevent the functional deterioration of the temperature monitoring unit TS1 caused by the meltdown of the first wiring layer as well as the loss of the function, it is preferable that the lines connected to the anodes and the cathodes are distributed into the plurality of systems.

A description will be given of the details of the heat generation determination unit EDET1 installed in the semiconductor device LSI1 according to the first embodiment with reference to FIG. 13.

Figure 13:
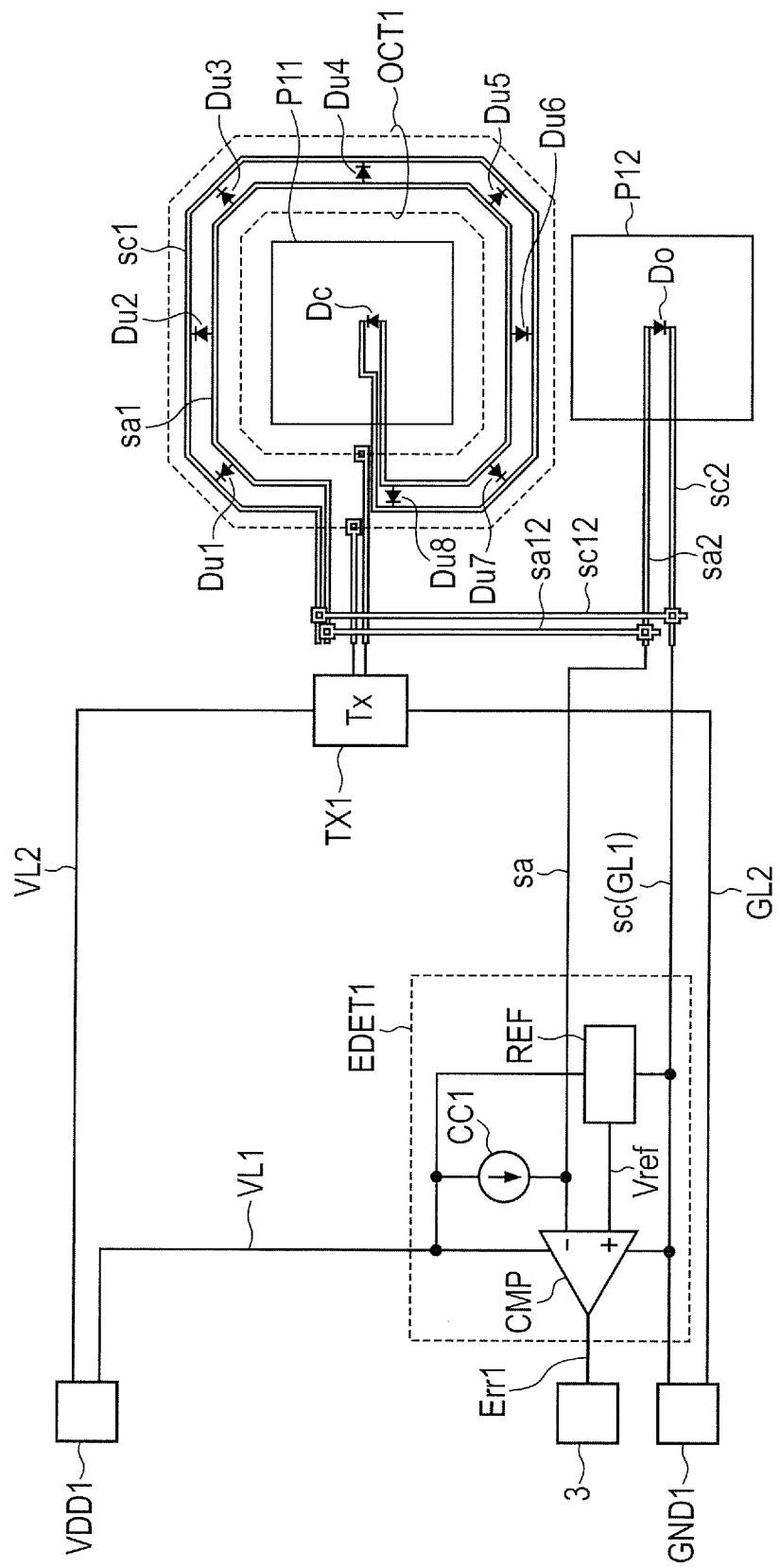
FIG. 13 is a circuit diagram of the heat generation determination unit installed in the first semiconductor device according to the first embodiment.

FIG. 13 illustrates a detailed circuit diagram of the heat generation determination unit EDET1 that outputs the heat generation detection signal Err1 on the basis of the temperature monitor signal sa output by the temperature monitoring unit TS1 illustrated in FIG. 11A.

The heat generation determination unit EDET1 includes a reference voltage generator circuit REF that generates a reference voltage Vref, a comparator CMP, and a constant current source CC1. The temperature monitor signal is input to a negative input terminal of the comparator CMP, and the reference voltage Vref is input to a positive input terminal of the comparator CMP.

The comparator CMP outputs the heat generation detection signal Err1 to the pad 3 on the basis of a comparison result of the temperature monitor signal sa and the reference voltage Vref. If the voltage of the temperature monitor signal sa is larger than the reference voltage Vref, the heat generation detection signal Err1 is set to the low level, and if the voltage of the temperature monitor signal sa is smaller than the reference voltage Vref, the heat generation detection signal Err1 is set to the high level. The constant current source CC1 supplies the forward current to the respective pn junction diodes configuring the temperature monitoring unit TS1.

A power supply line VL1 and a power supply line GL1 apply the supply voltage VDD1 and the supply voltage GND1 to the heat generation determination unit EDET1. On the other hand, a power supply line VL2 and a power supply line GL2 apply the supply voltage VDD1 and the supply voltage GND1 to the transmitter circuit TX1. It is preferable that the power supply line VL1 and the power supply line VL2 are branched from the supply voltage VDD1, or branched in a portion close to the supply voltage VDD1. The same is applied to the shapes of the power supply line GL1 and the power supply line GL2.

The heat generation determination unit EDET1 compares the forward voltage of the pn junction diode having the negative temperature characteristic (about −2 mV/° C.) with the reference voltage Vref, and detects the abnormal temperature rise in the region immediately below or in the region adjacent to the on-chip transformer OCT1. It is preferable that a value of the reference voltage Vref is set to a value that can detect the forward voltage value of the pn junction diodes in the temperature monitoring unit TS1 at a general temperature 125° C. to 150° C. as a maximum value of the operation guaranty temperature of the semiconductor device.

When an overheat protection circuit having another TSD (thermal shutdown) function is mounted within the same chip in addition to the heat generation determination unit EDET1, it is preferable that the value of the reference voltage Vref set by the heat generation determination unit EDET1 is set to a value higher than the reference voltage set by the overheat protection circuit having another TSD function. For example, in the semiconductor device LSI2 illustrated in FIG. 3, the reference voltage set by the heat generation determination unit EDET2 is set to be higher than the reference voltage set by the temperature detection unit 30. The respective reference voltages are set as described above with the result that the semiconductor device LSI2 normally operates in a guaranty temperature range of the temperature detection unit 30.

For example, when the constant current source CC1 supplies a current of about 100 μA to 10 pn junction diodes (Du1 to Du8, Dc, and Do) configuring the temperature monitoring unit TS1, the forward voltage of the respective diodes becomes about 0.7 V at a room temperature (25° C.). When the temperature of the insulating film is raised from the room temperature to 200° C. due to the insulation breakdown of the on-chip transformer OCT1, the forward voltage of at least one pn junction diode configuring the temperature monitoring unit TS1 is lowered to 450 mV. Therefore, the reference voltage Vref to be applied to the positive input terminal of the comparator CMP is set to 0.5 V, as a result of which the heat generation detection signal Err1 changes from the low level to the high level, and the abnormal temperature rise can be detected.

A description will be given of the configuration of the power supply lines connected to the heat generation determination unit EDET1, the temperature monitoring unit TS1, and the transmitter circuit TX1 installed in the semiconductor device LSI1 according to the first embodiment with reference to FIGS. 14A and 14B.

Figures 14A, 14B:
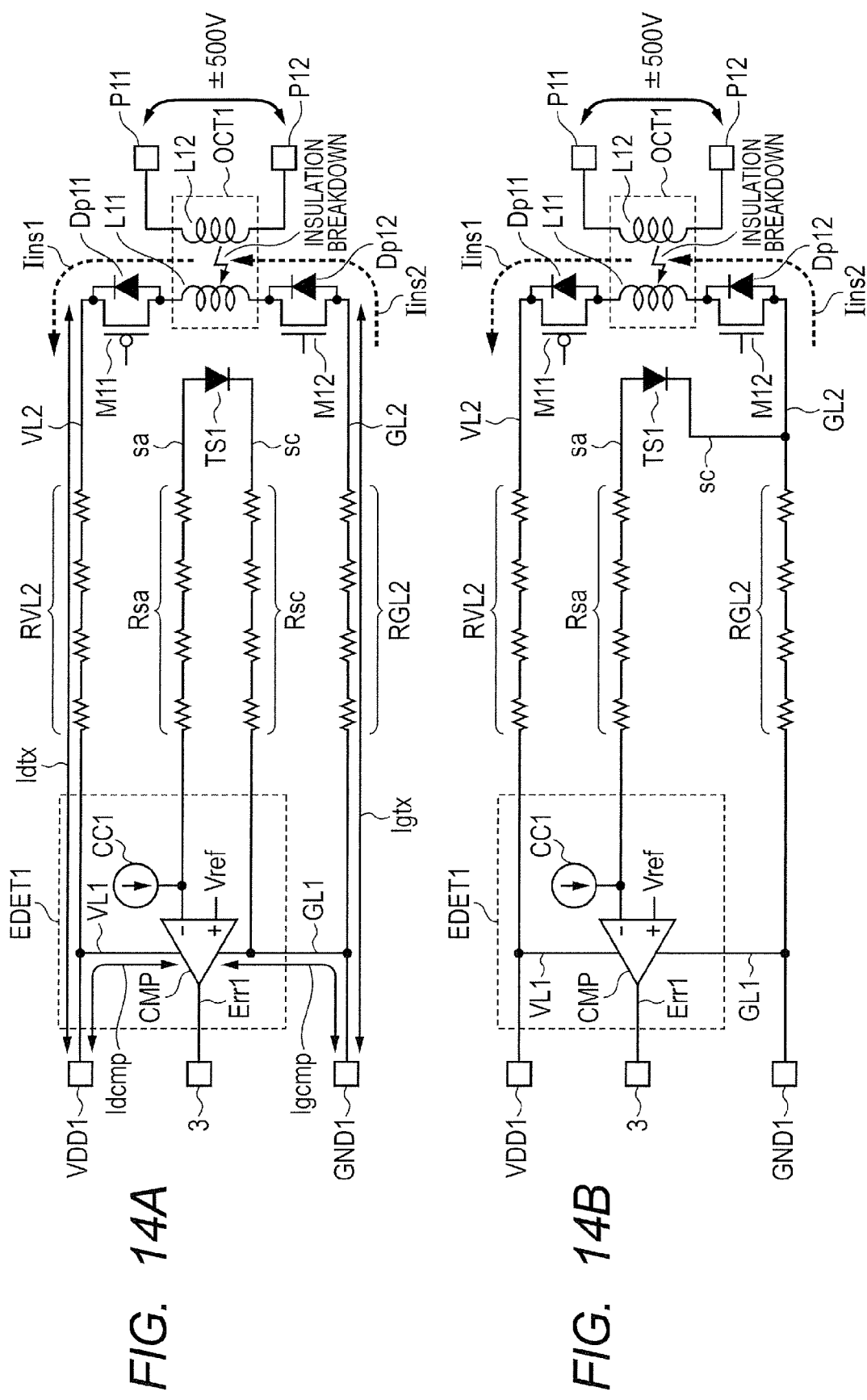
FIGS. 14A and 14B are configuration diagrams of a power supply line connected to the heat generation determination unit, the temperature monitoring unit, and a transmitter circuit which are installed in the first semiconductor device according to the first embodiment.

FIG. 14A illustrates the configuration of preferable power supply lines for applying the supply voltage to the respective circuits of the heat generation determination unit EDET1, the temperature monitoring unit TS1, the transmitter circuit TX1, and the on-chip transformer OCT1.

The secondary coil L12 of the on-chip transformer OCT1 is connected between the pad P11 and the pad P12. One end of the primary coil L11 is connected to a drain of a high side p-type transistor M11 in the transmitter circuit TX1, and the other end of the primary coil L11 is connected to a drain of a low side n-type transistor M12 in the transmitter circuit TX1. The supply voltage VDD1 is applied to a source of the high side p-type transistor M11 by the power supply line VL2. The supply voltage GND1 is applied to the source of the low side n-type transistor M12 by the power supply line GL2.

When the high voltage of about ±500 V is applied between the primary coil L11 and the secondary coil L12, and the insulation breakdown is generated between both of those coils, the short-circuiting current is generated between both of those coils. When the voltage across the secondary coil L12 is +500 V relative to the voltage across the primary coil L11, a short-circuiting current Iins1 flows into the power supply line VL2 (normally 5 V) from the secondary coil L12 through the secondary coil L12 and a parasitic diode Dp11 between the drain and the source of the p-type transistor M11. The voltage across the power supply line VL2 is varied more largely as the position is farther from the supply voltage VDD1, due to the short-circuiting current Iins1 and a parasitic wiring resistance RVL2 of the power supply line VL2.

Likewise, when the voltage across the secondary coil L12 is −500 V relative to the voltage across the primary coil L11, a short-circuiting current Iins2 flows from the power supply line GL2 into the secondary coil L12 through a parasitic diode Dp12 between the source and the drain of the n-type transistor M12, and the primary coil. The voltage across the power supply line GL2 is varied more largely as the position is farther from the supply voltage GND1, due to the short-circuiting current Iins2 and a parasitic wiring resistance RGL2 of the power supply line GL2.

There is a risk that a voltage variation of the power supply line VL2 and the power supply line GL2 which is caused by the insulation breakdown of the on-chip transformer OCT1 adversely influences the operation of the heat generation determination unit EDET1 that detects the insulation breakdown. Under the circumstances, it is preferable that the heat generation determination unit EDET1 is arranged in the vicinity of the supply voltage VDD1 and the supply voltage GND1. This configuration makes it difficult that the supply voltage VDD1 and the supply voltage GND1 which are applied to the heat generation determination unit EDET1 is affected by the voltage variation of the short-circuiting current generated in the on-chip transformer OCT.

Further, the parasitic resistance of the power supply line that applies the supply voltage to the comparator CMP installed in the heat generation determination unit EDET1 is smaller than the parasitic resistance of the power supply line that applies the power supply to the transmitter circuit TX1. When the structures (width, thickness, and material) of the respective power supply lines are identical with each other, it is preferable that a length lgcmp of the power supply line that applies the supply voltage GND1 from the supply voltage GND1 to the comparator CMP is set to be smaller than a length lgtx of the power supply line that applies the supply voltage GND1 to the transmitter circuit TX1 from the supply voltage GND1 as illustrated in FIG. 14A. More specifically, the length lgtx is a distance between the supply voltage GND1 and the source of the low side n-type transistor M12 of the transmitter circuit TX1.

Likewise, as illustrated in FIG. 14A, it is preferable that the length ldcmp of the power supply line that applies the supply voltage VDD1 from the power supply pad VDD1 to the comparator CMP is set to be smaller than a length ldtx of the power supply line that applies the supply voltage VDD1 to the transmitter circuit TX1 from the supply voltage VDD1 as illustrated in FIG. 14A. More specifically, the length ldtx is a distance between the power supply pad VDD1 and the source of the high side p-type transistor M11 of the transmitter circuit TX1. If the structures of the respective power supply lines are different from each other, a magnitude relationship of the above lengths is replaced with a magnitude relationship of the parasitic resistance values of the respective power supply lines.

Further, it is preferable that the line sc connected to the cathode of the pn junction diodes configuring the temperature monitoring unit TS1 is connected not with the power supply line GL2 that applies the supply voltage GND1 to the transmitter circuit TX1, but with the power supply line GL1 that applies the supply voltage GND1 to the heat generation determination unit EDET1. As illustrated in FIG. 14B, when the line sc of the temperature monitoring unit TS1 is connected to the power supply line GL2 (for example, neighborhood of the transmitter circuit TX2) in the vicinity of the on-chip transformer OCT1, the voltage variation of the line sc appears as the voltage variation of the line sa, that is, the temperature monitor signal sa. Because the heat generation determination unit EDET1 detects the voltage variation of several hundred millivolts of the temperature monitor signal sa to generate the heat generation detection signal Err1, there is a need to suppress the power supply variation of the line sc as much as possible.

In the semiconductor device LSI1, the preferable configuration of the power supply line that applies the supply voltage to the transmitter circuit TX1, the temperature monitoring unit TS1, and the heat generation determination unit EDET1, which are connected to the primary coil L11 of the on-chip transformer OCT1 is described above. It is preferable to also apply the configuration of the power supply line to the semiconductor device LSI2 (FIG. 3).

Figure 15:
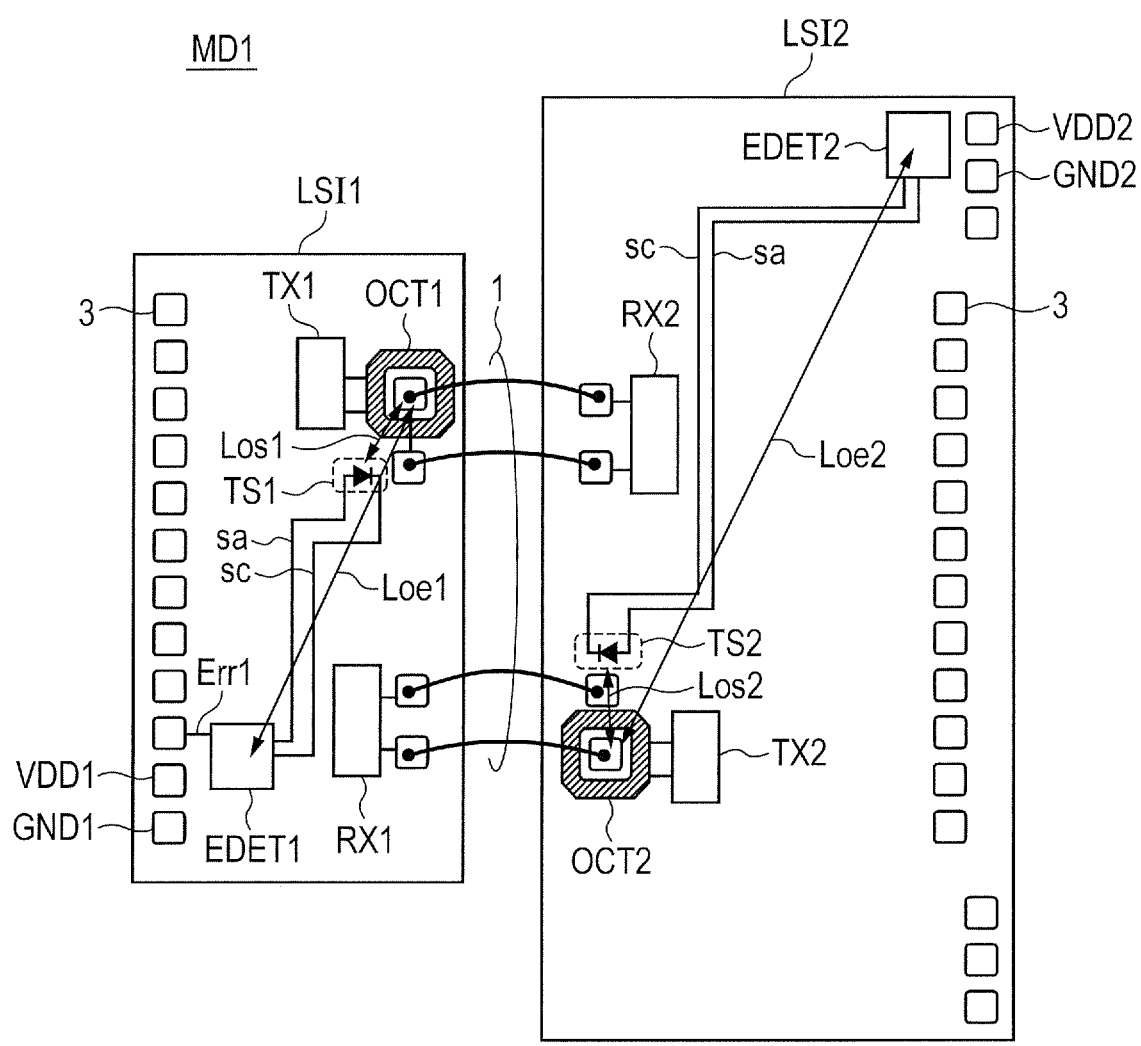
FIG. 15 is a plan view illustrating a layout of the respective temperature monitoring units in the first semiconductor device and the second semiconductor device according to the first embodiment.

A description will be given of a layout of the temperature monitoring unit TS1 and the temperature monitoring unit TS2 in the semiconductor device LSI1 and the semiconductor device LSI2 according to the first embodiment with reference to FIG. 15.

In the semiconductor device LSI1, a distance Loe1 between the on-chip transformer OCT1 and the heat generation determination unit EDET1 is set to be larger than a distance Los1 between the on-chip transformer OCT1 and the temperature monitoring unit TS1. In order to detect the abnormal heat generation caused by the insulating film breakdown of the on-chip transformer OCT1 as early as possible, the temperature monitoring unit TS1 is arranged in the region immediately below, or in the region adjacent (the center or the periphery thereof) to the on-chip transformer OCT1 that is the heat generation source at the time of the insulation breakdown. On the other hand, in order to reduce the adverse influence of the abnormal temperature rise of the chip, which is caused by the short-circuiting current of the on-chip transformer OCT1, the heat generation determination unit EDET1 is arranged distant from the on-chip transformer OCT1 as large as possible. Further, in order to suppress the influence of the noises generated in the power supply line, which is attributable to the short-circuiting current, the heat generation determination unit EDET1 is arranged close to the supply voltage VDD1 and a power supply pad GNG1.

In the semiconductor device LS21, a distance Loe2 between the on-chip transformer OCT2 and the heat generation determination unit EDET2 is set to be larger than a distance Los2 between the on-chip transformer OCT2 and the temperature monitoring unit TS2. In order to detect the abnormal heat generation caused by the insulating film breakdown of the on-chip transformer OCT2 as early as possible, the temperature monitoring unit TS2 is arranged in the region immediately below, or in the region adjacent (the center or the periphery thereof) to the on-chip transformer OCT2 that is the heat generation source at the time of the insulation breakdown. On the other hand, in order to reduce the adverse influence of the abnormal temperature rise of the chip, which is caused by the short-circuiting current of the on-chip transformer OCT2, the heat generation determination unit EDET2 is arranged distant from the on-chip transformer OCT2 as large as possible. Further, in order to suppress the influence of the noises generated in the power supply line, which is attributable to the short-circuiting current, the heat generation determination unit EDET2 is arranged close to the power supply pad VDD2 and a power supply pad GNG2.

A specific example of the reference voltage generator circuit REF provided in the heat generation determination unit EDET1 installed in the semiconductor device LSI1 according to the first embodiment will be described with reference to FIGS. 16A and 16B.

FIG. 16A illustrates an example in which a bandgap reference circuit BGR is applied as the reference voltage generator circuit REF. The reference voltage Vref not depending on the temperature of the chip, which is generated by the bandgap reference circuit BGR, is applied to the positive input terminal of the comparator CMP. The comparator CMP compares a fixed voltage corresponding to an absolute temperature (for example, 175° C.) with the temperature monitor signal sa output by the temperature monitoring unit TS1 at the time of supplying a forward current I1 of the constant current source CC1, and outputs the heat generation detection signal Err1 of the high level when a junction temperature of the pn junction diode arranged in the region immediately below or in the region adjacent to the on-chip transformer OCT1 exceeds 175° C. FIGS. 16A and 16B illustrate a circuit diagram in which the on-chip transformer OCT1 is schematically illustrated as a coil expressed in a perspective view.

FIG. 16B illustrates an example in which the reference voltage generator circuit REF is configured by a reference constant current source CCR that generates a forward current I1-α and a reference temperature detection element TSR to which the forward current I1-α is supplied. The forward voltage of the reference temperature detection element TSR is applied to the positive input terminal of the comparator CMP. The temperature monitor signal sa output by the temperature monitoring unit TS1 at the time of supplying the forward current I1 of the constant current source CC1 is supplied to the negative input terminal. The comparator CMP compares the forward voltage with the temperature monitor signal sa to generate the heat generation detection signal Err1.

The reference temperature detection element TSR is arranged at a distance from the layout region of the temperature monitoring unit TS1 within the chip. That is, a distance between the on-chip transformer OCT1 and the reference temperature detection element TSR is set to be larger than a distance between the on-chip transformer OCT1 which is the abnormal heat generation source, and the temperature monitoring unit TS1. For example, the reference temperature detection element TSR may be arranged adjacent to the comparator CMP. When a temperature detected by the temperature monitoring unit TS1 becomes higher than a temperature detected by the reference temperature detection element TSR by, for example, 50° C. or higher, the comparator CMP outputs the heat generation detection signal Err1 of the high level. Since the temperature monitor signal sa is compared with the forward voltage of the reference temperature detection element TSR, the voltage generator circuit such as the bandgap reference circuit become unnecessary, resulting in advantages that the circuit is simplified, and the chip area is reduced.

When the forward current to be supplied to the reference temperature detection element TSR is made smaller than the value of the forward current I1 to be supplied to the temperature monitoring unit TS1 by α as I1-α, a detection threshold value of the comparator CMP corresponding to the detected temperature difference is set. Alternatively, it is possible that values of both the forward currents are made identical with each other, and an offset is set in the input threshold value of the comparator CMP to adjust the detected temperature by the temperature monitoring unit TS1 and the reference temperature detection element TSR.

Another example of the reference voltage generator circuit provided in the heat generation determination unit EDET1 installed in the semiconductor device LSI1 according to the first embodiment will be described with reference to FIGS. 17A and 17B.

FIG. 17A illustrates a configuration of a heat generation determination unit EDET11. The heat generation determination unit EDET11 includes a comparator CMP1, a comparator CMP2, the constant current source CC1, and an OR circuit G1. The temperature monitor signal sa output by the temperature monitoring unit TS1 to which the forward current is supplied from the constant current source CC1 is supplied to a negative input terminal of the comparator CMP1 and a positive input terminal of the comparator CMP2. A reference voltage Vref1 (0.5 V), which is assumed as the forward voltage output when the temperature monitoring unit TS1 is 150° C., is applied to a positive input terminal of the comparator CMP1. A reference voltage Vref2 (1.0 V), which is assumed as the forward voltage output when the temperature monitoring unit TS1 is −50° C., is applied to a negative input terminal of the comparator CMP2.

If the value of the temperature monitor signal sa to be applied to the negative input terminal is smaller than the reference voltage Vref1 to be applied to the positive input terminal, the comparator CMP1 outputs the high level. If the temperature monitor signal sa to be applied to the positive input terminal is larger than the reference voltage Vref2 to be applied to the negative input terminal, the comparator CMP2 outputs the high level. The OR circuit G1 outputs the heat generation detection signal Err1 of the high level when any one of the comparator CMP1 and the comparator CMP2 becomes the high level.

That is, the heat generation determination unit EDET11 detects that the temperature detected by the temperature monitoring unit TS1 falls outside a temperature range of −50° C. to +150° C. assumed as the usage environment of the semiconductor device. If the chip temperature falls outside +150° C., the heat generation detection signal Err1 is set to the high level, and the insulation breakdown of the on-chip transformer OCT1 is detected.

FIG. 17B is a diagram illustrating the operation of the heat generation determination unit EDET11 when the line sa connected with the temperature monitoring unit TS1 is melted down. The temperature monitoring unit TS1 is arranged immediately below or in the vicinity of the on-chip transformer OCT1. For that reason, the line sa that transmits the measured output of the temperature monitoring unit TS1 to the heat generation determination unit EDET11 may be melted down by the abnormal heat generation occurring in the insulation breakdown of the on-chip transformer OCT1. In this case, although the temperature monitor signal sa is not input to the heat generation determination unit EDET11, because a load current of the constant current source CC1 becomes substantially null, the output of the constant current source CC1 is raised to the supply voltage VDD1 (5 V). The raised output voltage of the constant current source CC1 is compared with the reference voltage Vref2 (1.0 V) of the comparator CMP2, and the comparator CMP2 outputs the high level. As a result, the heat generation detection signal Err1 becomes the high level, and the insulation breakdown of the on-chip transformer OCT1 is detected.

A description will be given of a variety of configuration examples of the temperature monitoring unit TS1 according to the respective embodiments with reference to FIGS. 18A to 18D.

Figure 18C:
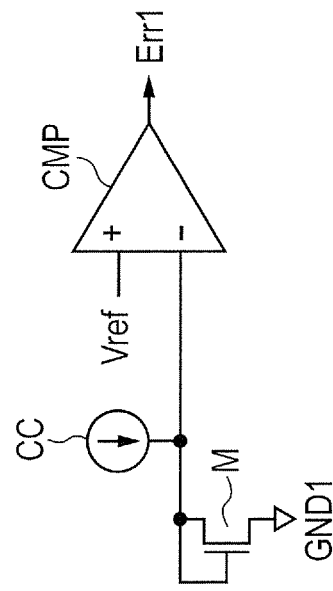
FIGS. 18A to 18D are circuit diagrams illustrating respective various configuration examples of the temperature monitoring unit according to the respective embodiments.
Figure 18D:
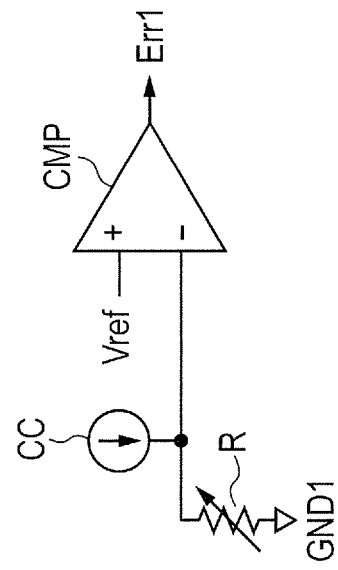
Figure 18A:
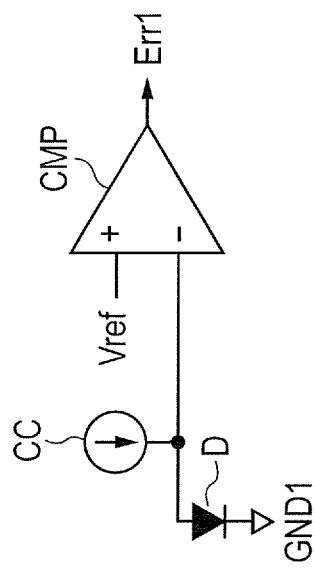

FIG. 18A illustrates a pn junction diode D described as a specific example of the temperature monitoring unit TS1 according to the first embodiment. A given constant current is supplied to the pn junction diode D in the forward direction, and the forward voltage of the anode to the cathode connected with the supply voltage GND1 is compared with the reference voltage Vref by the comparator CMP to output the heat generation detection signal Err1.

Figure 18B:
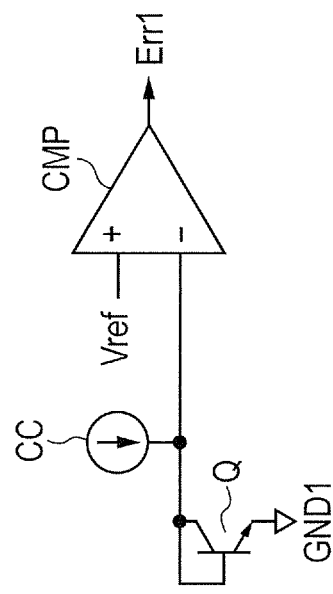

FIG. 18B illustrates a temperature monitoring unit that supplies a given constant current between a base and an emitter of a diode-connected bipolar transistor Q in the forward direction, and detects a chip temperature by the forward voltage of the base to the emitter to which the supply voltage GND1 is applied. FIG. 18C illustrates a temperature monitoring unit that short-circuits between a gate and a drain of a diode-connected MOS transistor M, and detects the chip temperature by the gate voltage to the source to which the supply voltage GND1 is applied. FIG. 18D is a temperature monitoring unit that supplies a given constant current to a resistor having a temperature dependency, and detects the chip temperature by a voltage generated between both ends of the resistor. As a resistor whose resistance value has a temperature coefficient, a polycrystal silicon resistor, a diffused resistor, a well resistor, and a metal resistor can be applied.

Other modifications of the heat generation determination unit according to the respective embodiments will be described with reference to FIGS. 19A to 19C.

Figure 19A:
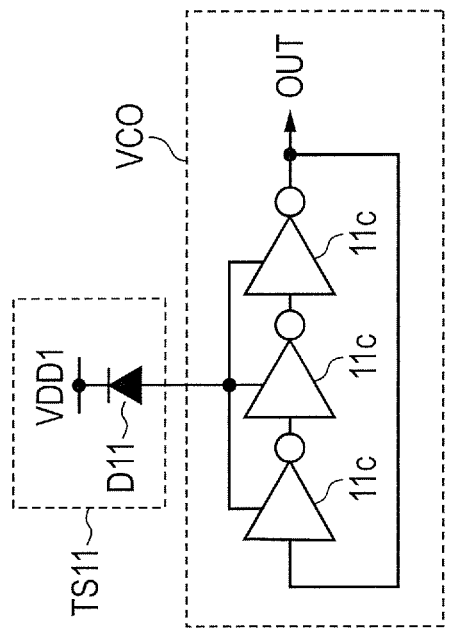
FIGS. 19A to 19C are circuit diagrams of modifications of the heat generation determination unit according to the respective embodiments.

FIG. 19A illustrates a temperature monitoring unit TS11 that applies the supply voltage VDD1 to the cathode of a diode D11, and a heat generation determination unit EDET11a including a transistor M, a capacitor Cap, and the comparator CMP. An anode of the diode D11 is connected to a drain of the transistor M, the supply voltage GND1 is applied to a source of the transistor M, and a signal CLR is supplied to a gate of the transistor M. A voltage across the drain of the transistor M is applied to the positive input terminal of the comparator CMP as a signal INTEG. The reference voltage Vref is applied to the negative input terminal of the comparator CMP. The capacitor Cap is connected between the positive input terminal of the comparator CMP and the supply voltage GND1.

Figure 19C:
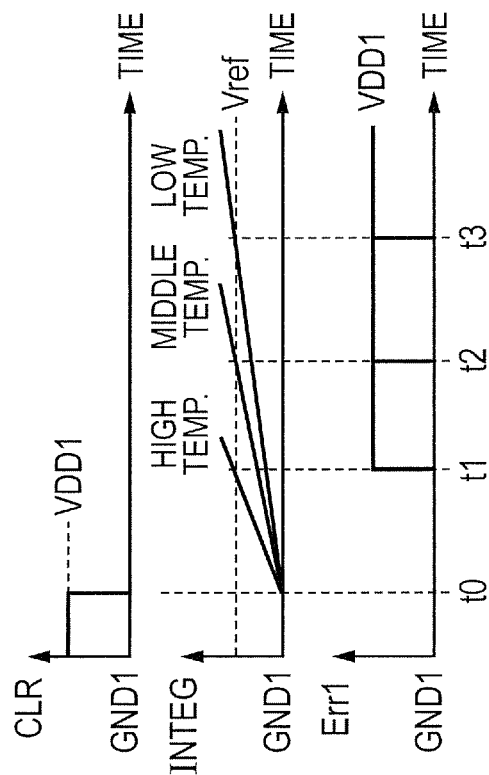
Figure 19B:
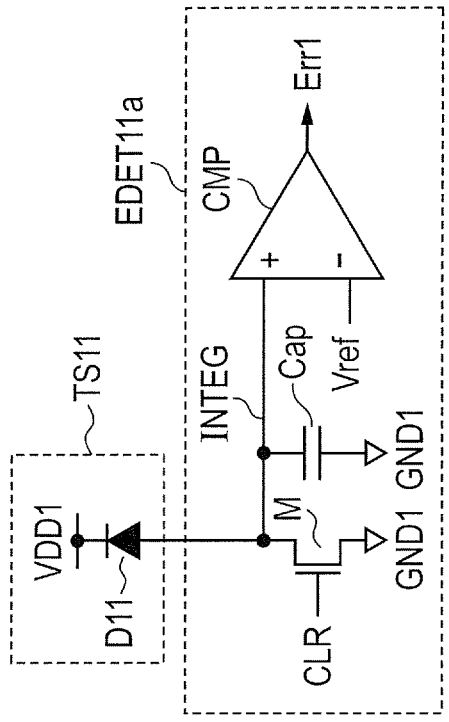

FIG. 19B illustrates a method of generating the heat generation detection signal Err1 by the temperature monitoring unit TS11 and the heat generation determination unit EDET11a illustrated in FIG. 19A. Before a time t0 at which the temperature monitoring unit TS1 starts the temperature measurement, the transistor M having the gate to which the signal CLR of the high level (VDD1) has been supplied maintains the supply voltage GND1 between both terminals of the capacitor Cap, and discharges the stored charge. When the signal CLR is set to the low level at the time t0, the capacitor Cap is charged with the leakage current of the inversely biased diode D11, and a voltage of the signal INTEG starts to rise.

When the voltage of the signal INTEG exceeds the reference voltage Vref, the comparator CMP outputs the heat generation detection signal Err1 of the high level. The leakage current of the diode D11 increases more as a pn junction temperature of the diode D11 is raised more. Therefore, time intervals since the time t0 at which the logic level of the signal CLR has been changed till the times t1/t2/t3 at which the logic level of the heat generation detection signal Err1 is changed from the low level to the high level are measured, thereby being capable of detecting the insulation breakdown of the on-chip transformer OCT1.

FIG. 19C illustrates the temperature monitoring unit TS11 that applies the supply voltage VDD1 to the cathode of the diode D11, and the heat generation determination unit having an oscillator circuit in which multiple inverters 11c is connected in cascade. The respective inverters 11c connected in cascade are applied with the supply voltage from the anode of the diode D11. The voltage across the anode of the diode D11 is raised more as the pn junction temperature rises. Therefore, the number of oscillations in the oscillator circuit configured by the inverters 11c is measured by a counter not shown for a given time, and if the count value of the number of oscillations exceeds a given value, the logic level of the heat generation detection signal Err1 is inverted, thereby being capable of detecting the insulation breakdown of the on-chip transformer OCT1.

A configuration of the temperature monitoring unit TS11 which is a modification of the temperature monitoring unit TS1 installed in the semiconductor device LSI1 according to the first embodiment will be described with reference to FIGS. 20A and 20B.

Figure 20A:
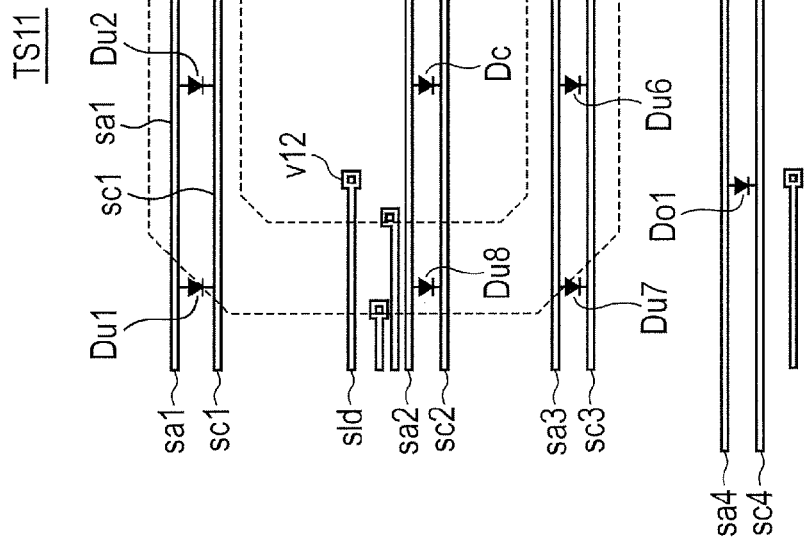
FIGS. 20A and 20B are layout plan views of modifications of the temperature monitoring unit installed in the first semiconductor device according to the first embodiment.

FIG. 20A is a layout plan view of the temperature monitoring unit TS11. The temperature monitoring unit TS11 includes multiple pn junction diodes (temperature detection elements) formed on the semiconductor substrate, and each of the pn junction diodes has an anode A and a cathode C. The pn junction diodes Du1 to Du8 are arranged immediately below the on-chip transformer OCT1, the pn junction diode Dc is arranged in the center of the on-chip transformer OCT1, and pn junction diodes Do1 and Do2 are arranged in the outer periphery of the on-chip transformer OCT1.

The anodes and the cathodes of the pn junction diodes Du1 to Du3 are connected to the line sa1 and the line sc1 in the first system, respectively. The anodes of the pn junction diodes Du, Dc, and Du8 are connected to the line sa2 in the second system, and the cathodes of those diodes are connected to the line sc2 in the second system. The anodes and the cathodes of the pn junction diodes Du5 to Du7 are connected to the line sa3 in the third system, and the line sc3 in the third system, respectively. The anodes of the pn junction diodes Do1 and Do2 are connected to a line sa4 in a fourth system, and the cathodes of those diodes are connected to a line sc4 in the fourth system.

Figure 20B:
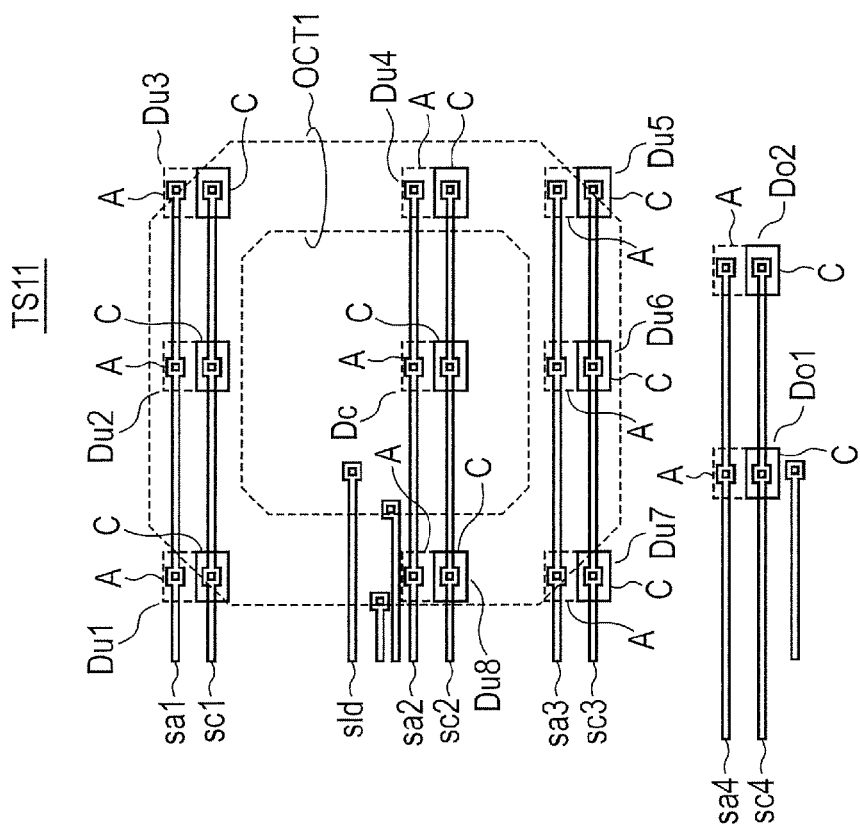

FIG. 20B is an equivalent circuit diagram of the temperature monitoring unit TS11 illustrated in FIG. 20A. The above diodes are connected in parallel between the respective lines of the first to fourth systems.

A layout relationship between the temperature monitoring unit TS11 and the on-chip transformer OCT1 installed in the semiconductor device LSI1 according to the first embodiment will be described with reference to FIGS. 21A and 21B.

FIG. 21A is a plan view illustrating a configuration in which the first wiring layer overlaps with the second wiring layer forming the primary coil L11 of the on-chip transformer OCT1. The shield layer S1 and the shield layer S3, which are formed of the second wiring layer, are each connected to the line sld12 formed of the first wiring layer through the via hole v12, and the shield layer S2 formed of the second wiring layer is connected to a line sld21 formed of the first wiring layer through the via hole v12. The line sld12 and the line sld21 are connected to a line sld22 formed of the second wiring layer through the via hole v12. The line sa1, a line sa3, and a line sa4, which are formed of the first wiring layer, are connected to a line sa22 formed of the second wiring layer through the via hole v12. The line sc1, the line sc2, the line sc3, and the line sc4, which are formed of the first wiring layer, are connected to a line sc22 which is formed of the second wiring layer through the via hole v12.

FIG. 21B illustrates a relationship between the respective pn junction diodes configuring the temperature monitoring unit TS11, and the shield layers S1 to S3. The shield layer S1 is formed to cover the diode Dc formed in the center of the on-chip transformer OCT1, and the line sa2 and the line sc2 which are connected to the diode Dc. The shield layer S2 is formed to cover the diodes Do1 and Do2 which are arranged in the outer periphery of the primary coil L11, and the line sa4 and the line sc4 which are connected to the primary coil L11. The shield layer S3 is formed to cover the line sa2 and the line sa2 in the vicinity of the on-chip transformer OCT1. The shield layers S1 to S3 are applied with the supply voltage GND1.

The temperature monitoring unit TS11 has a configuration in which the respective diodes arranged in the region immediately below, in the center of, and in the outer periphery of the on-chip transformer OCT1 are divided into four wiring systems (lines sa1/sc1, lines sa2/sc2, lines sa3/sc3, lines sa4/sc4), and connected in parallel to each other. With an increase in the number of wiring systems in which the diodes are connected in parallel to each other, even if any wiring system is melted down, the temperature monitoring unit TS11 can hold a function of detecting the abnormal temperature rise.

A system configuration formed of the signal transmission modules MD1 having the semiconductor device LSI1 and the semiconductor device LSI2 according to the first embodiment will be described with reference to FIG. 22.

Figure 22:
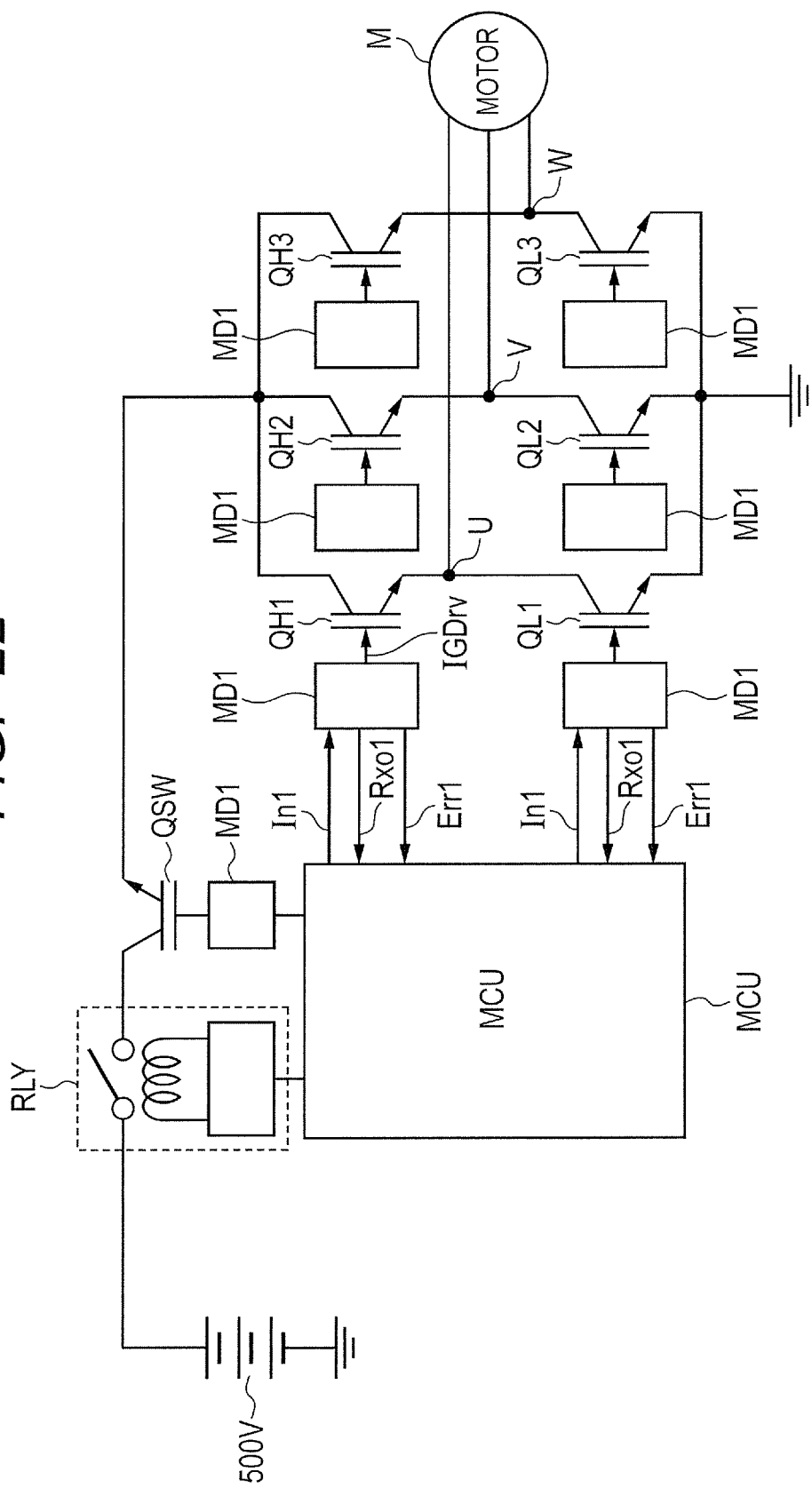
FIG. 22 is a system configuration diagram of a signal transmission module having the first semiconductor device and the second semiconductor device according to the first embodiment.

FIG. 22 illustrates a system example in which the signal transmission modules MD1 are applied to the IGBT driver. Transistors QH1, QH2, and QH3 of the high side, and transistors QL1, QL2, and QL3 of the low side are connected in cascade to each other through connection points U, V, and W, respectively, to form a three-phase inverter. The respective transistors are each formed of an IGBT, the collectors of the high side transistors are applied with a high DC voltage of 500 V, and the emitters of the low side transistors are applied with a ground potential. An AC current of three phases is supplied to a motor M from the connection points U, V, and W.

The bases of the respective transistors are supplied with the drive signal IGDrv output by the respective signal transmission modules MD1. Each of the signal transmission modules MD1 generates the drive signal IGDrv on the basis of the signal In1 output by a microcomputer MCU. Further, the signal transmission module MD1 outputs the output signal Rox1 and the heat generation detection signal Err1 to the microcomputer MCU. The microcomputer MCU controls the conductivity of a mechanical relay RLY and a transistor QSW which is an IGBT, on the basis of the output signal Rox1 and the heat generation detection signal Err1.

A system control method by the signal transmission module MD1 at the time of generating the insulation breakdown according to the first embodiment will be described with reference to FIG. 23.

Figure 23:
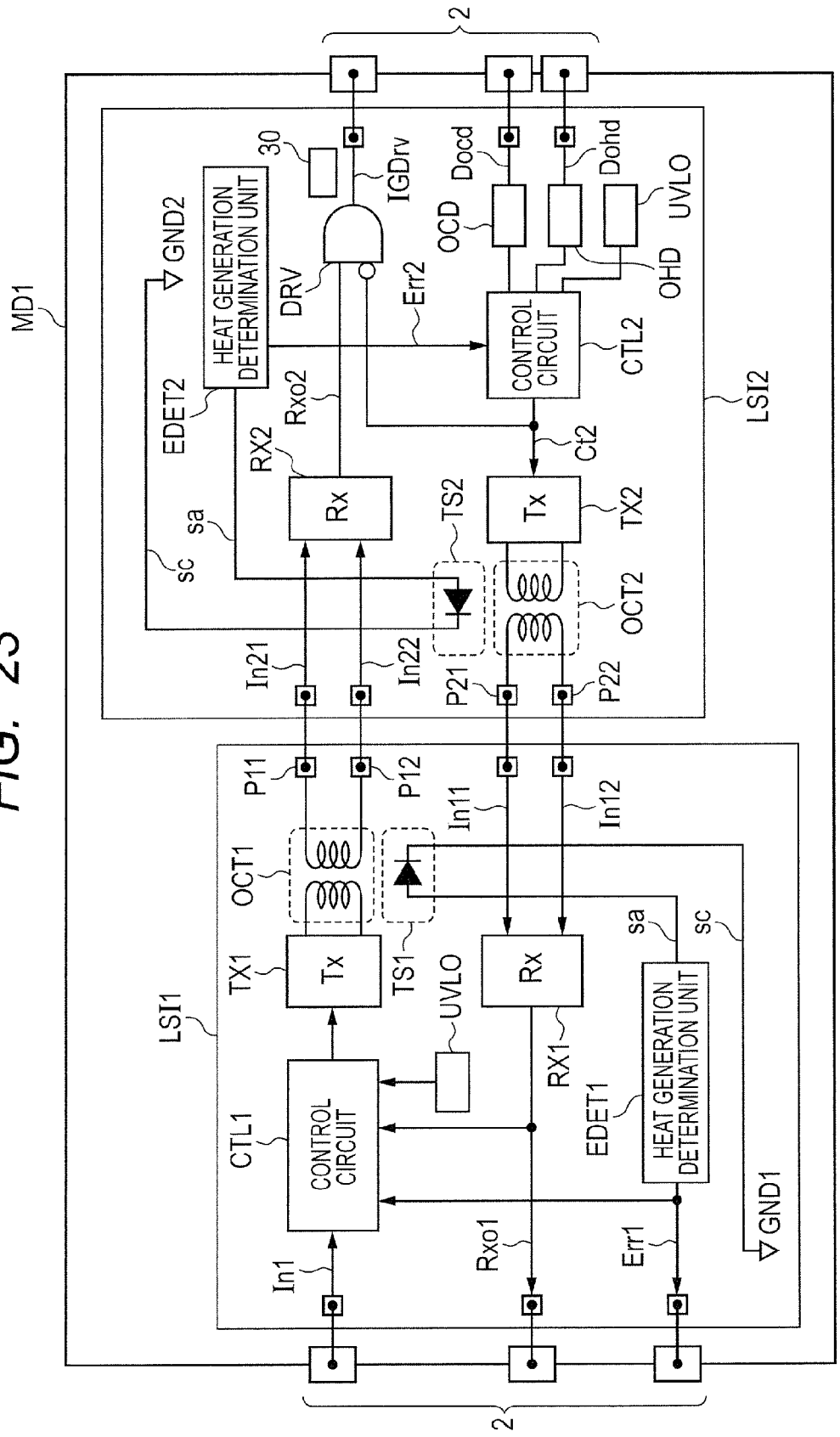
FIG. 23 is a circuit block diagram of the first semiconductor device and the second semiconductor device installed in the signal transmission module according to the first embodiment.

FIG. 23 illustrates a configuration of the semiconductor device LSI1 and the semiconductor device LSI2 mounted on the signal transmission module MD1 according to the first embodiment. The configuration and the operation of the semiconductor device LSI1 and the semiconductor device LSI2 in FIG. 23 are identical with the configuration and the operation illustrated in FIGS. 2 and 3, respectively. The semiconductor device LSI1 is a primary side signal transmission chip that directly transmits and receives a signal with respect to the microcomputer MCU. The semiconductor device LSI2 is a secondary side signal transmission chip that controls the switching operation of the IGBT to which the high DC voltage is applied.

The system protection operation when the insulation breakdown of the on-chip transformer OCT1 is generated in the primary side signal transmission chip (LSI1) will be described.

When the chip temperature is raised by the insulation breakdown of the on-chip transformer OCT1 mounted on the semiconductor device LSI1, the heat generation determination unit EDET1 outputs the heat generation detection signal Err1 to the microcomputer MCU. Upon receiving the heat generation detection signal Err1, the microcomputer MCU switches the transistor QSW and the mechanical relay RLY from a conductive state to a nonconductive state, and cuts off the high DC voltage to be applied to the inverter.

When the high DC voltage to be applied to the inverter is cut off, the supply voltage VDD2 to be applied to the secondary side signal transmission chip (LSI2) is rapidly lowered, and a voltage across the secondary coil (L12) of the on-chip transformer OCT1 is also rapidly lowered. As a result, the short-circuiting current between the secondary coil (L12) and the primary coil (L11) of the on-chip transformer OCT1 is also rapidly decreased. Also, the signal transmission module MD1 as well as other electronic components (microcomputer MCU, etc.) mounted on the same printed circuit board as that of the signal transmission module MD1 can be prevented from being burned out, and fired.

Also, when the microcomputer MCU receives the heat generation detection signal Err1 from the semiconductor device LSI1, the microcomputer MCU instructs the signal transmission module MD1 that drives the respective transistors QH1 to QH3 to render the transistors QH1 to QH3 of the high side nonconductive. When the transistors QH1 to QH3 of the high side are rendered conductive, a neutral potential (potential (supply voltage GND2) of the connection points U, V, and W) of a half bridge becomes equal to the ground potential of the low side, and a potential difference to be applied to an insulating portion between the primary coil and the secondary coil of the primary side signal transmission chip becomes null. In this situation, in order to lower the neutral potential of the half bridge, the transistors QL1 to QL3 of the low side may be set in the conductive state.

When the temperature monitoring unit TS1 of the semiconductor device LSI1 detects the abnormal overheat of the on-chip transformer OCT1, the transistors QH1 to QH3 of the high side may be set in the nonconductive state not through the microcomputer MCU, but directly by the signal transmission module MD1.

In the signal transmission module MD1 illustrated in FIG. 23, when the temperature monitoring unit TS1 detects the abnormal overheat, the heat generation determination unit EDET1 outputs the heat generation detection signal Err1 to the control circuit CTL1 in addition to the heat generation detection signal Err1 transmission to the microcomputer MCU described above. The control circuit CTL1 transmits a given signal to the receiver circuit RX2 of the semiconductor device LSI2 through the transmitter circuit TX1 and the on-chip transformer OCT1.

The driver circuit DRV of the semiconductor device LSI2 outputs the drive signal IGDrv that renders the IGBT nonconductive on the basis of the given signal. The generation of the drive signal IGDrv by the IGBT driver circuit DRV from the detection of the abnormal overheat by the temperature monitoring unit TS1 is conducted by hardware (electronic circuit) installed in the signal transmission module MD1. Therefore, the IGBT can be rendered nonconductive before the on-chip transformer OCT1 is burned out, and the function is lost from the abnormal overheat generation.

Subsequently, a description will be given of the system protection operation when the insulation breakdown of the on-chip transformer OCT2 is generated in the secondary side signal transmission chip (LSI2). In the signal transmission module MD1 illustrated in FIG. 23, when the temperature monitoring unit TS2 detects the abnormality overheat of the on-chip transformer OCT2, the heat generation determination unit EDET2 outputs the heat generation detection signal Err2 to the control circuit CTL2. In response to the heat generation detection signal Err2, the control circuit CTL2 changes the output signal Ct2 to be output to the IGBT driver circuit DRV from the low level to the high level, and outputs the drive signal IGDrv that renders the IGBT nonconductive. On the basis of the drive signal IGDrv, the IGBT becomes in the nonconductive state to protect the system.

The generation of the drive signal IGDrv by the IGBT driver circuit DRV from the detection of the abnormal overheat by the temperature monitoring unit TS2 is conducted by only a hardware installed in the secondary side signal transmission chip regardless of the instruction from the microcomputer MCU. Therefore, the IGBT can be rendered nonconductive before the on-chip transformer OCT2 is burned out, and the function is lost from the abnormal overheat generation.

Another layout example of the temperature monitoring unit TS1 installed in the semiconductor device LSI1 according to the first embodiment will be described with reference to FIG. 24.

As described above, it is preferable that the temperature monitoring unit TS1 installed in the semiconductor device LSI1 is arranged in the region immediately below or in the region adjacent to the on-chip transformer OCT1. However, the layout place of the temperature detection elements (pn junction diodes, etc.) configuring the temperature monitoring unit TS1 is not limited to the above places. The temperature monitoring unit TS11 illustrated in FIG. 24 is arranged in adjacent to a transmission driver circuit provided in the transmitter circuit TX1 installed in the semiconductor device LSI1, and detects the abnormal overheat attributable to the insulation breakdown of the on-chip transformer OCT1. FIG. 24 illustrates a circuit diagram, but the on-chip transformer OCT1 is schematically illustrated as a coil expressed in a perspective view.

Figure 24:
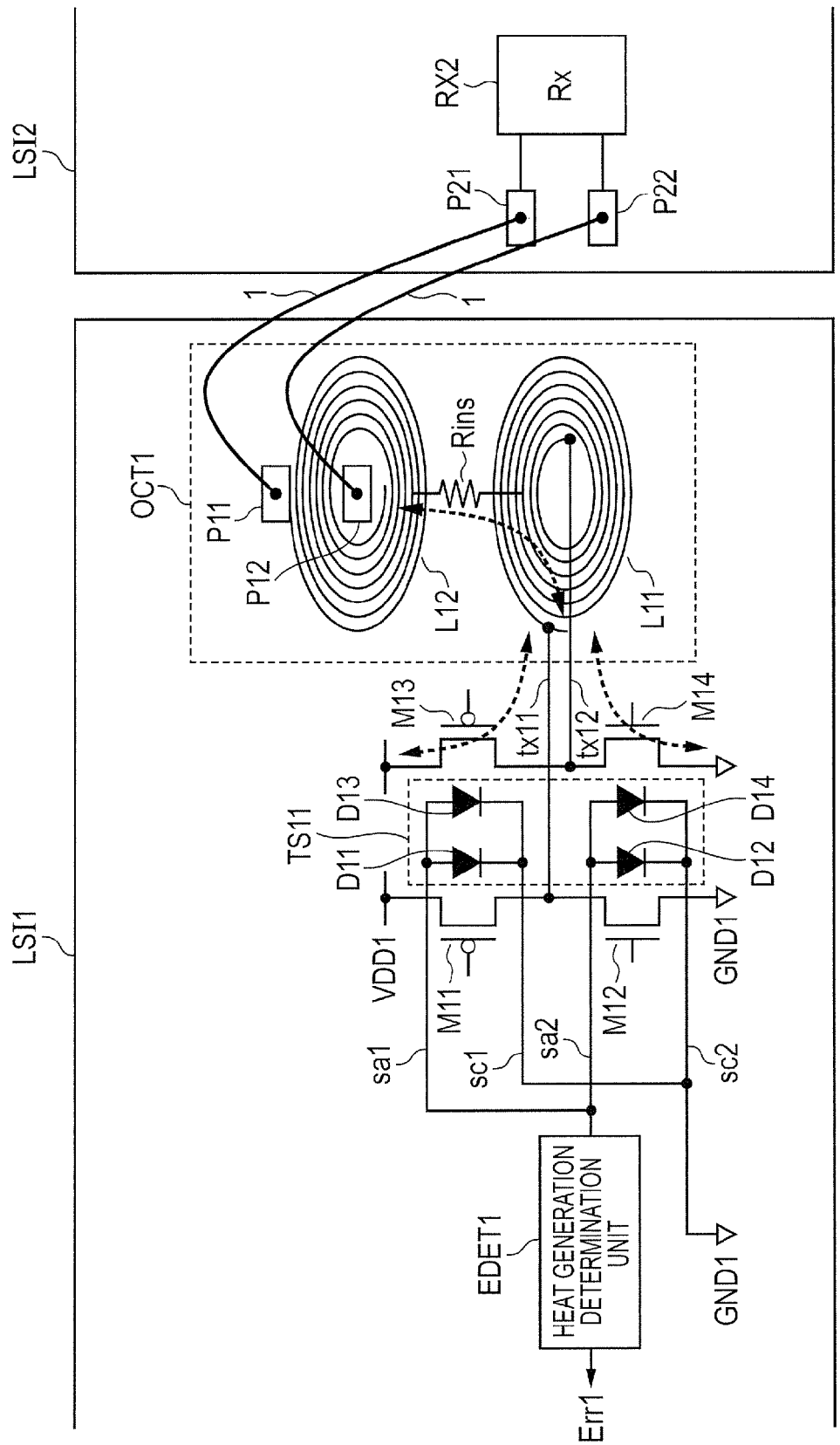
FIG. 24 is a circuit diagram illustrating another layout example of the temperature monitoring unit installed in the first semiconductor device according to the first embodiment.

Referring to FIG. 24, the transmission driver circuit includes the p-type transistor M11 having a source applied with the supply voltage VDD1 and a drain connected with the line tx11, the n-type transistor M12 having a drain connected with the line tx11 and a source applied with the supply voltage GND1, a p-type transistor M13 having a source applied with the supply voltage VDD1 and a drain connected with the line tx12, and an n-type transistor M14 having a drain connected with the line tx12 and a source applied with the supply voltage GND1. The respective gate voltages of the p-type transistor M11 and the n-type transistor M14, and the p-type transistor M13 and the n-type transistor M12 are controlled by a pre-driver circuit not shown, so as to allow respective reverse drive currents to flow into the primary coil L11 through the line tx11 and the line tx12.

When the short-circuiting current is generated between the primary coil L11 and the secondary coil L12 of the on-chip transformer OCT1 due to the insulation breakdown, the short-circuiting flows into the power supply line VDD1 or the power supply lines GND1 from the secondary coil L12 through the above transistor or the parasitic diode (not shown) of the transmission driver circuit. The temperature rise of the transmission driver circuit due to the short-circuiting current is detected by the temperature monitoring unit TS11 configured by the diodes D11 to D14 arranged in the vicinity of the respective, transistors M11 to M14 configuring the transmission driver circuit, respectively.

The nodes of the diodes D11 and D13 are connected to the line sa1, and the anodes of the diodes D12 and D14 are connected to the line sa2. Both of the line sa1 and the line sa2 are connected to the heat generation determination unit EDET1. The cathodes of the diode D11 and the diode D13 are connected to the line sc1, and the cathodes of the diode D12 and the diode D14 are connected to the line sc2. The line sc1 and the line sc2 are applied with the supply voltage GND1. The diode D11 and the diode D13 are connected in parallel between the line sa1 and the line sc1 in the first system, and the diode D12 and the diode D14 are connected in parallel between the line sa2 and the line sc2 in the second system. The line is separated into the two systems, to thereby improve the reliability of the temperature monitoring unit TS11.

Figure 25:
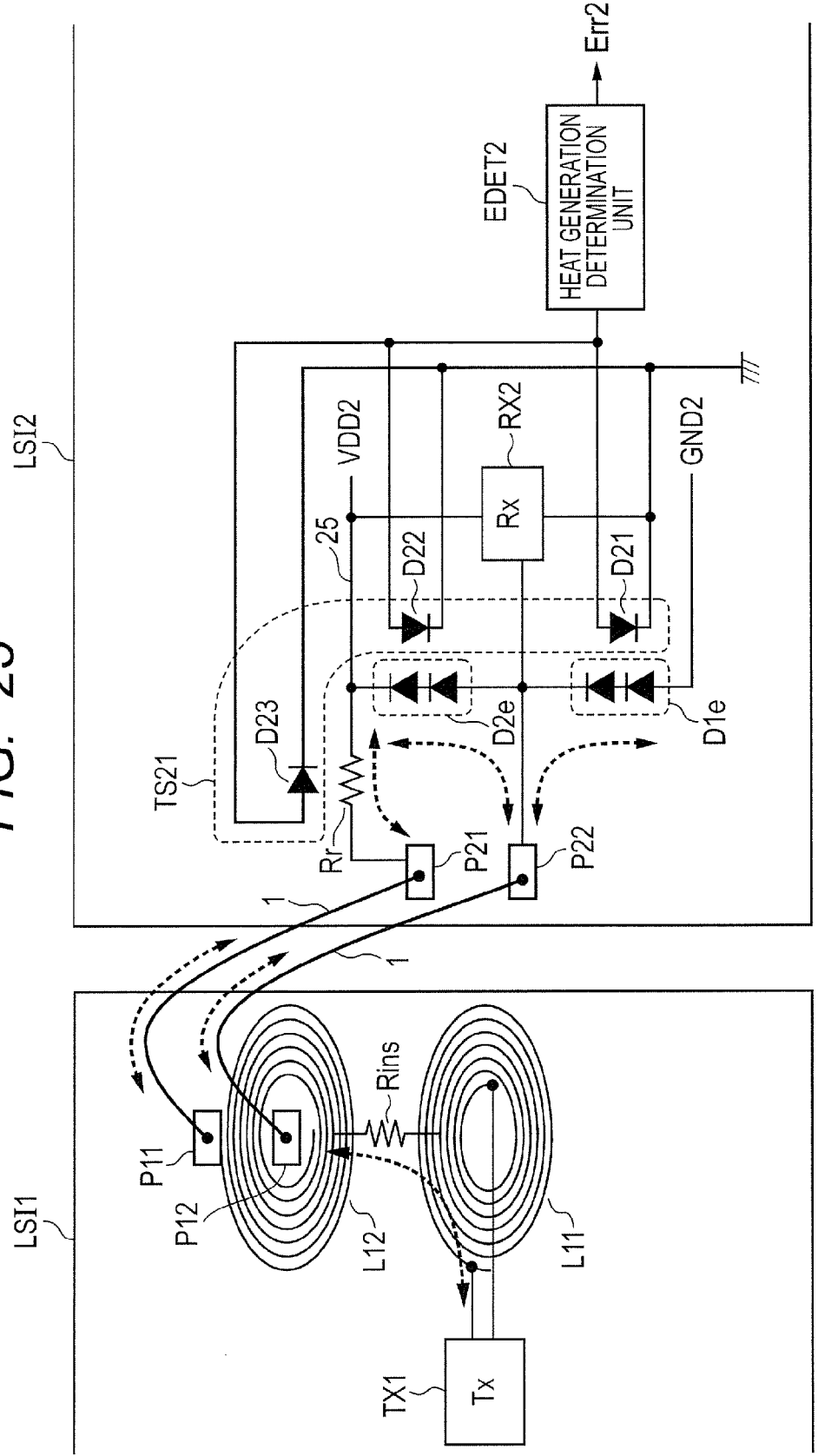
FIG. 25 is a circuit diagram illustrating another layout example of the temperature monitoring unit installed in the second semiconductor device according to the first embodiment.

Another layout example of the temperature monitoring unit TS21 installed in a semiconductor device LSI2 according to the first embodiment will be described with reference to FIG. 25.

The layout of the temperature monitoring unit is not limited to the chip side on which the on-chip transformer is formed, but may be arranged on the chip side that receives the signal from the chip on which the on-chip transformer is formed. A temperature monitoring unit TS21 illustrated in FIG. 25 is another layout example of the temperature monitoring unit TS1. The temperature monitoring unit TS21 is arranged in adjacent to an electrostatic protection element of the receiver circuit RX2 installed in the semiconductor device LSI2, and detects the abnormal overheat attributable to the insulation breakdown of the on-chip transformer OCT1. FIG. 25 illustrates a circuit diagram, but the on-chip transformer OCT1 is schematically illustrated as a coil expressed in the perspective view.

In the semiconductor device LSI1, the primary coil L11 of the on-chip transformer OCT1 is applied with a drive current output by the transmitter circuit TX1. One end of the secondary coil L12 is connected to the pad P11, and the other end of the secondary coil L12 is connected to the pad P12. The pad P11 and the pad P12 of the semiconductor device LSI1 are connected to the pad P21 and the pad P22 formed on the semiconductor device LSI2 by the bonding wires 1, respectively.

In the semiconductor device LSI2, the pad P21 is applied with the supply voltage VDD2 through a resistor Rr and a power supply line 25. The supply voltage VDD2 is applied to the pad P11 connected with one of the secondary coil L12 as a reference voltage of the on-chip transformer OCT1. The resistor Rr is not always required for applying the reference voltage to the secondary coil L12, but is provided to detect a current between the pad P21 and the power supply line VDD2. The resistor Rr is formed of a polycrystal silicon resistor or a diffused resistor. A diode D23 provided in the temperature monitoring unit TS21 is arranged adjacent to the resistor Rr.

A voltage generated in the other end of the secondary coil L12 is applied to the pad P22, and the voltage is applied to the input terminal of the receiver circuit RX2. An electrostatic protection element D1e and an electrostatic protection element D2e are connected between that input terminal, and the power supply line GND2 and the power supply line VDD2, respectively. Diodes D21 and D22 configuring the temperature monitoring unit TS21 are arranged in the vicinity of the electrostatic protection element D1e and the electrostatic protection element D2e, respectively.

The short-circuiting current generated in the on-chip transformer OCT1 of the semiconductor device LSI1 flows between the pad P11 and the pad P21, and between the pad P12 and the pad P22 through the bonding wires 1. The short-circuiting current that inflows and outflows through the pad P21 flows into the power supply line VDD2 through the resistor Rr and the power supply line 25, and the temperature of the resistor Rr and the semiconductor substrate close to the resistor Rr start to rapidly rise. The short-circuiting current that inflows and outflows through the pad P22 flows into the power supply line GND2 and the power supply line VDD2 through the electrostatic protection element D1e and the electrostatic protection element D2e, respectively, and the temperature of the respective electrostatic protection elements and the semiconductor substrate close to those electrostatic protection elements starts to rapidly rise.

The diodes D21, D22, and D23 configuring the temperature monitoring unit TS21 lower the forward voltage with a rise in the temperature of the electrostatic protection element D1e, the electrostatic protection element D2e, and the resistor Rr. The anode voltages across the diodes D21, D22, and D23, which are connected in parallel to each other, are input to the heat generation determination unit EDET2. If the forward voltage is abnormally lowered in at least any one of the diodes D21, D22, and D23, the heat generation determination unit EDET2 outputs the heat generation detection signal Err2.

The temperature monitoring unit is not always arranged in the region immediately below or in the region adjacent to the on-chip transformer, but may be arranged in the vicinity of a region in which a circuit into which the short-circuiting current generated in the on-chip transformer can flow is formed. As a result, the chip in which the on-chip transformer is formed, and the chip in which the temperature monitoring unit is formed can be set, separately, to improve the degree of freedom of design of the signal transmission module.

Second Embodiment

Figure 26:
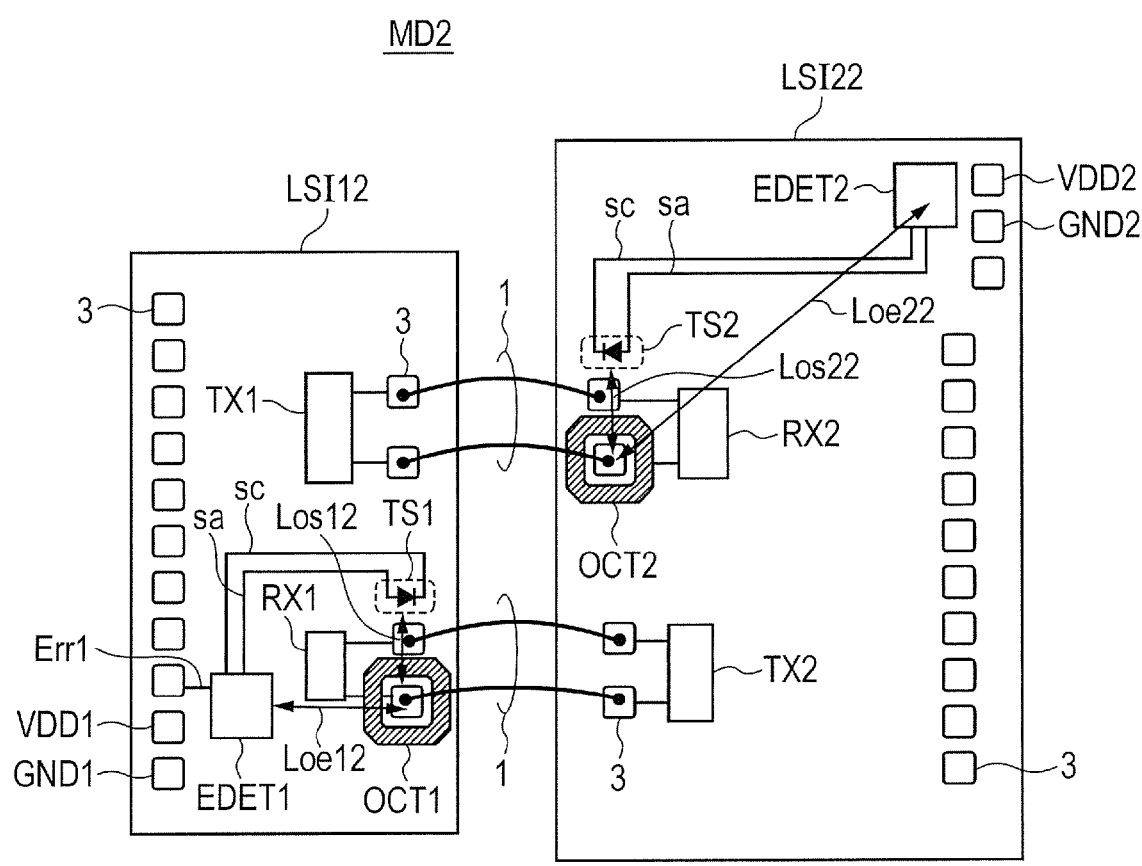
FIG. 26 is a configuration diagram of a signal transmission module having the first semiconductor device and the second semiconductor device according to a second embodiment.

A configuration of a signal transmission module MD2 having a semiconductor device LSI12 and a semiconductor device LSI22 according to a second embodiment will be described with reference to FIG. 26.

The semiconductor devices LSIi (i=1, 2) according to the first embodiment has a transmitter circuit TXi and an on-chip transformer OCTi whereas the semiconductor device LSIj2 (j=1, 2) according to the second embodiment has a receiver circuit RXj and an on-chip transformer OCTj. The circuits and so on installed in the semiconductor device LSI12 and the semiconductor device LSI22 according to the second embodiment have the same configuration and function as those denoted by the same reference numerals or symbols with those in the semiconductor device LSI1 and the semiconductor device LSI2 according to the first embodiment.

The transmitter circuit TX1 installed in the semiconductor device LSI12 drives the on-chip transformer OCT2 installed in the semiconductor device LSI22 through the pads 3 and the bonding wires 1. Likewise, the transmitter circuit TX2 installed in the semiconductor device LSI22 drives the on-chip transformer OCT1 installed in the semiconductor device LSI12.

In the semiconductor device LSI12, the temperature monitoring unit TS1 is arranged in the vicinity of the on-chip transformer OCT1, and the heat generation determination unit EDET1 is arranged in the vicinity of the power supply pad VDD1 and the power supply pad GND1. The forward voltage between the anode and the cathode of the diode provided in the temperature monitoring unit TS1 is input to the heat generation determination unit EDET1 through the line sa and the line sc. A distance Loe12 between the on-chip transformer OCT1 and the heat generation determination unit EDET1 is set to be larger than a distance Los12 between the on-chip transformer OCT1 and the temperature monitoring unit TS1.

In the semiconductor device LSI22, the temperature monitoring unit TS2 is arranged in the vicinity of the on-chip transformer OCT2, and the heat generation determination unit EDET2 is arranged in the vicinity of the power supply pad VDD2, and the power supply pad GND2. The forward voltage between the anode and the cathode of the diode provided in the temperature monitoring unit TS2 is input to the heat generation determination unit EDET2 through the line sa and the line sc. A distance Loe22 between the on-chip transformer OCT2 and the heat generation determination unit EDET2 is set to be larger than a distance Los22 between the on-chip transformer OCT2 and the temperature monitoring unit TS2.

The on-chip transformer is not always formed in the chip having the transmitter circuit, but may be formed in a chip having a receiver circuit. A range of choices of the chip forming the on-chip transformer is widened to increase the degree of freedom of design of other circuits mounted on the chip. Also, like the heat generation determination unit EDET1 and the transmitter circuit TX1 in FIG. 13, it is preferable that the supply voltage VDD2 is applied to each of the heat generation determination unit EDET2 and the receiver circuit RX2 by the power supply lines branched from the power supply pad VDD2. With this configuration, an adverse influence of the noise of the power supply lines on the heat generation determination unit EDET2 is reduced. The same is applied to the power supply lines for applying the supply voltage GND2 to the heat generation determination unit EDET2 and the receiver circuit RX2.

Third Embodiment

A configuration of a signal transmission module MD3 having a semiconductor device LSI13 and a semiconductor device LSI23 according to a third embodiment will be described with reference to FIGS. 27A and 27B.

Figure 27A:
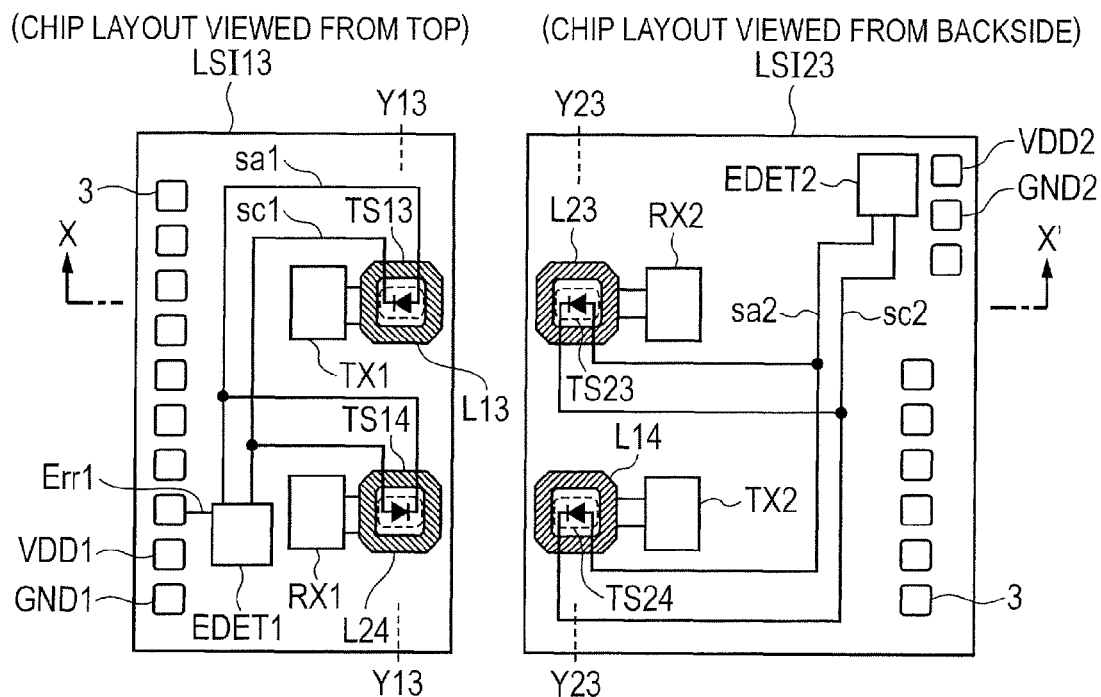
FIGS. 27A and 27B are configuration diagrams of a signal transmission module having the first semiconductor device and the second semiconductor device according to a third embodiment.

FIG. 27A is a plan view schematically illustrating a circuit pattern when the circuit pattern formed on a chip top of the semiconductor device LSI13 is viewed from the chip top, and a circuit pattern when the circuit pattern formed on a chip top of the semiconductor device LSI23 is viewed through a chip backside thereof. The chip top means one of two opposed surfaces of the semiconductor substrate on which a circuit element such as a transistor is formed. A signal transmission between the semiconductor device LSI13 and the semiconductor device LSI23 is conducted through a transformer formed by allowing the chip tops to face each other. In the third embodiment, a transformer formed by opposed two chips is also called "on-chip transformer".

The semiconductor device LSI13 is formed with a primary side coil L13 of an on-chip transformer OCT3 covered with an insulating film, and a secondary side coil L24 of an on-chip transformer OCT4. The primary side coil L13 is driven by the transmitter circuit TX1, an electromotive force caused by electromotive induction generated in the secondary side coil L24 is input to the receiver circuit RX1. A temperature monitoring unit TS13 and a temperature monitoring unit TS14 are arranged in the vicinity of the primary side coil L13 and the secondary side coil L24, for example, in the center thereof, respectively. The forward voltage between the anode and the cathode of the diode provided in each of the temperature monitoring unit TS13 and the temperature monitoring unit TS14 is input to the heat generation determination unit EDET1 through the line sa1 and the line sc1.

The heat generation determination unit EDET1 is arranged in the vicinity of the supply voltage VDD1 and the supply voltage GND1, and outputs the heat generation detection signal Err1 to the pads 3. A distance between the primary side coil L13 and the heat generation determination unit EDET1 is set to be larger than a distance between the primary side coil L13 and the temperature monitoring unit TS13. A distance between the secondary side coil L24 and the heat generation determination unit EDET1 is set to be larger than a distance between the secondary side coil L24 and the temperature monitoring unit TS14.

The semiconductor device LSI23 is formed with a secondary coil L23 of the on-chip transformer OCT3 covered with an insulating film, and a primary coil L14 of the on-chip transformer OCT4. The electromotive force caused by the electromagnetic induction generated in the secondary coil L23 is input to the receiver circuit RX2, and the primary coil L14 is driven by the transmitter circuit TX2. A temperature monitoring unit TS23 and a temperature monitoring unit TS24 are arranged in the vicinity of the secondary coil L23 and the primary coil L14, for example, in the center thereof, respectively. The forward voltage between the anode and the cathode of the diode provided in each of the temperature monitoring unit TS23 and the temperature monitoring unit TS24 is input to the heat generation determination unit EDET2 through the line sa2 and the line sc2.

The heat generation determination unit EDET2 is arranged in the vicinity of the pad VDD2 and the pad GND2. A distance between the secondary coil L23 and the heat generation determination unit EDET2 is set to be larger than a distance between the secondary coil L23 and the temperature monitoring unit TS23. A distance between the primary coil L14 and the heat generation determination unit EDET2 is set to be larger than a distance between the primary coil L14 and the temperature monitoring unit TS24.

Figure 27B:
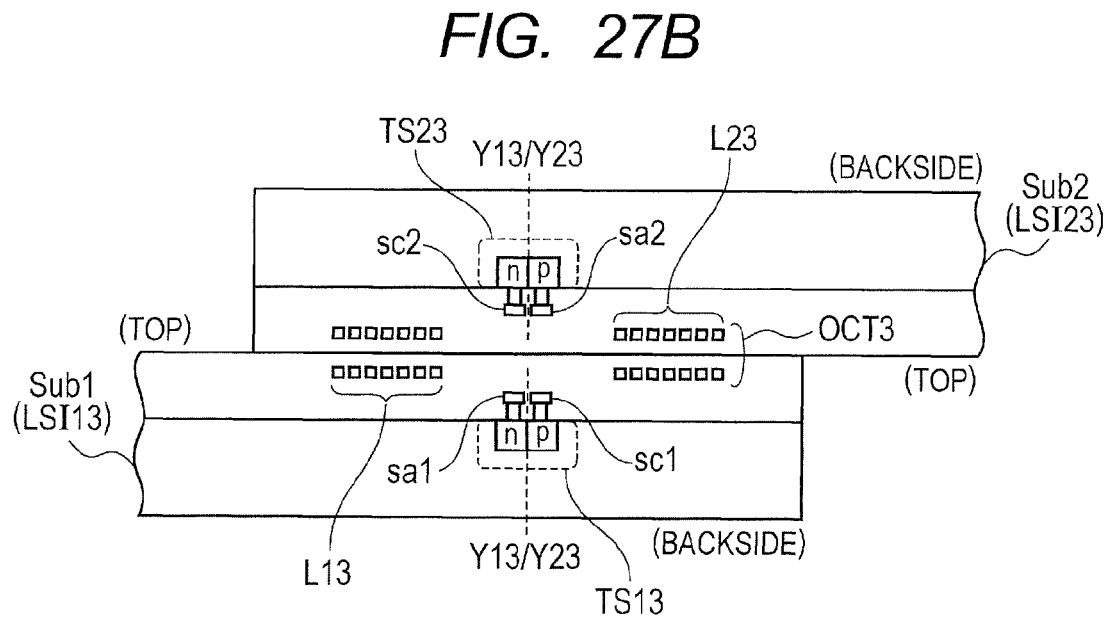

FIG. 27B is a cross-sectional view of two chips which face each other so that a Y-axis (Y13-Y13) set in the semiconductor device LSI13 matches a Y-axis (Y23-Y23) set in the semiconductor device LSI23 illustrated in FIG. 27A, taken along an X-axis (X-X'). In the third embodiment, a center of the primary side coil L13 and the secondary side coil L24 in the semiconductor device LSI13 is put on the same Y-axis (Y13-Y13), and a center of the secondary coil L23 and the primary coil L14 in the semiconductor device LSI23 is put on the same Y-axis (Y23-Y23).

Further, a center interval between the primary side coil L13 and the secondary side coil L24 in the semiconductor device LSI13 is set to be equal to a center interval between the secondary coil L23 and the primary coil L14 in the semiconductor device LSI23. The layout of the primary coil and the secondary coil in both of those chips is not limited to the above-mentioned layout, but can be appropriately changed so that the on-chip transformer is formed when both of those chips is arranged to face each other.

The top of a semiconductor substrate Sub1 of the semiconductor device LSI13 is formed with a diode provided in the temperature monitoring unit TS13 arranged in the center of the primary side coil L13. The primary side coil L13 is embedded in an insulating film formed on the semiconductor substrate Sub1. A semiconductor substrate Sub2 of the semiconductor device LSI23 is formed with a diode provided in the temperature monitoring unit TS23 arranged in the center of the secondary coil L23. The secondary side coil L23 is embedded in an insulating film formed on the semiconductor substrate Sub2. The semiconductor device LSI13 and the semiconductor device LSI23 are arranged to face each other so that the respective centers of the primary side coil L13 and the secondary coil L23 match each other. The primary side coil L13 and the secondary coil L23 configure the on-chip transformer OCT3.

Fourth Embodiment

Figure 28:
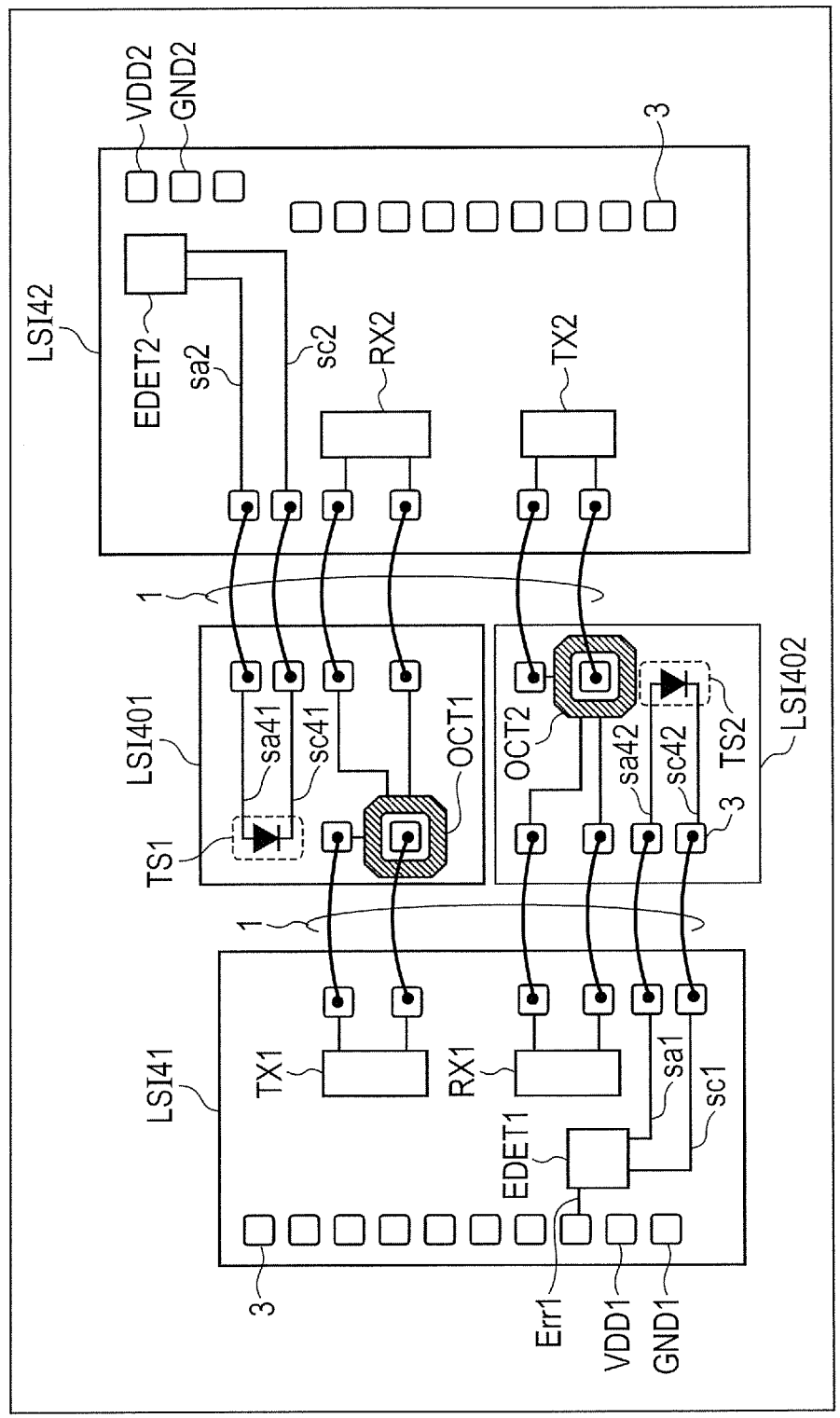
FIG. 28 is a configuration diagram of a signal transmission module having the first semiconductor device, the second semiconductor device, a third semiconductor device, and a fourth semiconductor device according to a fourth embodiment.

A configuration of a signal transmission module MD4 having a semiconductor device LSI401, a semiconductor device LSI402, a semiconductor device LSI41, and a semiconductor device LSI42 according to a fourth embodiment will be described with reference to FIG. 28.

The semiconductor device LSI41 includes the transmitter circuit TX1, the receiver circuit RX1, and the heat generation determination unit EDET1, but does not include the on-chip transformer and the temperature monitoring unit. Likewise, the semiconductor device LSI42 includes the transmitter circuit TX2, the receiver circuit RX2, and the heat generation determination unit EDET2, but does not include the on-chip transformer and the temperature monitoring unit. The semiconductor device LSI401 includes the on-chip transformer OCT1 and the temperature monitoring unit TS1. The semiconductor device LSI402 includes the on-chip transformer OCT2 and the temperature monitoring unit TS2.

The transmitter circuit TX1 of the semiconductor device LSI41 transmits a signal to the receiver circuit RX2 of the semiconductor device LSI42 through the on-chip transformer OCT1 of the semiconductor device LSI401. The transmitter circuit TX2 of the semiconductor device LSI42 transmits a signal to the receiver circuit RX1 of the semiconductor device LSI41 through the on-chip transformer OCT2 of the semiconductor device LSI402.

In the semiconductor device LSI401, the temperature monitoring unit TS1 is arranged in the region immediately below or in the region adjacent to the on-chip transformer OCT1. The forward voltage of the diode provided in the temperature monitoring unit TS1 is input to the heat generation determination unit EDET2 of the semiconductor device LSI42 through a line sa41, a line sc41, the pads 3, the bonding wires 1, and the line sa2 and the line sc2 of the semiconductor device LSI42. In the semiconductor device LSI402, the temperature monitoring unit TS2 is arranged in the region immediately below or in the region adjacent to the on-chip transformer OCT2. The forward voltage of the diode provided in the temperature monitoring unit TS2 is input to the heat generation determination unit EDET1 of the semiconductor device LSI41 through a line sa42, a line sc42, the bonding wires 1, and the line sa1 and the line sc1 of the semiconductor device LSI41. The heat generation determination unit EDET1 outputs the heat generation detection signal Err1 to the pads 3.

The semiconductor device LSI401 is configured by the temperature monitoring unit TS1 formed on the semiconductor substrate, and the on-chip transformer formed on the semiconductor substrate. The semiconductor device LSI402 is configured by the temperature monitoring unit TS2 formed on the semiconductor substrate, and the on-chip transformer OCT2 formed on the semiconductor substrate. Therefore, the semiconductor device LSI401 and the semiconductor device LSI402 can be provided relatively inexpensively. Also, because the on-chip transformer and the temperature monitoring unit are mounted on a chip different from that of the semiconductor device LSI41 and the semiconductor device LSI42, this configuration can flexibly meet a variety of configuration requests of the on-chip transformer and the temperature monitoring unit.

Fifth Embodiment

Figure 29:
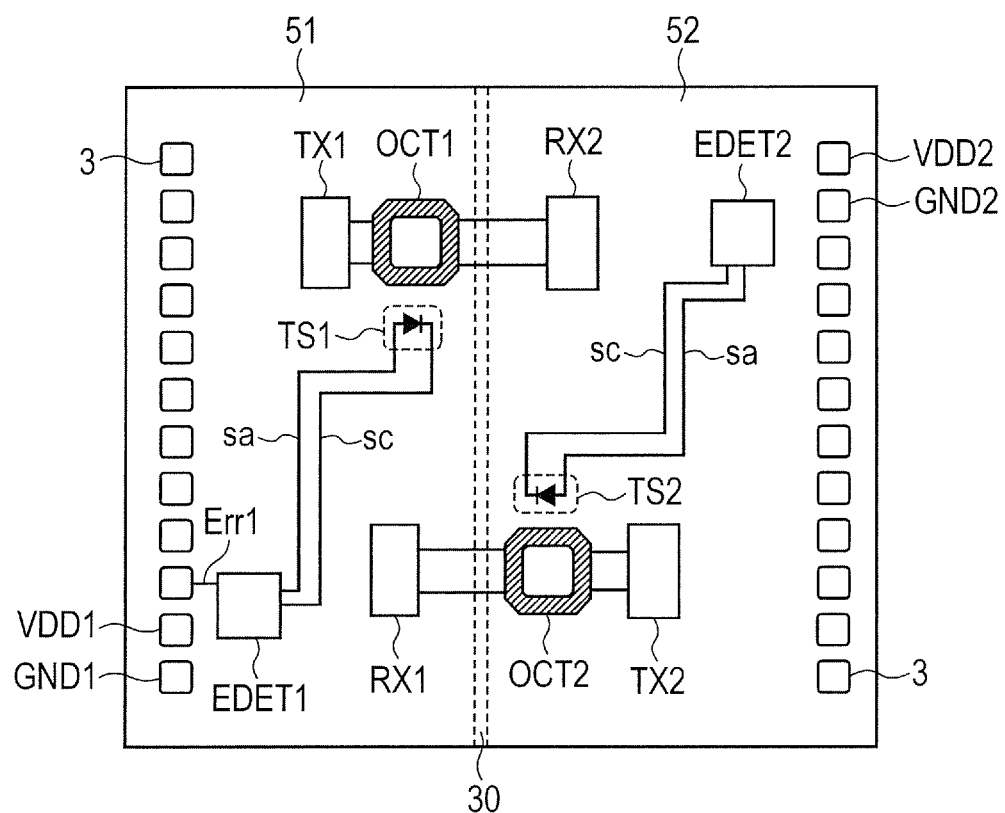
FIG. 29 is a configuration diagram of a semiconductor device according to a fifth embodiment.

A configuration of a semiconductor device LSI5 according to a fifth embodiment will be described with reference to FIG. 29.

The semiconductor device LSI5 includes a first region 51 and a second region 52 which are formed of an SOI (silicon on insulator) layer on the same substrate. The first region 51 and the second region 52 are formed with a circuit that is applied with supply voltages VDD1/GND1, and a circuit that is applied with supply voltages VDD2/GND2, respectively. The first region 51 is formed with the on-chip transformer OCT1, the transmitter circuit TX1, the receiver circuit RX1, the temperature monitoring unit TS1, and the heat generation determination unit EDET1. The second region 52 is formed with the on-chip transformer OCT2, the transmitter circuit TX2, the receiver circuit RX2, the temperature monitoring unit TS2, and the heat generation determination unit EDET2.

The first region 51 and the second region 52 isolated from each other by an SOI technique are formed on the same substrate, thereby being capable of connecting the on-chip transformer OCT1, the transmitter circuit TX1, and the receiver circuit RX2 by the lines formed on the substrate. Likewise, the on-chip transformer OCT2, the transmitter circuit TX2, and the receiver circuit RX1 can be connected by the lines formed on the substrate. As a result, a bonding wire that connects the circuits formed on the different chips becomes unnecessary, and the downsized signal transmission module can be realized.

The on-chip transformer OCT1, the temperature monitoring unit TS1, and the heat generation determination unit EDET1 installed in the semiconductor device LSI1 mounted on the signal transmission module MD1 according to the first embodiment have been mainly described above. On the other hand, the configuration of the on-chip transformer OCT2, the temperature monitoring unit TS2, and the heat generation determination unit EDET2 installed in the semiconductor device LSI2 mounted on the signal transmission module MD1 according to the first embodiment is also identical with that in the semiconductor device LSI1.

In the semiconductor device according to the respective embodiments, the on-chip transformer has the structure in which the different wiring layers (the second wiring layer M2 and the fifth wiring layer M5) are vertically stacked on each other through the insulating film. The configuration of the on-chip transformer is not limited to this example, but may be formed so that the wiring side portions face each other through the insulating film in the same wiring layer.

Sixth Embodiment

A configuration of a signal transmission module MD6 having a semiconductor device LSI61 and a semiconductor device LSI62 according to a sixth embodiment will be described with reference to FIG. 30.

Figure 30:
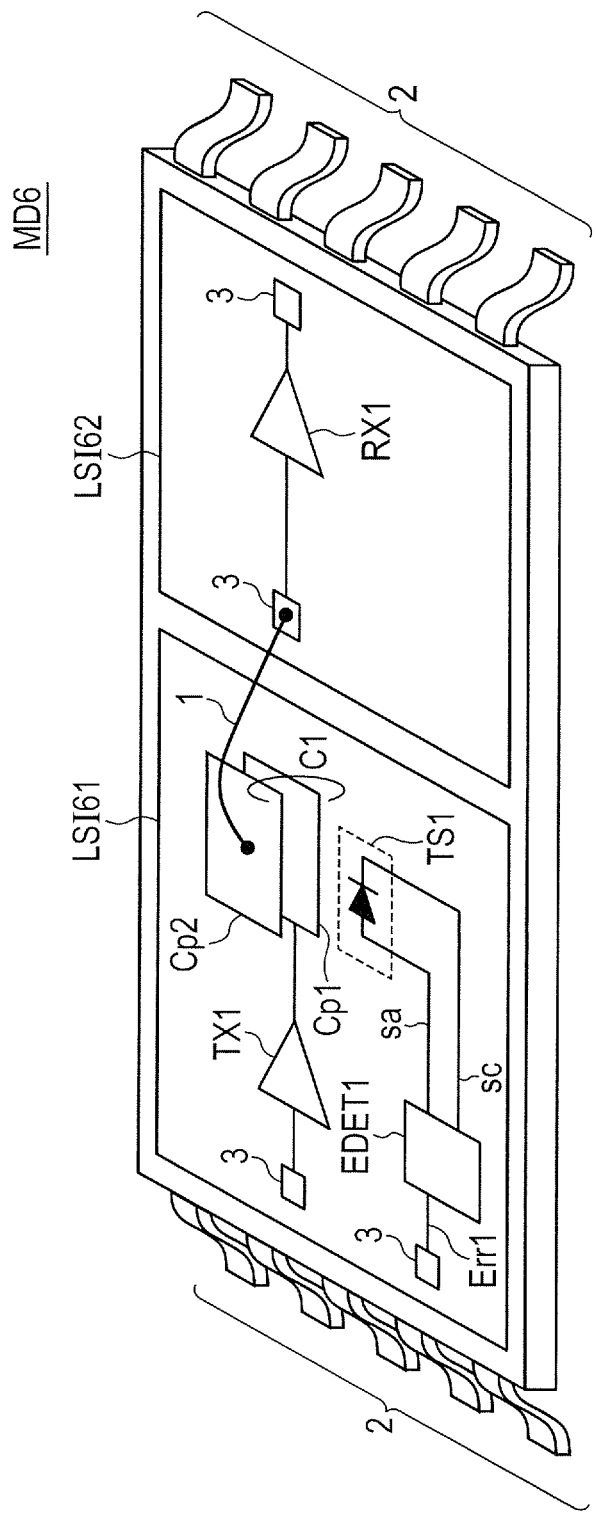
FIG. 30 is a configuration diagram of a signal transmission module installed in the first semiconductor device and the second semiconductor device according to a sixth embodiment.

FIG. 30 is a perspective view schematically illustrating a configuration of the signal transmission module MD6 with a coupling capacitor C1 as an AC coupling element. The signal transmission module MD6 is a SiP in which the semiconductor device LSI61 and the semiconductor device LSI62 are packed in one package. The Sip has multiple leads 2. The pads 3 formed in the semiconductor device LSI61 and the semiconductor device LSI62 are electrically connected to the leads 2 by a bonding wire not shown. In order to avoid the troublesome drawings, the semiconductor device LSI61 and the semiconductor device LSI62 are drawn in a state where the respective chip surfaces are exposed.

The semiconductor device LSI61 includes the transmitter circuit TX1, the coupling capacitor. C1 which is an AC coupling element, the temperature monitoring unit TS1, and the heat generation determination unit EDET1. The coupling capacitor C1 includes a primary side capacitive electrode Cp1 which is any one of a first element and a second element, and a secondary side capacitive electrode Cp2 which is the other of the first element and the second element. An insulating film that forms a dielectric is formed between both of the capacitive electrodes (not shown).

The transmitter circuit TX1 varies a potential of the primary side capacitive electrode Cp1 on the basis of an input signal supplied to the pads 3. The potential variation is transmitted as a potential variation of the secondary side capacitive electrode Cp2 by the capacitive coupling. The semiconductor device LSI61 is applied with the supply voltage VDD1 and the supply voltage GND1. The temperature monitoring unit TS1 is formed on the semiconductor substrate in the region immediately below or in the region adjacent to the coupling capacitor C1.

The semiconductor device LS162 includes the receiver circuit RX1. The receiver circuit RX1 is applied with a voltage of the secondary side capacitive electrode Cp2 through the bonding wire 1 and the pad 3. An output signal shaped into a desired waveform by the receiver circuit RX1 is output to the leads 2 electrically connected to the pad 3 and a bonding wire not shown. The semiconductor device LSI62 is applied with the supply voltage VDD2 and the supply voltage GND2.

In the semiconductor device LSI61, a voltage between the anode and the cathode of a diode provided in the temperature monitoring unit TS1 is input to the heat generation determination unit EDET1 through the line sa and the line sc. When the insulating film between the primary side capacitive electrode Cp1 and the secondary side capacitive electrode Cp2 of the coupling capacitor C1 is broken down by a high voltage, the abnormal heat generation caused by the short-circuiting current between both of the capacitive electrodes is generated. The heat generation determination unit EDET1 detects the temperature change of the semiconductor substrate which is attributable to the abnormal heat generation, and inverts the logic level of the heat generation detection signal Err1.

Like the first embodiment, the diode provided in the temperature monitoring unit TS1 is arranged on the semiconductor substrate (immediately-below-region) immediately below a portion where the primary side capacitive electrode Cp1 or the secondary side capacitive electrode Cp2 are formed, or in the outer periphery (adjacent region) of the immediately-below-region.

The heat generation detection signal Err1 is output to the pads 3, and also output to the control circuit CTL1 (not shown) as in the semiconductor device LSI1 illustrated in FIG. 2. The heat generation detection signal Err1 output to the pad 3 is input to the microcomputer MCU (not shown) that controls the operation of the semiconductor device LSI61. On the other hand, the heat generation detection signal Err1 output to the control circuit CTL1 controls the operation of the transmitter circuit TX1. The protection operation by the heat generation detection signal Err1 is identical with that in the first embodiment, and a description thereof is not repeated.

Referring to FIG. 30, the coupling capacitor C1 and the transmitter circuit TX1 are each formed in the semiconductor device LSI61. However, the layout of the coupling capacitor C1 is not limited to that configuration. Instead of the coupling capacitor C1 being formed in the semiconductor device LSI61, the coupling capacitor C1 may be formed in the semiconductor device LSI62 together with the receiver circuit RX1. In this case, the temperature monitoring unit TS1 and the heat generation determination unit EDET1 are formed in the semiconductor device LS162.

The primary side capacitive electrode Cp1 and the secondary side capacitive electrode Cp2 configuring the coupling capacitor C1 are structured to be stacked on each other in parallel to the semiconductor substrate surface, and through an insulating film acting as a dielectric therebetween. The structure of the coupling capacitor C1 is not limited to the structure in which the plate electrode is arranged in parallel to the semiconductor substrate. For example, the primary side capacitive electrode Cp1 and the secondary side capacitive electrode Cp2 may be arranged to face each other through the insulating film in a direction perpendicular to the semiconductor substrate.

It should be conceivable that the embodiments disclosed at present are entirely exemplary, and not restrictive. The scope of the present invention is defined not by the above description, but by the claims, and intended to include the meanings equivalent to the claims, and all of the changes within the scope of the claims.

What is claimed is:
1. A semiconductor device, comprising:
an AC coupling element that is formed on a semiconductor substrate;
a temperature monitoring unit that outputs a temperature monitor signal in response to a change in a temperature of the semiconductor substrate;
a heat generation determination unit that outputs a heat generation detection signal on the basis of the temperature monitor signal;
a power supply pad that applies a supply voltage; and
a transmitter circuit that is connected to the AC coupling element,
wherein the temperature monitoring unit includes a first temperature monitoring element that outputs the temperature monitor signal, wherein the first temperature monitoring element is arranged in a region immediately below or a region adjacent to the AC coupling element, wherein the heat generation determination unit includes a comparator, wherein the comparator outputs the heat generation detection signal on the basis of a comparison result between a reference voltage and the temperature monitor signal, and wherein a resistance value of a power supply line between the power supply pad and the comparator is smaller than a resistance value between the power supply pad and the transmitter circuit.

2. The semiconductor device according to claim 1, wherein the temperature monitoring unit further includes a second temperature monitoring element, wherein the second temperature monitoring element is arranged in a region immediately below or in a region adjacent to the AC coupling element, and connected in parallel to the first temperature monitoring element.

3. The semiconductor device according to claim 1, further comprising:

a temperature detection unit that activates an overheat protection function, wherein the reference voltage is larger than a reference voltage which is applied to the temperature detection unit.

4. The semiconductor device according to claim 1, further comprising:

a reference temperature detection element, wherein a distance between the reference temperature detection element and the AC coupling element is larger than a distance between the temperature monitoring unit and the AC coupling element, and wherein the reference temperature detection element generates the reference voltage.

5. The semiconductor device according to claim 1, wherein the temperature monitoring unit is arranged adjacent to a transmission driver circuit of the transmitter circuit.

6. The semiconductor device according to claim 1, wherein a distance between the AC coupling element and the heat generation determination unit is larger than a distance between the AC coupling element and the temperature monitoring unit.

7. The semiconductor device according to claim 6, wherein the AC coupling element is an on-chip transformer or a coupling capacitor.

8. A semiconductor device, comprising:

an AC coupling element that is formed on a semiconductor substrate;

a temperature monitoring unit that outputs a temperature monitor signal in response to a change in a temperature of the semiconductor substrate;

a heat generation determination unit that outputs a heat generation detection signal on the basis of the temperature monitor signal;

a power supply pad that applies a supply voltage; and a receiver circuit that is connected to the AC coupling element, wherein the temperature monitoring unit includes a first temperature monitoring element that outputs the temperature monitor signal, wherein the first temperature monitoring element is arranged in a region immediately below or a region adjacent to the AC coupling element, wherein the heat generation determination unit includes a comparator, wherein the comparator outputs the heat generation detection signal on the basis of a comparison result between a reference voltage and the temperature monitor signal, and wherein a resistance value of a power supply line between the power supply pad and the comparator is smaller than a resistance value between the power supply pad and the receiver circuit.

9. The semiconductor device according to claim 8, wherein the temperature monitoring unit is arranged adjacent to the receiver circuit.

10. A semiconductor device, comprising:

a temperature monitoring unit that includes a first temperature monitoring element formed on a semiconductor substrate, the temperature monitoring unit outputting a temperature monitor signal in response to a change in a temperature of the semiconductor substrate; and an AC coupling element that includes a first element and a second element formed on the semiconductor substrate, wherein the first element and the second element are arranged to perform AC coupling, and wherein the first temperature monitoring element is arranged in a region immediately below or in a region adjacent to a formation region of the AC coupling element, wherein the first element includes a first coil which is formed of a first wiring layer, wherein the second element includes a second coil which is formed of a second wiring layer different from the first wiring layer, and wherein the first temperature monitoring element formed in the region adjacent to the AC coupling element is covered with a shield layer formed of the lower wiring layer of the first wiring layer and the second wiring layer.

11. The semiconductor device according to claim 10, wherein the first element includes a third coil which is formed of a third wiring layer, and wherein the second element includes a fourth coil which is formed of the third wiring layer.

12. The semiconductor device according to claim 10, wherein the first element includes a first capacitive electrode, and wherein the second element includes a second capacitive electrode.

13. The semiconductor device according to claim 10, wherein the temperature monitoring unit further includes a second temperature monitoring element which is formed on the semiconductor substrate, and wherein the second temperature monitoring element is arranged in a region immediately below or in a region adjacent to the AC coupling element, and connected in parallel to the first temperature monitoring element.

14. A semiconductor device, comprising:

an AC coupling element that is formed on a semiconductor substrate;

a transmitter circuit that drives the AC coupling element;

a temperature monitoring unit that outputs a temperature monitor signal in response to a change in the temperature of the semiconductor substrate;

a heat generation determination unit that outputs a heat generation detection signal on the basis of the temperature monitor signal;

a control circuit that controls the transmitter circuit in response to the heat generation detection signal; and a power supply pad that applies a supply voltage, wherein the heat generation determination unit includes a comparator, and wherein a resistance value of a power supply line between the power supply pad and the comparator is smaller than a resistance value between the power supply pad and the transmitter circuit.

15. The semiconductor device according to claim 14, wherein when the heat generation determination unit determines that a temperature of the semiconductor substrate exceeds a given value, the control circuit outputs a given signal to the transmitter circuit in response to the heat generation detection signal, without depending on an input signal to the control circuit.

* * * * *